(12) United States Patent
Jang et al.

(10) Patent No.: US 10,886,447 B2
(45) Date of Patent: Jan. 5, 2021

(54) LIGHT EMITTING DEVICE

(71) Applicant: Seoul Viosys Co., Ltd., Ansan-si (KR)

(72) Inventors: Seong Gyu Jang, Ansan-si (KR); Ho Joon Lee, Ansan-si (KR); Jong Hyeon Chae, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/561,440

(22) Filed: Sep. 5, 2019

(65) Prior Publication Data

US 2020/0091390 A1    Mar. 19, 2020

Related U.S. Application Data

(60) Provisional application No. 62/731,218, filed on Sep. 14, 2018.

(51) Int. Cl.
*H01L 33/62* (2010.01)
*H01L 33/44* (2010.01)

(52) U.S. Cl.
CPC .............. *H01L 33/62* (2013.01); *H01L 33/44* (2013.01)

(58) Field of Classification Search
CPC .................................. H01L 33/62; H01L 33/44
See application file for complete search history.

(56) References Cited

U.S. PATENT DOCUMENTS

| 7,910,935 | B2 | 3/2011 | Seong |
| 9,847,458 | B2 | 12/2017 | Lee et al. |
| 2014/0339566 | A1 | 11/2014 | Seo et al. |
| 2019/0214373 | A1* | 7/2019 | Kim ..................... H01L 33/08 |

FOREIGN PATENT DOCUMENTS

| JP | 2015-500573 | 1/2015 |
| KR | 10-0652346 | 11/2006 |
| KR | 10-2016-0025455 | 3/2016 |
| KR | 10-2018-0074263 | 7/2018 |

OTHER PUBLICATIONS

International Search Report dated Jan. 20, 2020, issued in International Application No. PCT/KR2019/011708.

\* cited by examiner

*Primary Examiner* — Seahvosh Nikmanesh
(74) *Attorney, Agent, or Firm* — H.C. Park & Associates, PLC

(57) ABSTRACT

A light emitting device including a first light emitting part including a first ohmic layer, a second light emitting part and including a second ohmic layer, a third light emitting part including first and second metal patterns respectively contacting semiconductor layers thereof, a first pad electrically coupled with the first ohmic layer, a second pad electrically coupled with the second ohmic layer, a third pad electrically coupled with the first metal pattern, a common pad electrically coupled with a semiconductor layer of the first and second light emitting parts and the second metal pattern, and a via structure electrically coupling the second metal pattern and the common pad between the second metal pattern and the common pad, in which the second metal pattern has a first portion contacting the first via structure and a second portion contacting the semiconductor layer of the third light emitting part.

22 Claims, 54 Drawing Sheets

LIGHT EMITTING DEVICE

CROSS REFERENCE TO RELATED APPLICATION

This application claims the benefit of U.S. Provisional Patent Application No. 62/731,218, filed on Sep. 14, 2018, which is hereby incorporated by reference for all purposes as if fully set forth herein.

BACKGROUND

Field

Exemplary embodiments of the invention relate generally to a light emitting device, and, more specifically, to a light emitting device in which a plurality of light emitting layers are stacked.

Light emitting diodes, as inorganic light sources, are being diversely used in various fields, such as display devices, vehicle lamps, and general lighting. Light emitting diodes are rapidly replacing existing light sources due to their longer lifetime, lower power consumption, and quicker response speed than the existing light sources.

In particular, a display device generally displays various colors by generally utilizing mixed colors of blue, green, and red. Each pixel of a display device includes blue, green, and red sub-pixels, and the color of a particular pixel is determined through the colors of these sub-pixels, and an image is implemented by a combination of pixels.

Light emitting diodes have been mainly used as backlight sources in display devices. However, recently, a micro LED display has been developed as a next generation display, which directly implements images by using light emitting diodes.

The above information disclosed in this Background section is only for understanding of the background of the inventive concepts, and, therefore, it may contain information that does not constitute prior art.

SUMMARY

Light emitting devices constructed according to exemplary embodiments of the invention have improved light efficiency and light extraction.

Additional features of the inventive concepts will be set forth in the description which follows, and in part will be apparent from the description, or may be learned by practice of the inventive concepts.

A light emitting device according to an exemplary embodiment includes a first light emitting part including a first-type semiconductor layer, a first active layer, a second-type semiconductor layer, and a first ohmic layer, a second light emitting part disposed on the first light emitting part, and including a first-type semiconductor layer, a second active layer, a second-type semiconductor layer, and a second ohmic layer, a third light emitting part disposed on the second light emitting part, and including a first-type semiconductor layer, a third active layer, a second-type semiconductor layer, a first metal pattern having a first surface electrically contacting the second-type semiconductor layer of the third light emitting part and a second metal pattern having a first surface electrically contacting the first-type semiconductor layer of the third light emitting part, a first pad electrically coupled with the first ohmic layer, a second pad electrically coupled with the second ohmic layer, a third pad electrically coupled with the first metal pattern, a common pad electrically coupled with the first-type semiconductor layer of the first and second light emitting parts and the second metal pattern, and a first via structure electrically coupling the second metal pattern and the common pad between the second metal pattern and the common pad, in which the first surface of the second metal pattern has a first portion contacting the first via structure and a second portion contacting the first-type semiconductor layer of the third light emitting part.

An area of the second portion of the second metal pattern may be about one to about five times of an area of the first portion.

The second portion of the second metal pattern may surround the first portion.

An electrical conductivity of each of the first and second metal patterns may be greater than an electrical conductivity of each of the first and second ohmic layers.

The first metal pattern may contact the second-type semiconductor layer of the third light emitting part, and has a first thickness, and the second metal pattern may pass through the second-type semiconductor layer of the third light emitting part and the third active layer, and may have a second thickness greater than the first thickness.

Each of the first metal pattern and the second metal pattern may have a second surface opposing the first surface, and the second surface of the first metal pattern may be disposed on a level that is at least the same or higher than the second surface of the second metal pattern.

The second metal pattern may have a second surface opposing the first surface, a width of the first surface may be greater than a width of the second surface, and the width of the second surface may be greater than a width of the first via structure.

A portion of an outer sidewall of the second metal pattern adjacent to the first via structure may protrude outwardly.

The light emitting device may further include a second via structure electrically coupling the first metal pattern and the third pad between the first metal pattern and the third pad, in which the second surface of the first metal pattern may have a first portion contacting the second via structure and a second portion contacting the second-type semiconductor layer of the third light emitting part.

An area of the second portion of the first metal pattern may be about one to about five times an area of the first portion.

The second portion of the first metal pattern may surround the first portion.

The first metal pattern may have a width greater than the second via structure.

The light emitting device may further include a second via structure electrically coupling the first ohmic layer and the first pad, a third via structure electrically coupling the second ohmic layer and the second pad, a fourth via structure electrically coupling the first metal pattern and the third pad, and a first passivation layer electrically insulating the first, second, third, and fourth via structures from the first, second, and third light emitting parts, in which the first passivation layer may have a first portion surrounding outer sidewalls of the respective first, second, third, and fourth via structures, and a second portion disposed between the first-type semiconductor layer of the third light emitting part and the first, second, third pads and the common pad, and the second portion of the first passivation layer may have a thickness equal to or greater than the first portion.

The light emitting device may further include a fifth via structure electrically coupling the common pad and the first-type semiconductor layer of the first light emitting part, and a sixth via structure electrically coupling the common pad and the first-type semiconductor layer of the second light emitting part, in which the first portion of the first passivation layer may surround outer sidewalls of the fifth and sixth via structures.

Each of the first, second, third, fourth, fifth, and sixth via structures may include a plating layer and a seed layer surrounding an outer sidewall of the plating layer.

The second metal pattern may have a first surface contacting the first via structure, and the light emitting device may further include a fifth via structure including a first pattern electrically contacting with a second surface of the second metal pattern opposing the first surface and the first-type semiconductor layer of the second light emitting part, and a second pattern electrically coupling the first pattern and the first-type semiconductor layer of the first light emitting part.

Each of the first, second, third, fourth, and fifth via structures may include a plating layer and a seed layer surrounding an outer sidewall of the plating layer.

The light emitting device may further include a passivation layer surrounding outer sidewalls of the respective first, second, and third light emitting parts, and an outer seed layer surrounding outer sidewalls of the passivation layer.

The light emitting device may further include a first outer seed layer surrounding outer sidewalls of at least one of the first, second, and third light emitting parts, a first passivation layer disposed between at least one of the first, second, and third light emitting parts and the first outer seed layer, a second outer seed layer surrounding outer sidewalls of another one of the first, second, and third light emitting parts, and a second passivation layer disposed between the another one of the first, second, and third light emitting parts and the second outer seed layer.

At least one surface of the first-type semiconductor layer of the light emitting parts may have a plurality of protrusions.

The first-type semiconductor layer of each of the first, second, and third light emitting parts may include an n-type semiconductor, and the second-type semiconductor layer of each of the first, second, and third light emitting parts may include a p-type semiconductor.

The first-type semiconductor layer of each of the first, second, and third light emitting parts may include a p-type semiconductor, and the second-type semiconductor layer of each of the first, second, and third light emitting parts may include an n-type semiconductor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
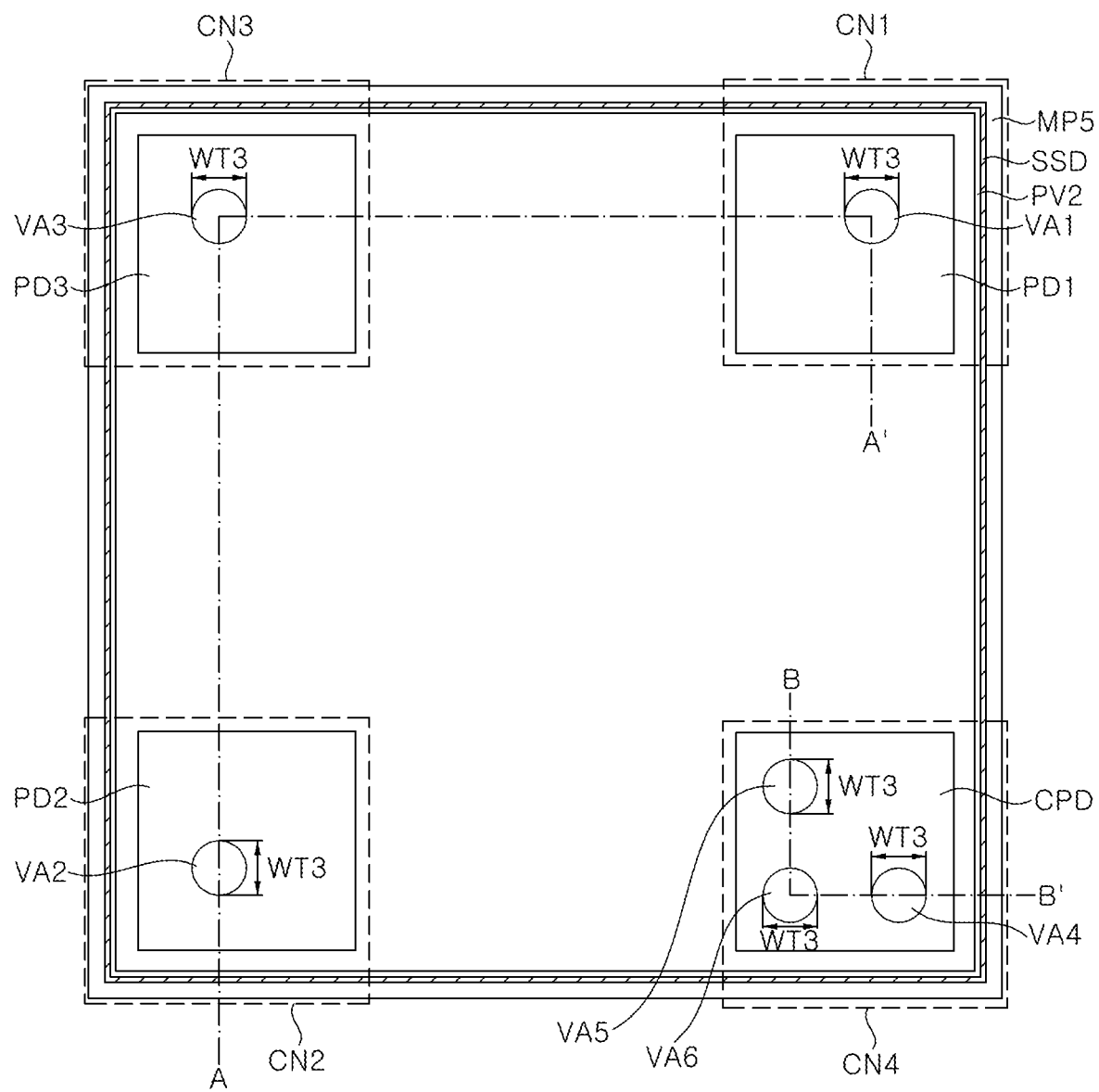
FIG. 1A is a top view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a light emitting device will be described below with reference to the accompanying drawings through various exemplary embodiments.

Figure 1B:
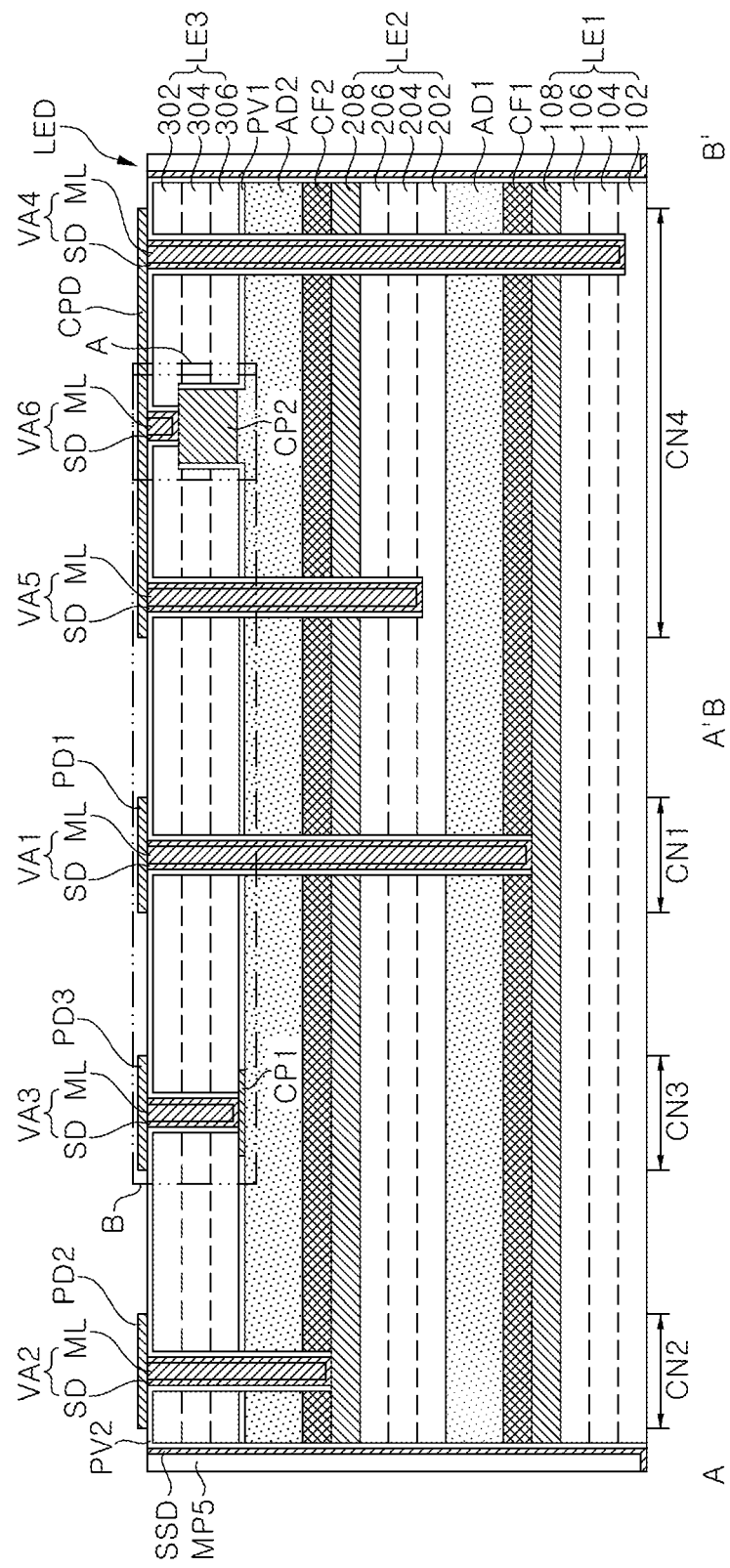
FIG. 1B is a cross-sectional view taken along lines A-A' and B-B' of FIG. 1A.
Figure 1C:
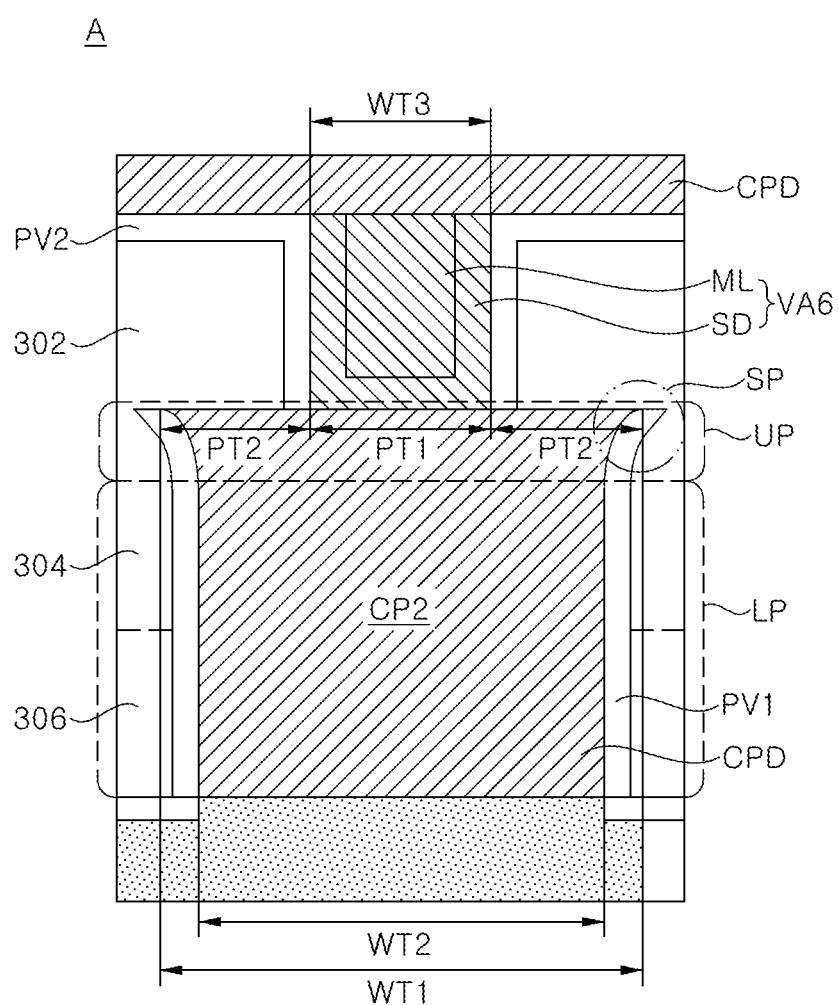
FIG. 1C is an enlarged view of A of FIG. 1B.
Figure 1D:
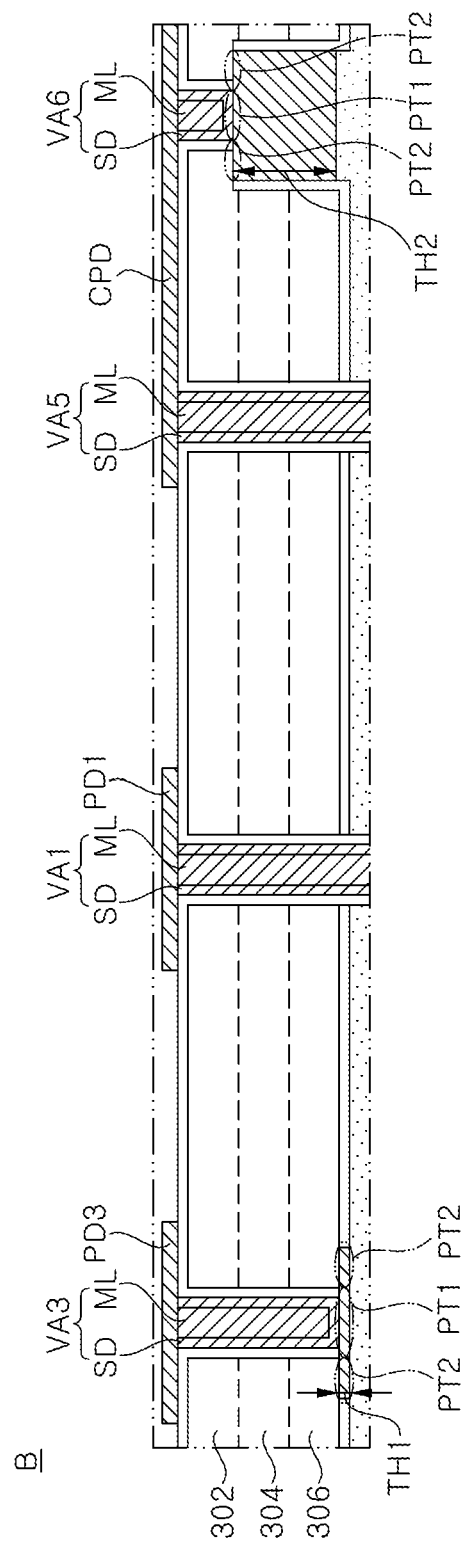
FIG. 1D is an enlarged view of B of FIG. 1B.
Figure 1E:
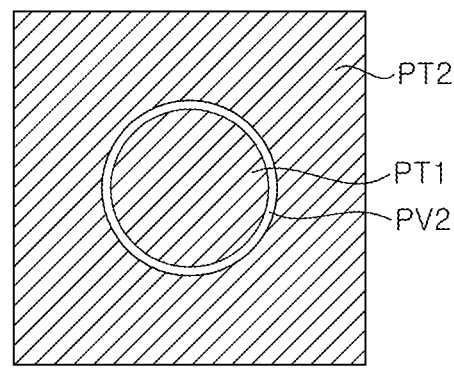
FIG. 1E is a top view of a first conductive pattern of the light emitting device shown in FIG. 1B.
Figure 1F:
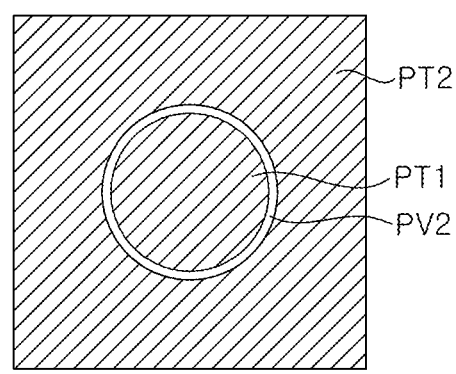
FIG. 1F is a top view of a second conductive pattern of the light emitting device shown in FIG. 1B.
Figure 1G:
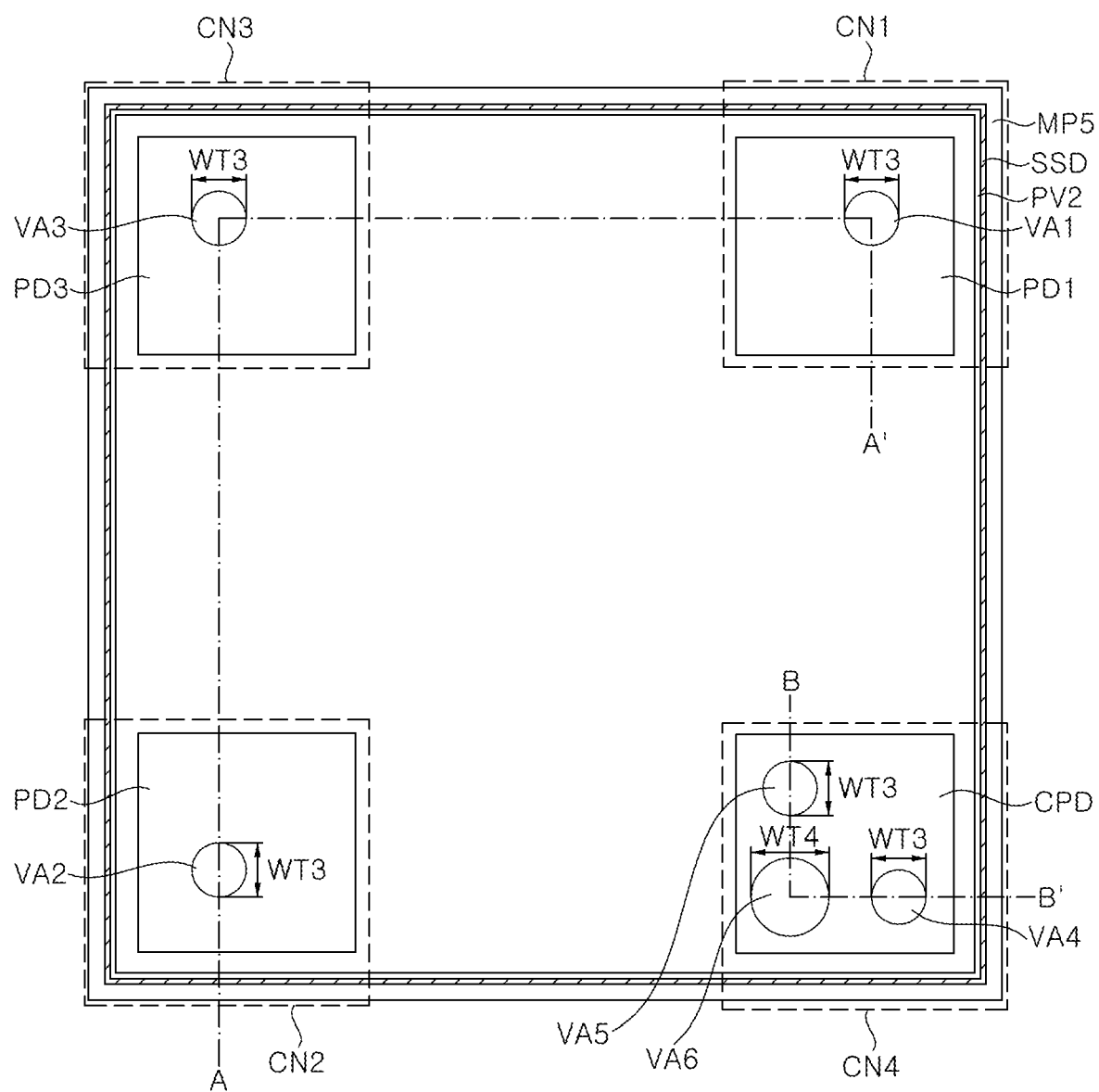
FIG. 1G is a top view of a light emitting device according to an exemplary embodiment.
Figure 1H:
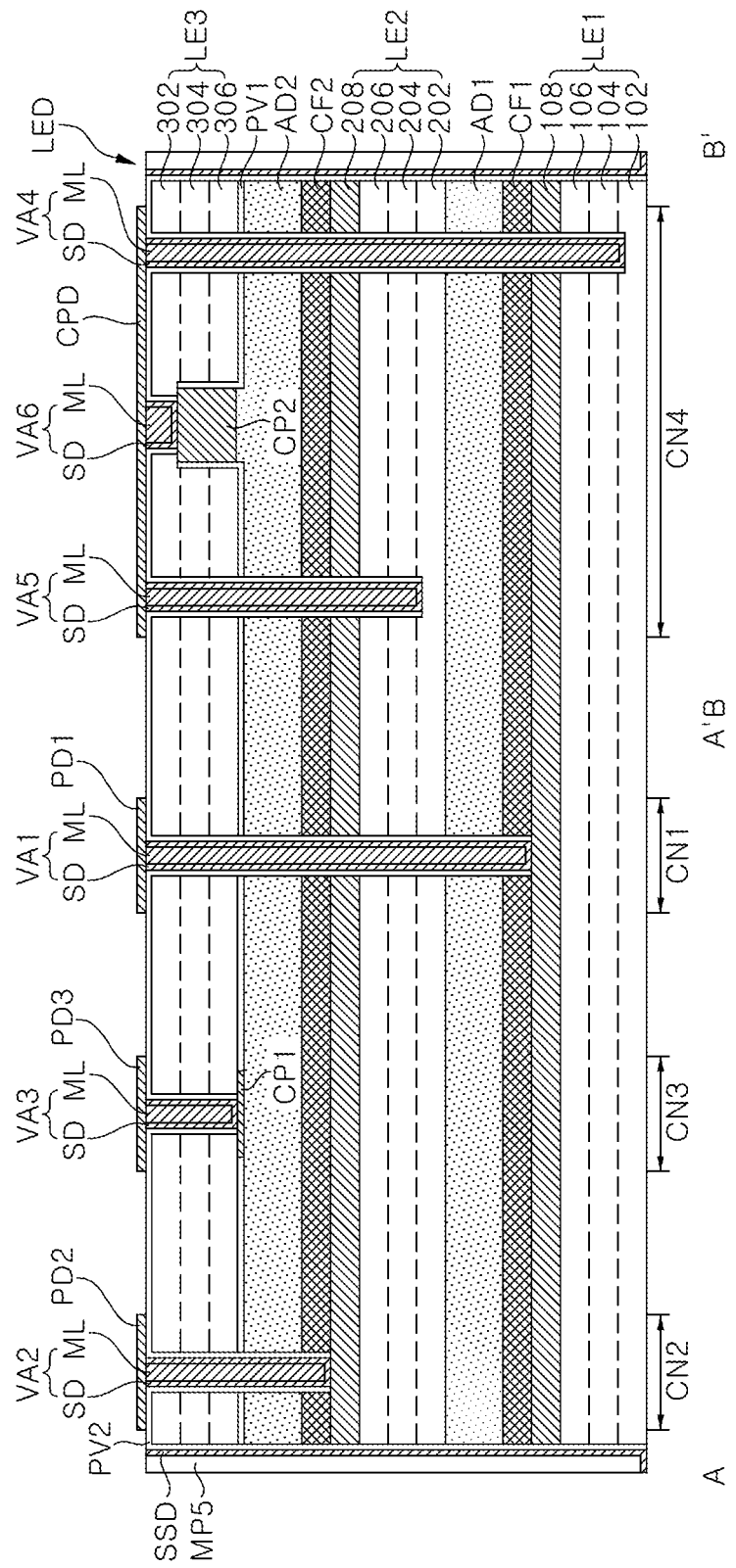
FIG. 1H is a cross-sectional view taken along lines A-A' and B-B' of FIG. 1G.
Figure 1I:
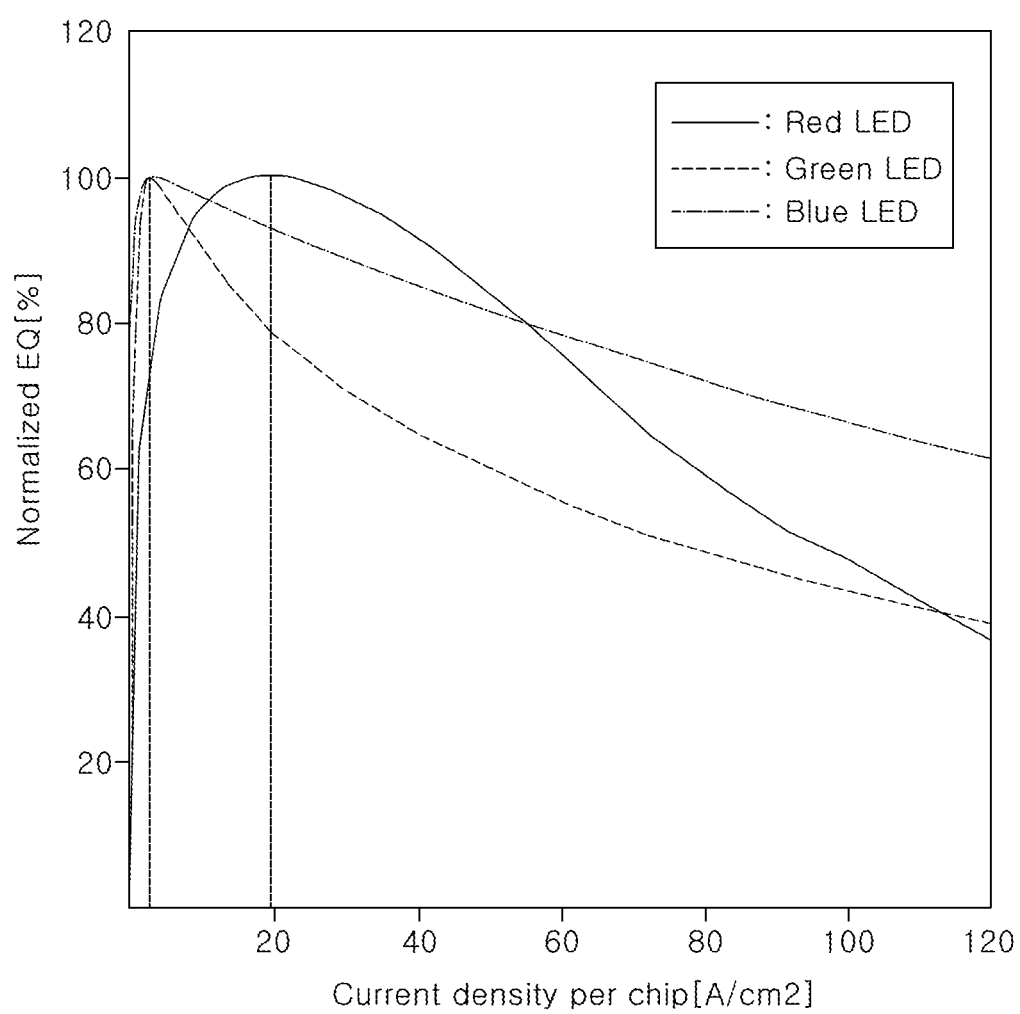
FIG. 1I is a graph showing normalized external quantum efficiency of the light emitting device according to an exemplary embodiment.

FIG. 1A is a top view of a light emitting device according to an exemplary embodiment, FIG. 1B is a cross-sectional view taken along lines A-A' and B-B' of FIG. 1A, FIG. 1C is an enlarged view of A of FIG. 1B, FIG. 1D is an enlarged view of B of FIG. 1B, FIG. 1E is a top view of a first conductive pattern of the light emitting device shown in FIG. 1B, and FIG. 1F is a top view of a second conductive pattern of the light emitting device shown in FIG. 1B. FIG. 1G is a top view of a light emitting device according to an exemplary embodiment, and FIG. 1H is a cross-sectional view taken along lines A-A' and B-B' of FIG. 1G. FIG. 1I is a graph showing normalized external quantum efficiency with respect to current density per a unit area of each of first to third light emitting parts of the light emitting device according to an exemplary embodiment.

Referring to FIGS. 1A to 1H, a light emitting device may include a first light emitting part LE1, a second light emitting part LE2, and a third light emitting part LE3.

When viewed from the top, the first light emitting part LE1, the second light emitting part LE2, and the third light emitting part LE3 may have substantially quadrangular structures, which have outer sidewalls positioned on the same planes. When viewed from the top, the light emitting device may include a first corner CN1, a second corner CN2, a third corner CN3, and a fourth corner CN4.

When the second light emitting part LE2 is disposed on the first light emitting part LE1 to be lopsided in one direction, and the third light emitting part LE3 is disposed on the second light emitting part LE2 to be lopsided in one direction, since some of the light emitted from the first light emitting part LE1 may pass through the second light emitting part LE2 and the third light emitting part LE3 while some of the light may not pass through the second light emitting part LE2 and the third light emitting part LE3, a color mixing may occur. According to the illustrated exemplary embodiment, since the first light emitting part LE1, the second light emitting part LE2, and the third light emitting part LE3 have substantially quadrangular structures having the coplanar outer sidewalls, a color mixing that may occur when the first light emitting part LE1, the second light emitting part LE2, and the third light emitting part LE3 are stacked to be lopsided in one or more directions may be prevented.

When one surface of the first light emitting part LE1 faces the second light emitting part LE2, the other surface of the first light emitting part LE1 may be the light extraction surface of the light emitting device. When the other surface of the first light emitting part LE1 is the light extraction surface, the wavelength of light emitted from the first light emitting part LE1 may be the shortest, the wavelength of light emitted from the second light emitting part LE2 may be longer than the wavelength of the first light emitting part LE1 and shorter than the wavelength of the third light emitting part LE3, and the wavelength of light emitted from the third light emitting part LE3 may be the longest. For example, the first light emitting part LE1 may emit blue light, the second light emitting part LE2 may emit green light, and the third light emitting part LE3 may emit red light.

The first light emitting part LE1 may include a first n-type semiconductor layer 102, a first active layer 104, a first p-type semiconductor layer 106, and a first ohmic layer 108, which are vertically stacked. The second light emitting part LE2 may include a second n-type semiconductor layer 202, a second active layer 204, a second p-type semiconductor layer 206, and a second ohmic layer 208, which are vertically stacked. The third light emitting part LE3 may include a third p-type semiconductor layer 306, a third active layer 304, and a third n-type semiconductor layer 302, which are vertically stacked, a first conductive pattern CP1 electrically coupled with the third p-type semiconductor layer 306, and a second conductive pattern CP2 electrically coupled with the third n-type semiconductor layer 302.

Each of the first n-type semiconductor layer 102, the second n-type semiconductor layer 202, and the third n-type semiconductor layer 302 may be a Si-doped gallium nitride-based semiconductor layer, for example. Each of the first p-type semiconductor layer 106, the second p-type semiconductor layer 206, and the third p-type semiconductor layer 306 may be a Mg-doped gallium nitride-based semiconductor layer, for example. Each of the first active layer 104, the second active layer 204, and the third active layer 304 may include a multi-quantum well (MQW), and the composition ratio thereof may be determined to emit light of a desired peak wavelength. Each of the first ohmic layer 108 and the second ohmic layer 208 may be formed by using a transparent conductive oxide (TCO), such as a ZnO, an $SnO_2$, an $InO_2$, an indium tin oxide (ITO), an indium zinc oxide (IZO), an indium tin zinc oxide (ITZO), or others.

Each of the first conductive pattern CP1 and the second conductive pattern CP2 may include a material, which has a higher electrical conduction property than the first ohmic layer 108 and the second ohmic layer 208. According to an exemplary embodiment, the first conductive pattern CP1 may be electrically coupled with the third p-type semiconductor layer 306 in place of a TCO, and may include an Au/Ge alloy. The second conductive pattern CP2 may be electrically coupled with the third n-type semiconductor layer 302 in place of a TCO, and may include an Au/Be alloy. As the third light emitting part LE3 includes the first conductive pattern CP1 and the second conductive pattern CP2 as an ohmic layer in place of a TCO, an ohmic property may be improved.

Referring to FIGS. 1B and 1D, the first conductive pattern CP1 may be brought into electrical contact with the third p-type semiconductor layer 306 positioned at one corner (for example, the third corner CN3) of the light emitting device. The first conductive pattern CP1 may be disposed between the second light emitting part LE2 and the third p-type semiconductor layer 306, with one surface of the first conductive pattern CP1 contacting one surface of the third p-type semiconductor layer 306. For example, the first conductive pattern CP1 may have a first thickness TH1, which may be about 0.3 μm to about 0.4 μm, without being limited thereto.

The second conductive pattern CP2 may be brought into electrical contact with the third n-type semiconductor layer 302 positioned at another one corner (for example, the fourth corner CN4) of the light emitting device. The second conductive pattern CP2 may extend into the third light emitting part LE3, and may have a pillar structure, which passes through the third p-type semiconductor layer 306 and the third active layer 304. By a first passivation layer PV1, which surrounds the outer sidewall of the second conductive pattern CP2, the second conductive pattern CP2 may be insulated from the third p-type semiconductor layer 306 and the third active layer 304. The first passivation layer PV1 may include at least one selected from the group consisting of $SiN_x$, $TiN_x$, $TiO_x$, $TaO_x$, $ZrO_x$, $HfO_x$, $AlO_x$, and $SiO_x$. The first passivation layer PV1 may extend onto the third p-type semiconductor layer 306. Also, the first passivation layer PV1 may be disposed while surrounding the first conductive pattern CP1.

One surface of the second conductive pattern CP2 may contact one surface of the third n-type semiconductor layer 302, and the opposing surface of the second conductive pattern CP2 may be positioned at a level lower than or the same as the surface of the third p-type semiconductor layer 306, which is adjacent to the second light emitting part LE2. For example, the second conductive pattern CP2 may have a second thickness TH2 greater than the first conductive pattern CP1, and may have a thickness of, for example, about 3 μm to about 4 μm. By forming the second conductive pattern CP2 to extend into the third light emitting part LE3 with the thickness TH2 greater than the thickness TH1 of the first conductive pattern CP1, a level difference between the bottom surfaces of the first conductive pattern CP1 and the other surface of the second conductive pattern CP2 may be reduced.

According to the exemplary embodiment shown in FIGS. 1B and 1C, in the second conductive pattern CP2, a first width WT1 of an upper portion UP adjacent to a sixth via structure VA6 may be greater than a second width WT2 of a lower portion LP passing through the third p-type semiconductor layer 306 and the third active layer 304. The lower portion LP of the second conductive pattern CP2 may have the second width WT2 that is constant, while the upper portion UP of the second conductive pattern CP2 may have a gradually increasing width along an upward direction. The first width WT1 may be the longest width of the second conductive pattern CP2. The outer sidewall of the upper portion UP of the second conductive pattern CP2, which is adjacent to the sixth via structure VA6, may protrude to have a sharp edge SP.

According to an exemplary embodiment, the second n-type semiconductor layer 202 of the second light emitting part LE2 may include one surface contacting the second active layer 204. A plurality of fine protrusions (see FIG. 6) may be formed on the other, opposing surface of the second n-type semiconductor layer 202. The fine protrusions may be uniform or may be non-uniform. In some exemplary embodiments, a plurality of fine protrusions may be formed on one surface of each of the first n-type semiconductor layer 102 of the first light emitting part LE1 and the third n-type semiconductor layer 302 of the third light emitting part LE3.

Referring to FIGS. 1A to 1H, the outer sidewalls of the first light emitting part LE1, the second light emitting part LE2, and the third light emitting part LE3 may be coplanar with one another. In the following descriptions, the outer sidewalls of the light emitting device refer to the outer sidewalls of the respective first light emitting part LE1, second light emitting part LE2, and third light emitting part LE3.

The light emitting device may further include a first adhesion part AD1 and a first color filter CF1, which are disposed between the first light emitting part LE1 and the second light emitting part LE2, and a second adhesion part AD2 and a second color filter CF2, which are disposed between the second light emitting part LE2 and the third light emitting part LE3.

Each of the first adhesion part AD1 and the second adhesion part AD2 may include a material which has an adhesive property and high in transmittance, such as SOG (silicon on glass), $SiO_2$, a photoresist, BCB (benzo cyclo butine) or HSQ (hydrogen silsesquioxanes). Each of the first color filter CF1 and the second color filter CF2 may include a DBR (distributed Bragg reflector) having a structure, in which $TiO_2$ and $SiO_2$ are alternately stacked. For example, the first color filter CF1 and the second color filter CF2 may be different in terms of the composition ratio and alternate stacking order and number of $TiO_2$ and $SiO_2$. According to an exemplary embodiment, the first color filter CF1 may selectively pass light generated from the second light emitting part LE2 and light generated from the third light emitting part LE3, and may reflect light generated from the first light emitting part LE1. The second color filter CF2 may selectively pass light generated from the third light emitting part LE3, and may reflect light generated from the first light emitting part LE1 and light generated from the second light emitting part LE2.

According to an exemplary embodiment, as the second conductive pattern CP2 is disposed to pass through the third p-type semiconductor layer 306 and the third active layer 304, and the first conductive pattern CP1 is disposed on the third p-type semiconductor layer 306, the second conductive pattern CP2 may be formed to have a thickness greater than the first conductive pattern CP1 to reduce the level difference between the first conductive pattern CP1 and the second conductive pattern CP2. When the second adhesion part AD2 disposed on the other surfaces of the first conductive pattern CP1 and the second conductive pattern CP2 is bonded with the second color filter CF2, the second adhesion part AD2 may be formed substantially uniform without a dented or protruded portion, due to the reduced level difference between the first conductive pattern CP1 and the second conductive pattern CP2. When the second adhesion part AD2 is dented or protruded, an air gap may be formed in the dented or protruded portion, which may be expanded and delaminate the second adhesion part AD2 and the second color filter CF2 when the second adhesion part AD2 is bonded through thermo-compression process or the like. According to an exemplary embodiment, by reducing the level difference between the first conductive pattern CP1 and the second conductive pattern CP2, which are brought into contact with the second adhesion part AD2, through setting a thickness difference between the first conductive pattern CP1 and the second conductive pattern CP2, it is possible to prevent the second adhesion part AD2 from being formed with a dented or protruded portion, thereby preventing delamination due to the presence of an air gap.

On the third light emitting part LE3, a first pad PD1 may be disposed at the first corner CN1 and electrically coupled with the first ohmic layer 108, a second pad PD2 may be disposed at the second corner CN2 and electrically coupled with the second ohmic layer 208, a third pad PD3 may be disposed at the third corner CN3 and electrically coupled with the first conductive pattern CP1, and a common pad CPD may be disposed at the fourth corner CN4 and electrically coupled in common with the first to third n-type semiconductor layers 102, 202, and 302.

For example, each of the first pad PD1, the second pad PD2, the third pad PD3, and the common pad CPD may include at least one of Au, Ag, Ni, Al, Rh, Pd, Ir, Ru, Mg, Zn, Pt, Hf, Cr, Ti, and Cu, or an alloy thereof.

According to an exemplary embodiment, each of the first pad PD1, the second pad PD2, the third pad PD3, and the common pad CPD may have substantially the same width WT and shape when viewed from the top. For example, when the light emitting device is 10×10 μm, each of the first pad PD1, the second pad PD2, the third pad PD3, and the common pad CPD may have a width of about 3 μm to 4 μm, and the width between the first pad PD1, the second pad PD2, the third pad PD3, and the common pad CPD may be about 2 μm to about 4 μm.

The light emitting device may further include a first via structure VA1, which is disposed at the first corner CN1 and electrically couples the first ohmic layer 108 and the first pad PD1, a second via structure VA2, which is disposed at the second corner CN2 and electrically couples the second ohmic layer 208 and the second pad PD2, and a third via structure VA3, which is disposed at the third corner CN3 and electrically couples the first conductive pattern CP1 and the third pad PD3. In addition, the light emitting device may further include a fourth via structure VA4, which is disposed at the fourth corner CN4 and electrically couples the first n-type semiconductor layer 102 and the common pad CPD, a fifth via structure VA5, which disposed at the fourth corner CN4 and electrically couples the second n-type semiconductor layer 202 and the common pad CPD, and the sixth via structure VA6, which is disposed at the fourth corner CN4 and electrically couples the second conductive pattern CP2 and the common pad CPD.

The first via structure VA1 may pass through the third light emitting part LE3, the second adhesion part AD2, the second color filter CF2, the second light emitting part LE2, the first adhesion part AD1, and the first color filter CF1. The second via structure VA2 may pass through the third light emitting part LE3, the second adhesion part AD2, and the second color filter CF2. The third via structure VA3 may pass through the third light emitting part LE3. The fourth via structure VA4 may pass through the third light emitting part LE3, the second adhesion part AD2, the second color filter CF2, the second light emitting part LE2, the first adhesion part AD1, the first color filter CF1, the first ohmic layer 108, the first p-type semiconductor layer 106, and the first active layer 104. The fifth via structure VA5 may pass through the third light emitting part LE3, the second adhesion part AD2, the second color filter CF2, the second ohmic layer 208, the second p-type semiconductor layer 206, and the second active layer 204. The sixth via structure VA6 may pass through the third n-type semiconductor layer 302. Referring to FIGS. 1A and 1B, each of the first via structure VA1, the second via structure VA2, the third via structure VA3, the fourth via structure VA4, the fifth via structure VA5, and the sixth via structure VA6 may have the same third width WT3. The third width WT3 may be equal to or less than about 1 μm.

Referring to FIGS. 1G and 1H, according to another exemplary embodiment, the first via structure VA1, the second via structure VA2, the third via structure VA3, the fourth via structure VA4, the fifth via structure VA,5 and the sixth via structure VA6 may have different widths. For example, each of the first via structure VA1, the second via structure VA2, the third via structure VA3, the fourth via structure VA4, and the fifth via structure VA5 may have the same third width WT3, and the sixth via structure VA6 may have a fourth width WT4 greater than the third width WT3. When the first light emitting part LE1 emits blue light, the second light emitting part LE2 emits green light, and the third light emitting part LE3 emits red light, maximum external quantum efficiencies (EQE) depending on current densities per area in the first light emitting part LE1, the second light emitting part LE2, and the third light emitting part LE3 may be different from one another. In FIG. 1I, the x-axis represents a current density per unit area of the light emitting device, and the y-axis represents a normalized EQE. Referring to FIG. 1I, in order to achieve the maximum external quantum efficiency of 100%, current of approximately 2 A/cm2 per unit area is required in the first light emitting part LE1 and the second light emitting part LE2, but current of approximately 20 A/cm2 per unit area is required in the third light emitting part LE3. In the light emitting device according to an exemplary embodiment, it is preferred that the first light emitting part LE1, the second light emitting part LE2, and the third light emitting part LE3 are vertically stacked and a maximum external quantum efficiency is achieved by applying the same current. As such, by reducing the area of the third light emitting part LE3, the amount of current to be applied to the third light emitting part LE3 may be reduced to the level of the amount of current to be applied to each of the first light emitting part LE1 and the second light emitting part LE2. By forming the sixth via structure VA6 of the third light emitting part LE3 to be larger than the size of each of the first to fifth via structures VA1, VA2, VA3, VA4, and VA5, the area of the third light emitting part LE3 for emitting red light may be reduced, which may result in applying substantially the same amount of current to each of the first light emitting part LE1, the second light emitting part LE2, and the third light emitting part LE3. In this manner, a maximum external quantum efficiency may be achieved.

In some exemplary embodiments, for the same reason, the third via structure VA3 electrically coupled with the third p-type semiconductor layer 306 of the third light emitting part LE3 may have a fourth width WT4 greater than the third width WT3 of each of the first via structure VA1, the second via structure VA2, the fourth via structure VA4, the fifth via structure VA5, and the sixth via structure VA6.

Referring to FIGS. 1B and 1E, one surface of the third via structure VA3 may be brought into contact with the one surface of the first conductive pattern CP1. The first conductive pattern CP1 may have a width greater than the third width WT3. The one surface of the first conductive pattern CP1 may be brought into contact simultaneously with the one surfaces of the third via structure VA3 and the third p-type semiconductor layer 306. The first conductive pattern CP1 may include a first portion PT1 contacting the third via structure VA3 and a second portion PT2 contacting the third p-type semiconductor layer 306. The second portion PT2 may have a structure, which surrounds the first portion PT1. The area of the second portion PT2 may be about 1 to about 5 times the area of the first portion PT1.

Referring to FIGS. 1B and 1F, one surface of the sixth via structure VA6 may be brought into contact with the one surface of the second conductive pattern CP2. The second conductive pattern CP2 may have a width greater than the third width WT3. Referring to FIG. 1C, the second conductive pattern CP2 may have the first width WT1 and the second width WT2, and the third width WT3 of the sixth via structure VA6 may be smaller than the first width WT1 and the second width WT2. The second width WT2 may be smaller than the first width WT1 and greater than the third width WT3. The one surface of the second conductive pattern CP2 may be brought into contact simultaneously with the sixth via structure VA6 and the third n-type semiconductor layer 302. The second conductive pattern CP2 may include a first portion PT1 contacting the sixth via structure VA6 and a second portion PT2 contacting the third n-type semiconductor layer 302. The second portion PT2 may have a structure, which surrounds the first portion PT1. The area of the second portion PT2 may be about 1 to about 5 times the area of the first portion PT1.

Referring to FIGS. 1A through 1H, each of the first via structure VAL the second via structure VA2, the third via structure VA3, the fourth via structure VA4, the fifth via structure VA5, and the sixth via structure VA6 may include a seed layer SD and a plating layer ML, and the seed layer SD may surround the plating layer ML. For example, each of the seed layer SD and the plating layer ML may include copper, and a density of the copper in the seed layer SD may be higher than that in the plating layer ML.

The light emitting device may further include a second passivation layer PV2 which surrounds the outer sidewalls of the respective first via structure VAL second via structure VA2, third via structure VA3, fourth via structure VA4, fifth via structure VA5, and sixth via structure VA6, and extends to the surface of the third n-type semiconductor layer 302. As the second passivation layer PV2 extends to the surface of the third n-type semiconductor layer 302, the second passivation layer PV2 may insulate the third n-type semiconductor layer 302 from the first pad PD1, the second pad PD2, the third pad PD3, and the common pad CPD. The second passivation layer PV2 may include a transparent material that has an insulation property. For example, the second passivation layer PV2 may include at least one of $SiN_x$, $TiN_x$, $TiO_x$, $TaO_x$, $ZrO_x$, $HfO_x$, $AlO_x$, and $SiO_x$.

According to an exemplary embodiment, in the second passivation layer PV2, the thickness of a portion which extends to the surface of the third n-type semiconductor layer 302 may be greater than or equal to the thickness of a portion which surrounds the outer sidewalls of the respective first via structure VA1, second via structure VA2, third via structure VA3, fourth via structure VA4, fifth via structure VA5, and sixth via structure VA6.

When separating the light emitting device from a substrate during manufacture, the substrate may be bent. As such, since the second passivation layer PV2 according to an exemplary embodiment includes a portion disposed on the surface of the third n-type semiconductor layer 302 that has a thickness greater than or equal to the thickness of the portion surrounding the outer sidewalls of the respective first via structure VA1, second via structure VA2, third via structure VA3, fourth via structure VA4, fifth via structure VA5, and sixth via structure VA6, the second passivation layer PV2 which is disposed on the surface of the third n-type semiconductor layer 302 may prevent the first pad PD1, the second pad PD2, the third pad PD3, and the common pad CPD from being delaminated from the light emitting device.

The light emitting device may further include an outer seed layer SSD, which is disposed to surround the outer sidewalls of the light emitting device. According to an exemplary embodiment, the second passivation layer PV2 may be disposed to extend between the outer seed layer SSD and the light emitting device. Both end surfaces of the outer seed layer SSD may be substantially coplanar with both end surfaces of the fourth via structure VA4. According to illustrated exemplary embodiment, among light generated from the first light emitting part LE1, the second light emitting part LE2, and the third light emitting part LE3, light emitted towards the sides of the light emitting device may be reflected by the outer seed layer SSD, thereby improving the light efficiency of the light emitting device.

According to an exemplary embodiment, the light emitting device may further include a masking pattern MP5 which surrounds the outer sidewalls of the outer seed layer SSD. The light emitting device may be electrically insulated from an outside by the masking pattern MP5. The masking pattern MP5 may include an opaque material that has an insulation property, such as a photoresist, a polyimide, an epoxy, or others.

According to an exemplary embodiment, a bowing phenomenon may occur between a substrate (not shown) to be removed after the light emitting device is completed and the first p-type semiconductor layer 106 of the first light emitting part LE1. As such, a crack may occur in a light emitting device during a device separation process of separating a plurality of light emitting devices disposed on the substrate. In this case, the occurrence of a crack may be prevented by the masking pattern MP5, which surrounds the outer sidewalls of the light emitting device.

While the light emitting device illustrated with reference to FIGS. 1A to 1H has been described as the first n-type semiconductor layer 102, the second n-type semiconductor layer 202, and the third n-type semiconductor layer 302 being electrically coupled to the common pad CPD, the inventive concepts are not limited thereto. For example, in some exemplary embodiments, the first p-type semiconductor layer 106, the second p-type semiconductor layer 206, and the third p-type semiconductor layer 306 may be electrically coupled to the common pad CPD.

Figure 2A:
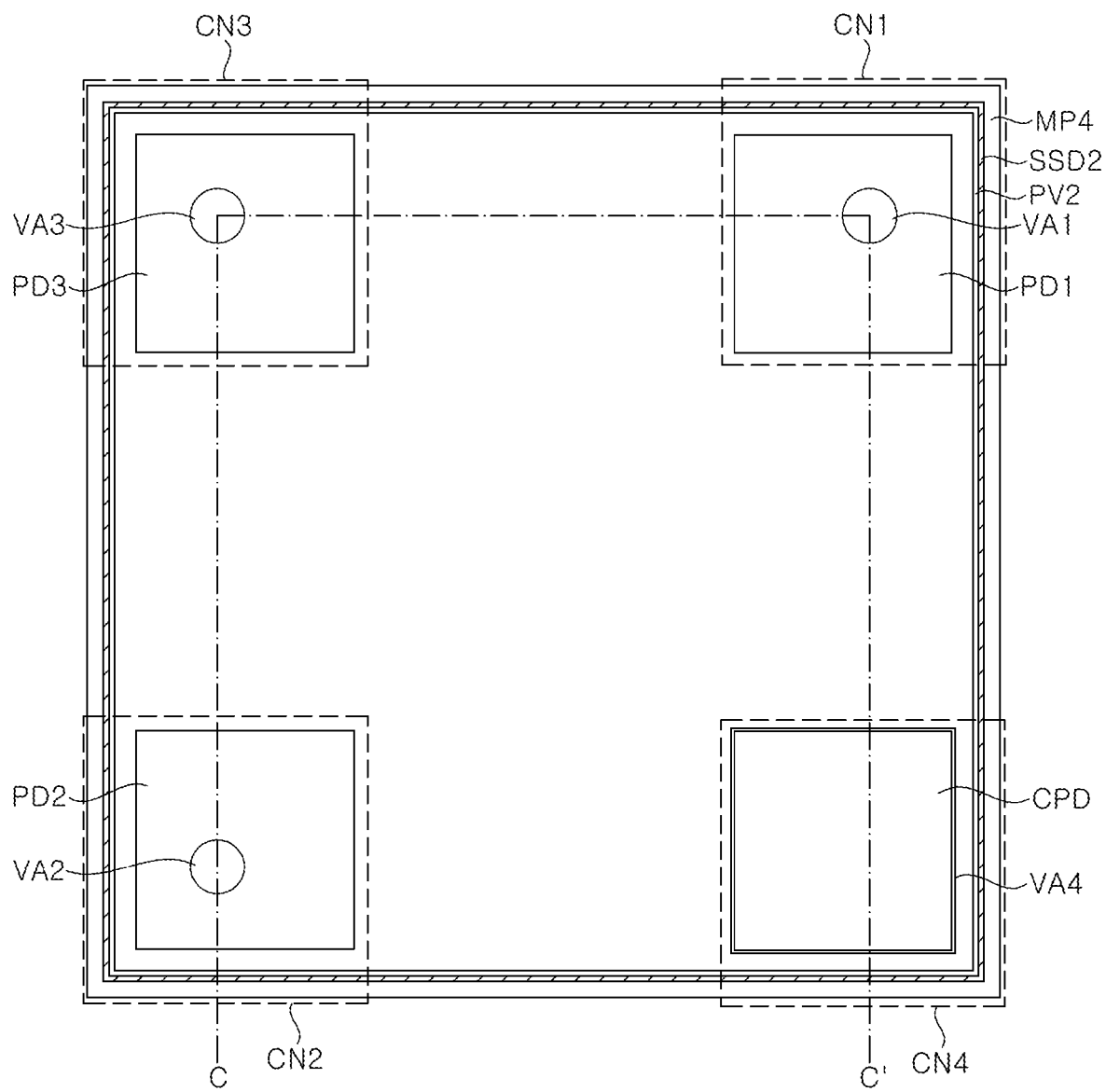
FIG. 2A is a top view of a light emitting device according to another exemplary embodiment.
Figure 2B:
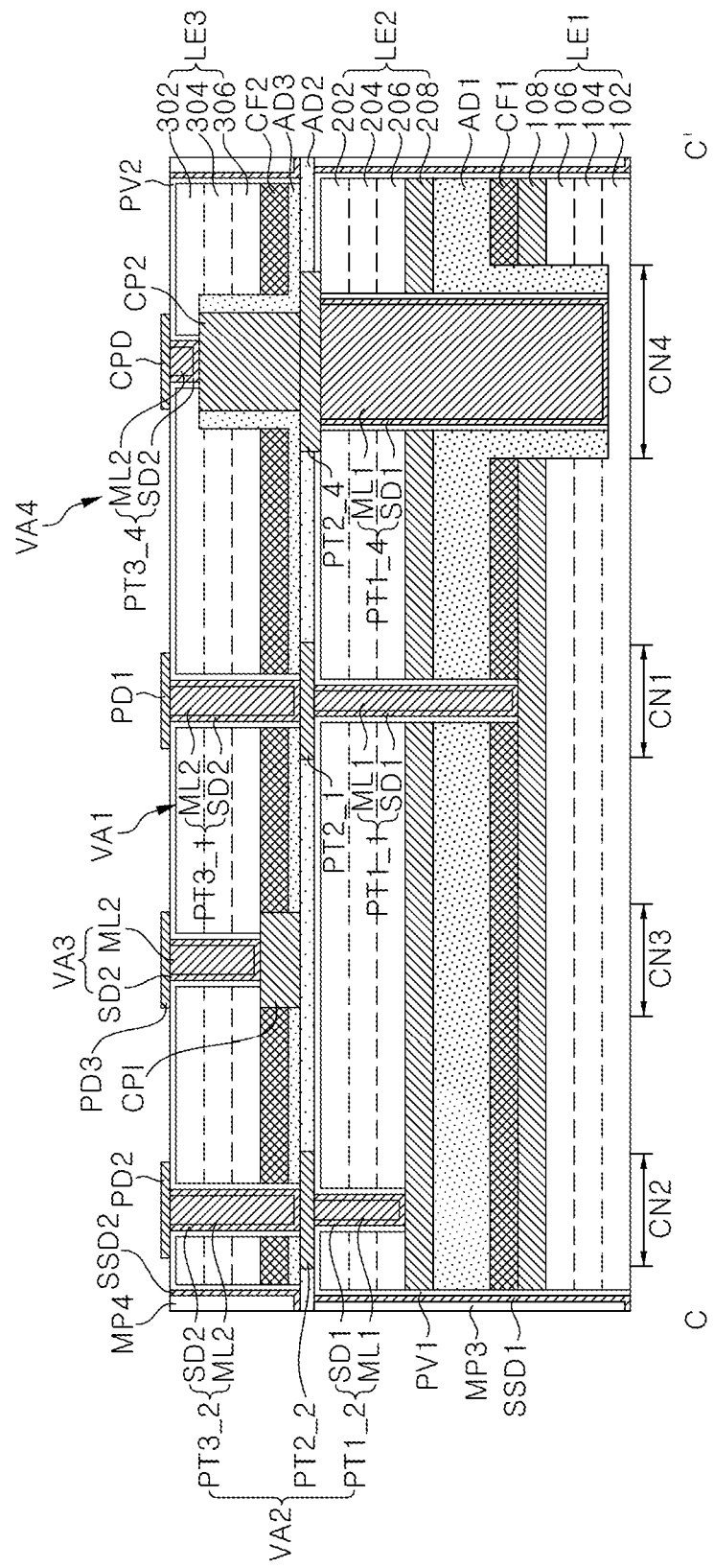
FIG. 2B is a cross-sectional view taken along line C-C' of FIG. 2A.

FIG. 2A is a top view of a light emitting device according to another exemplary embodiment. FIG. 2B is a cross-sectional view taken along line C-C' of FIG. 2A.

Referring to FIGS. 2A and 2B, a light emitting device may include a first light emitting part LE1, a second light emitting part LE2, and a third light emitting part LE3.

The first light emitting part LE1 may include a first n-type semiconductor layer 102, a first active layer 104, a first p-type semiconductor layer 106, and a first ohmic layer 108, which are vertically stacked. The second light emitting part LE2 may include a second ohmic layer 208, a second p-type semiconductor layer 206, a second active layer 204, and a second n-type semiconductor layer 202, which are vertically stacked. The third light emitting part LE3 may include a third p-type semiconductor layer 306, a third active layer 304, and a third n-type semiconductor layer 302, which are vertically stacked. The third light emitting part LE3 may further include a first conductive pattern CP1, which is electrically coupled with the third p-type semiconductor layer 306, and a second conductive pattern CP2, which is electrically coupled with the third n-type semiconductor layer 302.

The light emitting device may further include a first color filter CF1 and a first adhesion part AD1, which are disposed between the first light emitting part LE1 and the second light emitting part LE2, and a second color filter CF2, a second adhesion part AD2, and a third adhesion part AD3, which are disposed between the second light emitting part LE2 and the third light emitting part LE3. The first color filter CF1 may be disposed between the first ohmic layer 108 and the first adhesion part AD1. Alternatively, the first color filter CF1 may be disposed between the first ohmic layer 108 and the first adhesion part AD1. The second color filter CF2 may be disposed between the third p-type semiconductor layer 306 and the third adhesion part AD3. The first adhesion part AD1 may be disposed between the first color filter CF1 and the second ohmic layer 208, and may bond the first light emitting part LE1 and the second light emitting part LE2 to each other. According to an exemplary embodiment, the first adhesion part AD1 may be disposed to extend to the inner sidewall of a hole, which passes through the first color filter CF1, the first ohmic layer 108, the first p-type semiconductor layer 106, and the first active layer 104. The second adhesion part AD2 may be disposed between the second n-type semiconductor layer 202 and the third adhesion part AD3. The third adhesion part AD3 may be disposed between the second adhesion part AD2 and the second color filter CF2. The third adhesion part AD3 may be disposed to extend to the inner sidewall of a hole, which passes through the second color filter CF2, the third p-type semiconductor layer 306, and the third active layer 304.

According to an exemplary embodiment, the first conductive pattern CP1 may be brought into electrical contact with the third p-type semiconductor layer 306. The first conductive pattern CP1 may be disposed between the second light emitting part LE2 and the third p-type semiconductor layer 306, with one surface of the first conductive pattern CP1 contacting the third p-type semiconductor layer 306. For example, the first conductive pattern CP1 may have a pillar structure which passes through the second color filter CF2 and the third adhesion part AD3.

The second conductive pattern CP2 may be brought into electrical contact with the third n-type semiconductor layer 302. The second conductive pattern CP2 may have a pillar structure, which extends into the third light emitting part LE3 and passes through the third p-type semiconductor layer 306 and the third active layer 304. The second conductive pattern CP2 may have a thickness greater than the first conductive pattern CP1. For example, the second conductive pattern CP2 may have a pillar structure, which passes through the third adhesion part AD3, the second color filter CF2, the third p-type semiconductor layer 306, and the third active layer 304.

While one surface of the second conductive pattern CP2 is positioned at a level higher than the one surface of the first conductive pattern CP1, the other surface of the second conductive pattern CP2 and the other surface of the first conductive pattern CP1 may be disposed on the same plane. The other surface of the first conductive pattern CP1 and the other surface of the second conductive pattern CP2 are surfaces contacting the second light emitting part LE2 when the third light emitting part LE3 is bonded to the second light emitting part LE2. As the other surface of the first conductive pattern CP1 and the other surface of the second conductive pattern CP2 are coplanar with each other, a bonding characteristic may be improved.

The light emitting device may have a substantially quadrangular structure when viewed from the top, and may include a first corner CN1, a second corner CN2, a third corner CN3, and a fourth corner CN4. On the third light emitting part LE3, a first pad PD1 may be disposed at the first corner CN1 and electrically coupled with the first ohmic layer 108, a second pad PD2 may be disposed at the second corner CN2 and electrically coupled with the second ohmic layer 208, a third pad PD3 may be disposed at the third corner CN3 and electrically coupled with the first conductive pattern CP1, and a common pad CPD may be disposed at the fourth corner CN4 and electrically coupled in common with the first n-type semiconductor layer 102, the second n-type semiconductor layer 202, and the third n-type semiconductor layer 302.

According to an exemplary embodiment, the light emitting device may further include a first via structure VA1 which electrically couples the first pad PD1 and the first ohmic layer 108, a second via structure VA2 which electrically couples the second pad PD2 and the second ohmic layer 208, a third via structure VA3 which electrically couples the third pad PD3 and the first conductive pattern CP1, and a fourth via structure VA4 which electrically couples the common pad CPD with the first n-type semiconductor layer 102, the second n-type semiconductor layer 202, and the third n-type semiconductor layer 302.

The first via structure VA1 may include a first pattern PT1_1 electrically contacting the first ohmic layer 108 and passing through the first color filter CF1, the first adhesion part AD1, and the second light emitting part LE2, a second pattern PT2_1 electrically contacting the first pattern PT1_1 and disposed between the second light emitting part LE2 and the third light emitting part LE3, and a third pattern PT3_1 passing through the third light emitting part LE3 between the second pattern PT2_1 and the first pad PD1 and electrically coupling the second pattern PT2_1 and the first pad PD1. For example, the first pattern PT1_1 may include a first plating layer ML1 and a first seed layer SD1, which surrounds the outer sidewall of the first plating layer ML1. In this case, the first pattern PT1_1 may include metal, such as copper. The outer sidewall of the first pattern PT1_1 may be surrounded by a first passivation layer PV1 to be electrically insulated from the second light emitting part LE2. The first passivation layer PV1 may have a structure which surrounds the outer sidewall of the first pattern PT1_1 and extends to the surface of the second n-type semiconductor layer 202. The first passivation layer PV1 may include a transparent material that has an insulation property, such as $SiO_2$ or SiN. The outer sidewall of the second pattern PT2_1 may be surrounded by the second adhesion part AD2. One surface of the second pattern PT2_1 is brought into contact with the first pattern PT1_1, and the other, opposing surface may be brought into contact with the third pattern PT3_1. The second pattern PT2_1 may include metal, such as Au. The thickness of the second pattern PT2_1 and the thickness of the second adhesion part AD2 may be substantially the same. The third pattern PT3_1 may include a second plating layer ML2 and a second seed layer SD2 which surrounds the outer sidewall of the second plating layer ML2. In this case, the third pattern PT3_1 may include metal, such as copper. The third pattern PT3_1 may be surrounded by a second passivation layer PV2 and to be electrically insulated from the third light emitting part LE3. The second passivation layer PV2 may include a transparent material that has an insulation property, such as $SiO_2$ or SiN.

The second via structure VA2 may include a first pattern PT1_2, which passes through the second n-type semiconductor layer 202, the second active layer 204, and the second p-type semiconductor layer 206 and is brought into electrical contact with the second ohmic layer 208, a second pattern PT2_2, which is disposed between the second light emitting part LE2 and the third light emitting part LE3 and is brought into electrical contact with the first pattern PT1_2, and a third pattern PT3_2, which passes through the third adhesion part AD3, the second color filter CF2, and the third light emitting part LE3 and electrically couples the second pattern PT2_2 and the second pad PD2. For example, the first pattern PT1_2 may include a first plating layer ML1 and a first seed layer SD1, which surrounds the outer sidewall of the first plating layer ML1. In this case, the first pattern PT1_2 may include metal, such as copper. The outer sidewall of the first pattern PT1_2 may be surrounded by the first passivation layer PV1 to be electrically insulated from the second light emitting part LE2. The first passivation layer PV1 may have a structure, which surrounds the outer sidewall of the first pattern PT1_1 of the first via structure VA1 and the outer sidewall of the first pattern PT1_2 of the second via structure VA2 and extends to the surface of the second n-type semiconductor layer 202. The outer sidewall of the second pattern PT2_2 may be surrounded by the second adhesion part AD2. One surface of the second pattern PT2_2 may be brought into contact with the first pattern PT1_2, and the other, opposing surface may be brought into contact with the third pattern PT3_2. The second pattern PT2_1 of the first via structure VA1 and the second pattern PT2_2 of the second via structure VA2 may be positioned at the same level. The thickness of the second pattern PT2_2 and the thickness of the second adhesion part AD2 may be substantially the same. The second pattern PT2_2 may include metal, such as Au. The third pattern PT3_2 may include a second plating layer ML2 and a second seed layer SD2, which surrounds the outer sidewall of the second plating layer ML2. In this case, the third pattern PT3_2 may include metal, such as copper. The third pattern PT3_2 of the second via structure VA2 and the third pattern PT3_1 of the first via structure VA1 may have substantially the same structure. The third pattern PT3_2 may be surrounded by the second passivation layer PV2 to be electrically insulated from the third light emitting part LE3. The second passivation layer PV2 may have a structure, which surrounds the outer sidewall of the third pattern PT3_1 of the first via structure VA1 and the outer sidewall of the third pattern PT3_2 of the second via structure VA2 and extends to the surface of the third n-type semiconductor layer 302.

The third via structure VA3 may pass through the third n-type semiconductor layer 302, the third active layer 304, and the third p-type semiconductor layer 306, and may electrically couple the first conductive pattern CP1 and the third pad PD3. The third via structure VA3 may include a second plating layer ML2 and a second seed layer SD2, which surrounds the outer sidewall of the second plating layer ML2. In this case, the third via structure VA3 may include metal, such as copper.

According to an exemplary embodiment, one surface of the third via structure VA3 may be brought into contact with the one surface of the first conductive pattern CP1. The first conductive pattern CP1 may have a width greater than the width of the third via structure VA3. The one surface of the first conductive pattern CP1 may be brought into contact simultaneously with the one surfaces of the third via structure VA3 and the third p-type semiconductor layer 306. The first conductive pattern CP1 may include a first portion PT1, which is brought into contact with the third via structure VA3, and a second portion PT2, which brought into contact with the third p-type semiconductor layer 306. The second portion PT2 may have a structure which surrounds the first portion PT1. The area of the second portion PT2 may be about 1 to about 5 times the area of the first portion PT1.

The fourth via structure VA4 may include a first pattern PT1_4, which is brought into electrical contact with the first n-type semiconductor layer 102 and passes through the first active layer 104, the first p-type semiconductor layer 106, the first ohmic layer 108, the first color filter CF1, and the second light emitting part LE2, a second pattern PT2_4, which has one surface brought into electrical contact with the first pattern PT1_4 and the second n-type semiconductor layer 202 and the other surface brought into electrical contact with the second conductive pattern CP2 and disposed in the second adhesion part AD2, and a third pattern PT3_4, which electrically couples the second conductive pattern CP2 and the common pad CPD. The first pattern PT1_4 may include a first plating layer ML1 and a first seed layer SD1, which surrounds the outer sidewall of the first plating layer ML1. The first passivation layer PV1 may surround the outer sidewall of the first pattern PT1_4. The first adhesion part AD1 may have a structure, which surrounds a portion of the outer sidewall of the first pattern PT1_4 surrounded by the first passivation layer PV1 and extends to the surface of the first color filter CF1. The outer sidewall of the second pattern PT2_4 may have a structure, which is surrounded by the second adhesion part AD2. The third pattern PT3_4 may include a second plating layer ML2 and a second seed layer SD2, which surrounds the outer sidewall of the second plating layer ML2, and may have a structure in which the outer sidewall thereof is surrounded by the second passivation layer PV2. The second passivation layer PV2 may have a structure, which extends to the third n-type semiconductor layer 302 and surrounds the respective outer sidewalls of the third pattern PT3_1 of the first via structure VA1, the third pattern PT3_2 of the second via structure VA2, the third via structure VA3, and the third pattern PT3_4 of the fourth via structure VA4.

According to an exemplary embodiment, one surface of the fourth via structure VA4 may be brought into contact with the one surface of the second conductive pattern CP2. The second conductive pattern CP2 may have a width greater than the width of the fourth via structure VA4. The one surface of the second conductive pattern CP2 may include a first portion PT1, which is brought into contact with the fourth via structure VA4, and a second portion PT2, which is brought into contact with the third n-type semiconductor layer 302. The second portion PT2 may have a structure, which surrounds the first portion PT1. The area of the second portion PT2 may be about 1 to about 5 times the area of the first portion PT1.

The respective outer sidewalls of the first light emitting part LE1 and the second light emitting part LE2 may be coplanar with each other. A first outer seed layer SSD1 may be provided along the outer sidewalls of the first light emitting part LE1 and the second light emitting part LE2. The first passivation layer PV1 may extend between the first outer seed layer SSD1 and the outer sidewalls of the first light emitting part LE1 and the second light emitting part LE2. By the first passivation layer PV1, the first light emitting part LE1 and the second light emitting part LE2 may be insulated from the first outer seed layer SSD1. Also, a masking pattern MP3 may be additionally provided on the outer sidewalls of the first outer seed layer SSD1.

The outer sidewalls of the second adhesion part AD2 may project from the respective outer sidewalls of the first light emitting part LE1, the second light emitting part LE2, and the third light emitting part LE3. A second outer seed layer SSD2, which is disposed on the outer sidewalls of the third light emitting part LE3 and extends to the top surfaces of the exposed peripheral portions of the second adhesion part AD2, may be additionally provided. The second passivation layer PV2 may extend between the second outer seed layer SSD2 and the outer sidewalls of the third light emitting part LE3. By the second passivation layer PV2, the third light emitting part LE3 may be insulated from the second outer seed layer SSD2. Also, a masking pattern MP4 may be additionally provided on the outer sidewalls of the second outer seed layer SSD2.

While the light emitting device illustrated with reference to FIGS. 2A and 2B is described as having the first n-type semiconductor layer 102, the second n-type semiconductor layer 202, and the third n-type semiconductor layer 302 electrically coupled to the common pad CPD, however, the inventive concepts are not limited thereto. In some exemplary embodiments, the first p-type semiconductor layer 106, the second p-type semiconductor layer 206, and the third p-type semiconductor layer 306 may be electrically coupled to the common pad CPD.

Hereafter, a method for manufacturing the light emitting device of FIGS. 1A to 1F will be described.

FIGS. 3 to 28 are cross-sectional views illustrating a method for manufacturing a light emitting device according to an exemplary embodiment.

Figure 3:
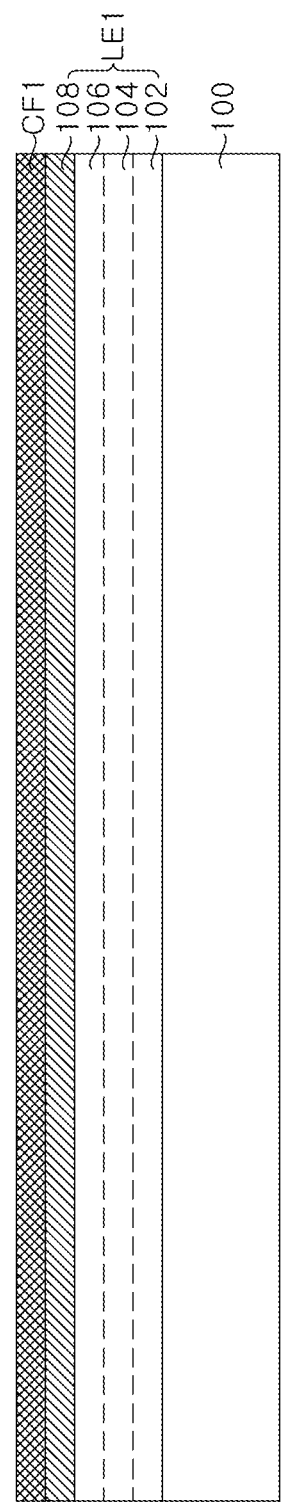
FIGS. 3, 4, 5, 6, 7, 8, 9, 10, 11, 12, 13, 14, 15, 16, 17, 18, 19, 20, 21, 22, 23, 24, 25, 26, 27, and 28 are cross-sectional views illustrating a method for manufacturing a light emitting device according to an exemplary embodiment.

Referring to FIG. 3, a first light emitting part LE1 including a first n-type semiconductor layer 102, a first active layer 104, a first p-type semiconductor layer 106, and a first ohmic layer 108 may be formed on a first substrate 100. A first color filter CF1 may be formed on the first light emitting part LE1. In some exemplary embodiments, the first color filter CF1 may be selectively omitted.

When viewed from the top, the first substrate 100 may have a substantially quadrangular structure, and may include a first corner CN1, a second corner CN2, a third corner CN3, and a fourth corner CN4. Each of the first light emitting part LE1 and the first color filter CF1 may have a substantially quadrangular structure corresponding to the first substrate 100, and the outer sidewalls of the first substrate 100 and the outer sidewalls of the first light emitting part LE1 and the first color filter CF1 may be coplanar with one another.

Figure 4:
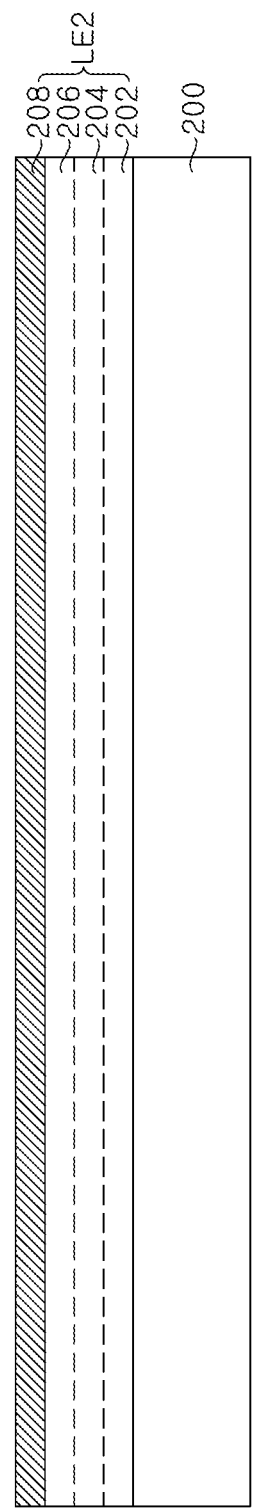

Referring to FIG. 4, a second light emitting part LE2 including a second n-type semiconductor layer 202, a second active layer 204, a second p-type semiconductor layer 206, and a second ohmic layer 208 may be formed on a second substrate 200.

According to an exemplary embodiment, before growing the second n-type semiconductor layer 202 on the second substrate 200, a gallium nitride layer which is not doped with a dopant may be grown.

The second substrate 200 may have a substantially quadrangular structure when viewed from the top, and the second light emitting part LE2 may have a substantially quadrangular structure corresponding to the second substrate 200. As such, the outer sidewalls of the second substrate 200 and the outer sidewalls of the second light emitting part LE2 may be coplanar with each other. The second substrate 200 may have a structure and a size corresponding to the first substrate 100.

Figure 5:
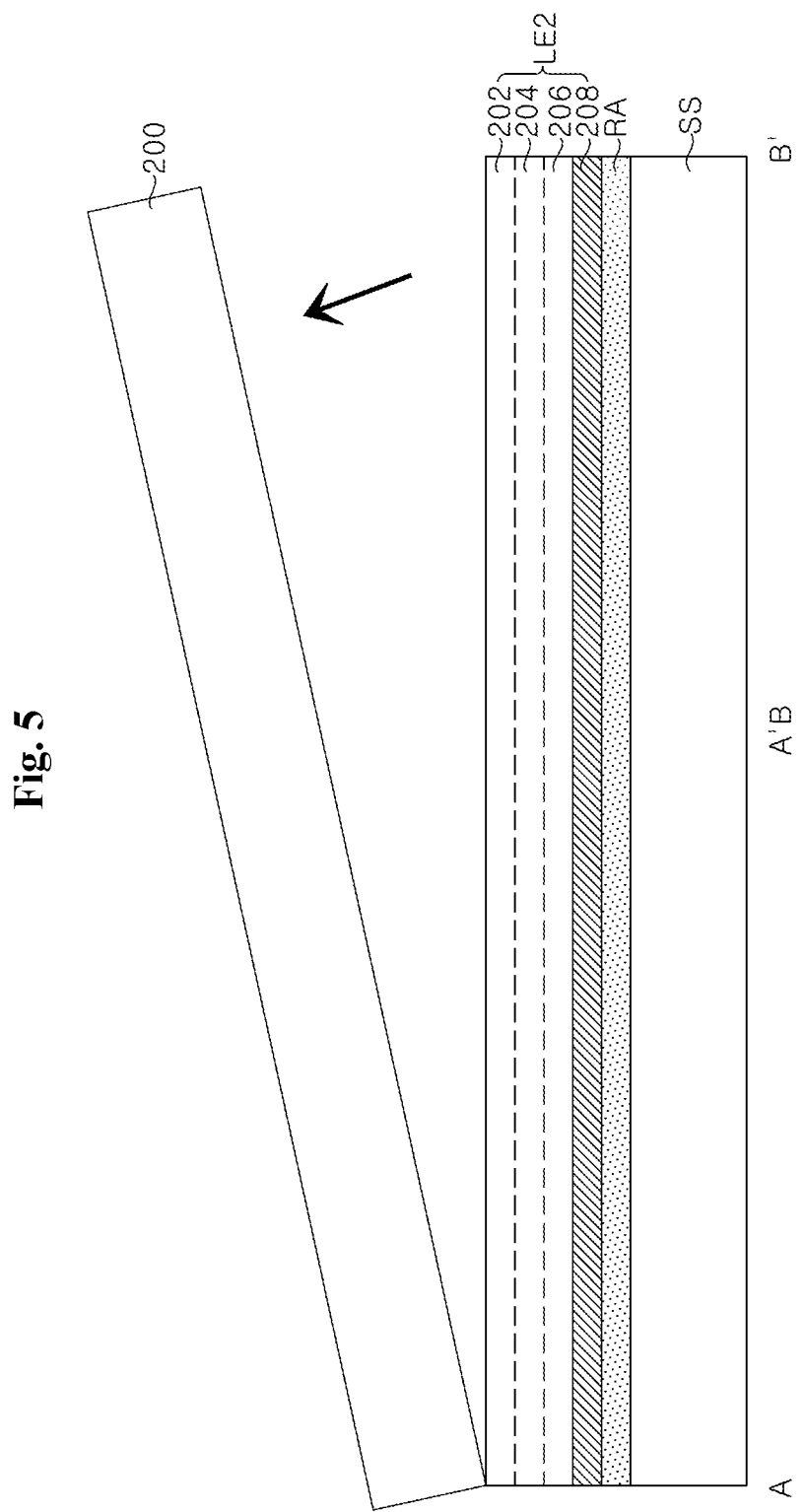

Referring to FIG. 5, by turning over the second light emitting part LE2, a support substrate SS may be bonded to the second ohmic layer 208 by using a removable adhesive RA. The second substrate 200 may then be removed from the second light emitting part LE2 by using a laser lift-off method or the like. At a region where the second substrate 200 is removed, the second n-type semiconductor layer 202 may be exposed, or the germanium nitride layer which is not doped with a dopant may be exposed.

Figure 6:
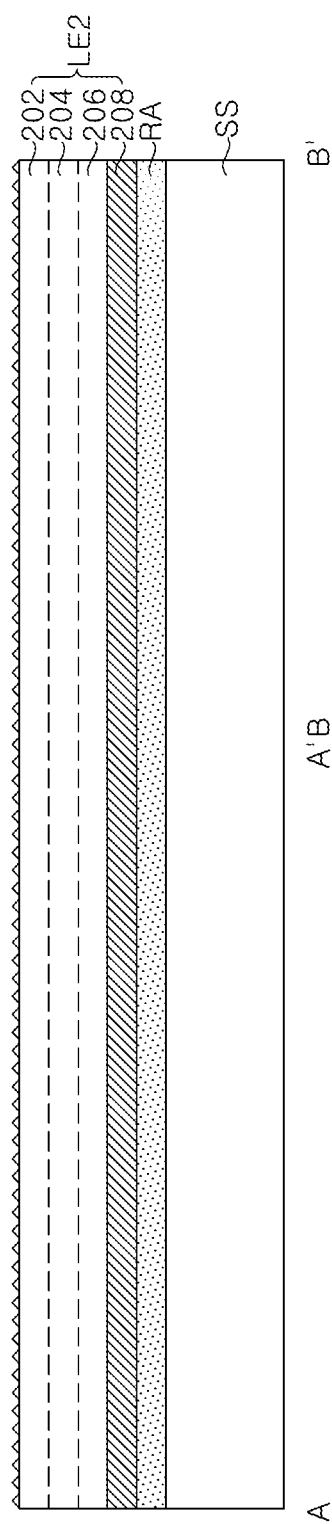

Referring to FIG. 6, by etching the exposed gallium nitride layer through using an etching process and performing chemical treatment, a plurality of protrusions may be formed. The plurality of protrusions may be formed on the gallium nitride layer which is not doped with a dopant, or may be formed on the second n-type semiconductor layer 202.

As the plurality of protrusions are formed on the second n-type semiconductor layer 202 or the gallium nitride layer not doped with a dopant, light generated from the first active layer 104 or the second active layer 204 may be scattered at the plurality of protrusions, thereby improving light extraction efficiency.

In some exemplary embodiments, the process shown in FIG. 6 may be omitted. In addition, in some exemplary embodiments, a plurality of protrusions may also be formed on the first n-type semiconductor layer 102.

Hereinafter, explanations and illustrations will be made by assuming that the process shown in FIG. 6 has been omitted.

Figure 7:
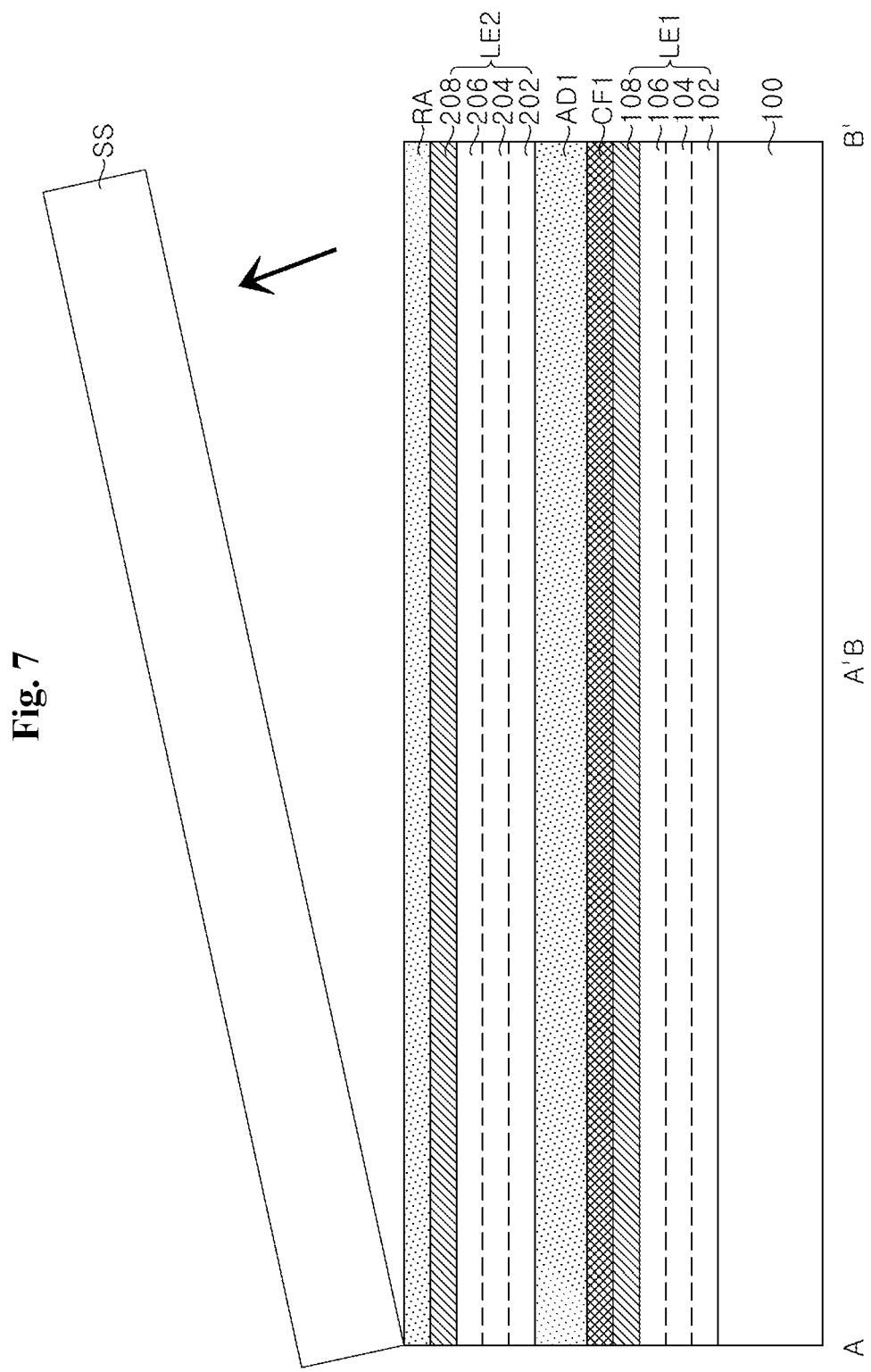

Referring to FIG. 7, a first adhesion part AD1 may be deposited on the first color filter CF1 of the first substrate 100. Then, after turning over again the second light emitting part LE2 bonded to the first support substrate SS, the second n-type semiconductor layer 202 of the second light emitting part LE2 is brought into contact with the first adhesion part AD1, such that the first light emitting part LE1 and the second light emitting part LE2 may be bonded to each other by applying heat. Then, by removing the support substrate SS from the second light emitting part LE2 and removing the removable adhesive RA, the second ohmic layer 208 may be exposed.

In this manner, the first n-type semiconductor layer 102, the first active layer 104, the first p-type semiconductor layer 106, the first ohmic layer 108, the first color filter CF1, the first adhesion part AD1, the second n-type semiconductor layer 202, the second active layer 204, the second p-type semiconductor layer, 206 and the second ohmic layer 208 may be sequentially stacked on the first substrate 100.

Figure 8:
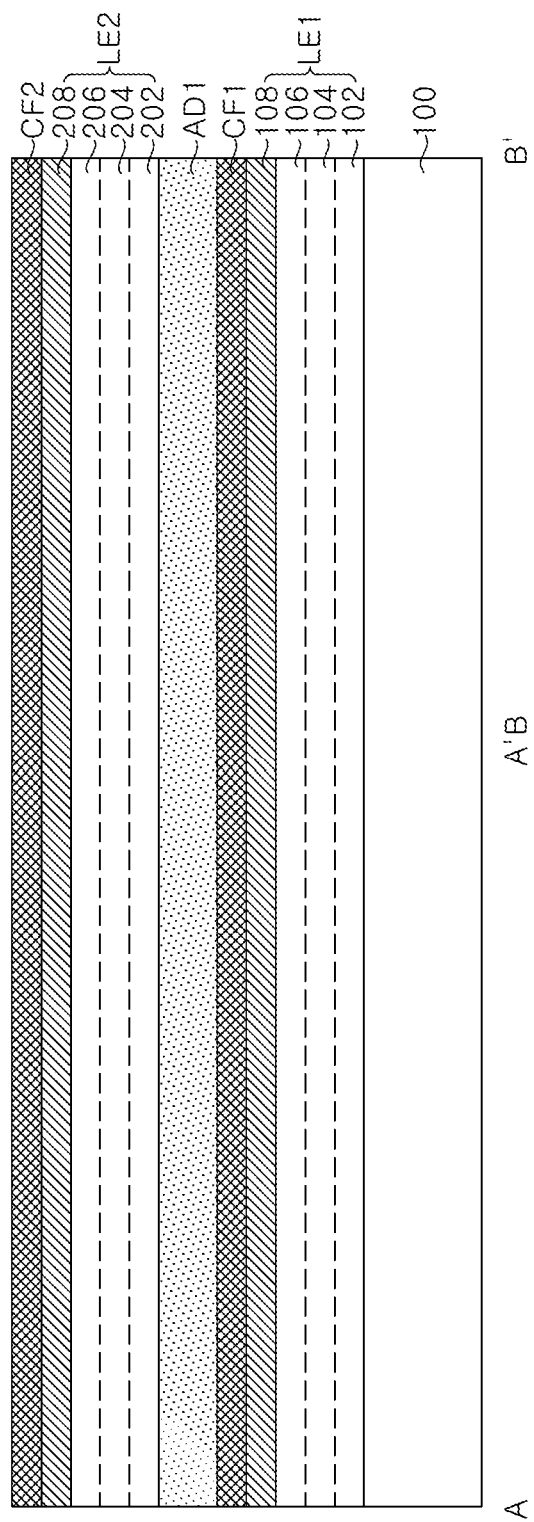

Referring to FIG. 8, a second color filter CF2 may be formed on the exposed second ohmic layer 208. In some exemplary embodiments, the second color filter CF2 may be selectively omitted.

Figure 9:
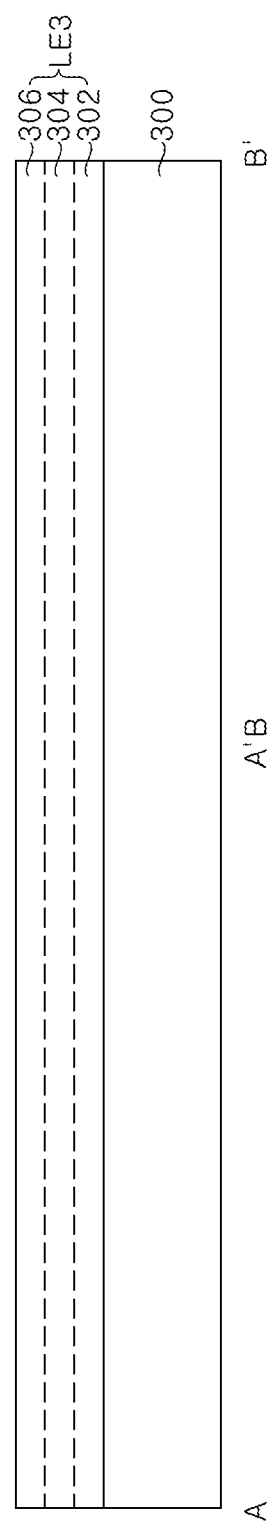

Referring to FIG. 9, a third light emitting part LE3 including a third n-type semiconductor layer 302, a third active layer 304, and a third p-type semiconductor layer 306 may be formed on a third substrate 300. The third substrate 300 may have a substantially quadrangular structure when viewed from the top, and the third light emitting part LE3 may have a substantially quadrangular structure corresponding to the third substrate 300. As such, the outer sidewalls of the third substrate 300 and the outer sidewalls of the third light emitting part LE3 may be coplanar with each other. Meanwhile, the third substrate 300 may have a structure and a size corresponding to the first substrate 100 and the second substrate 200.

Figure 10:
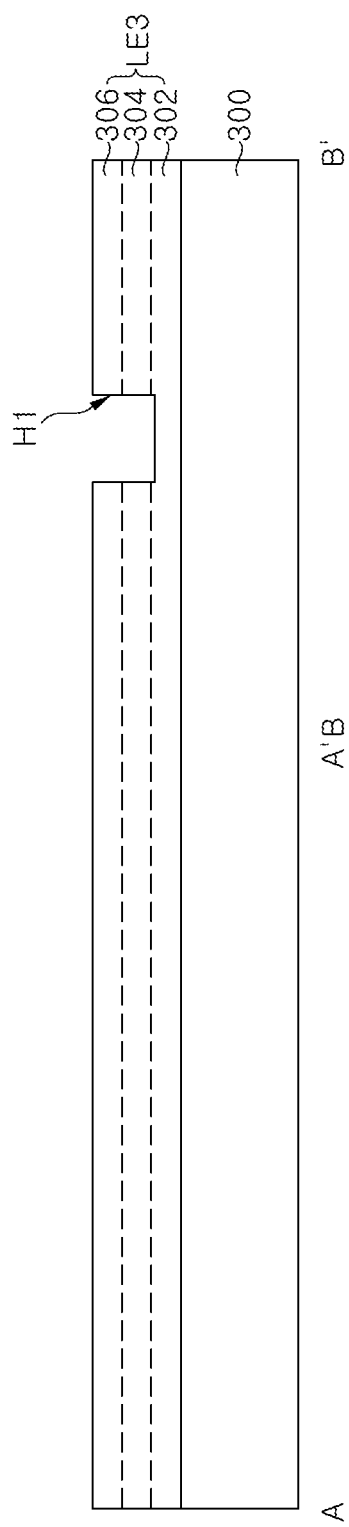

Referring to FIG. 10, by etching the third p-type semiconductor layer 306 and the third active layer 304, a first hole H1 which exposes the third n-type semiconductor layer 302 may be formed. The first hole H1 may be formed at the fourth corner CN4. For example, the first hole H1 may have a depth of about 3 μm to about 3.5 μm.

According to an exemplary embodiment, the first hole H1 may have an upper portion which has a constant width and a lower portion which has a gradually increasing width. The lower portion of the first hole H1 may have a sharp edge, as shown in FIG. 1C.

Figure 11:
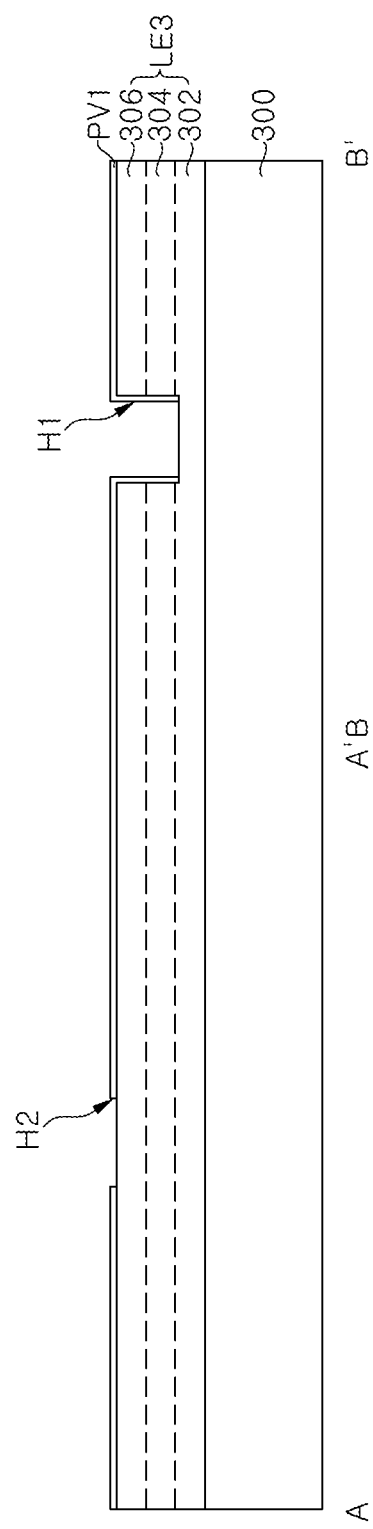

Referring to FIG. 11, a first passivation layer PV1 may be conformally formed on the third n-type semiconductor layer 302 through which the first hole H1 is formed, such that the first hole H1 is not buried. The first passivation layer PV1 may include at least one selected from the group consisting of SiN, TiN, TiO$_2$, Ta$_2$O$_5$, ZrO$_x$, HfO$_x$, and SiO$_2$. For example, the first passivation layer PV1 may include SiN.

By partially etching the first passivation layer PV1 positioned at the third corner CN3, a second hole H2 which exposes the third p-type semiconductor layer 306 may be formed. The depth of the second hole H2 may be smaller than the first hole H1, and may be about 0.3 μm.

While the second hole H2 is formed, the first passivation layer PV1 formed on the bottom surface of the first hole H1 may be etched together, such that the third n-type semiconductor layer 302 may be exposed.

In some exemplary embodiments, the first passivation layer PV1 may be omitted. When the first passivation layer PV1 is omitted, a second conductive pattern CP2 to be subsequently formed may be formed to be separated from the inner sidewall of the first hole H1.

Figure 12:
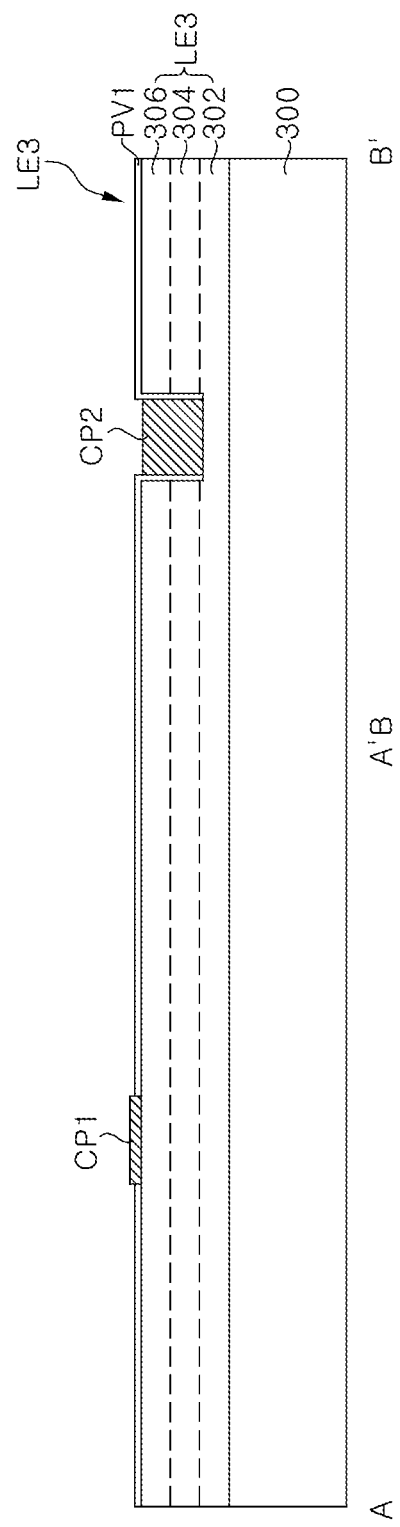

Referring to FIG. 12, a second conductive pattern CP2 may be formed in the first hole H1, and a first conductive pattern CP1 may be formed in the second hole H2.

The first conductive pattern CP1 may include an Au/Be alloy, and the second conductive pattern CP2 may include an Au/Ge alloy. The thickness of the first conductive pattern CP1 may be equal to or greater than the depth of the second hole H2. The thickness of the second conductive pattern CP2 may be equal to or greater than the depth of the first hole H1. For example, the second conductive pattern CP2 may have a thickness of about 3 μm to about 4 μm.

Figure 13:
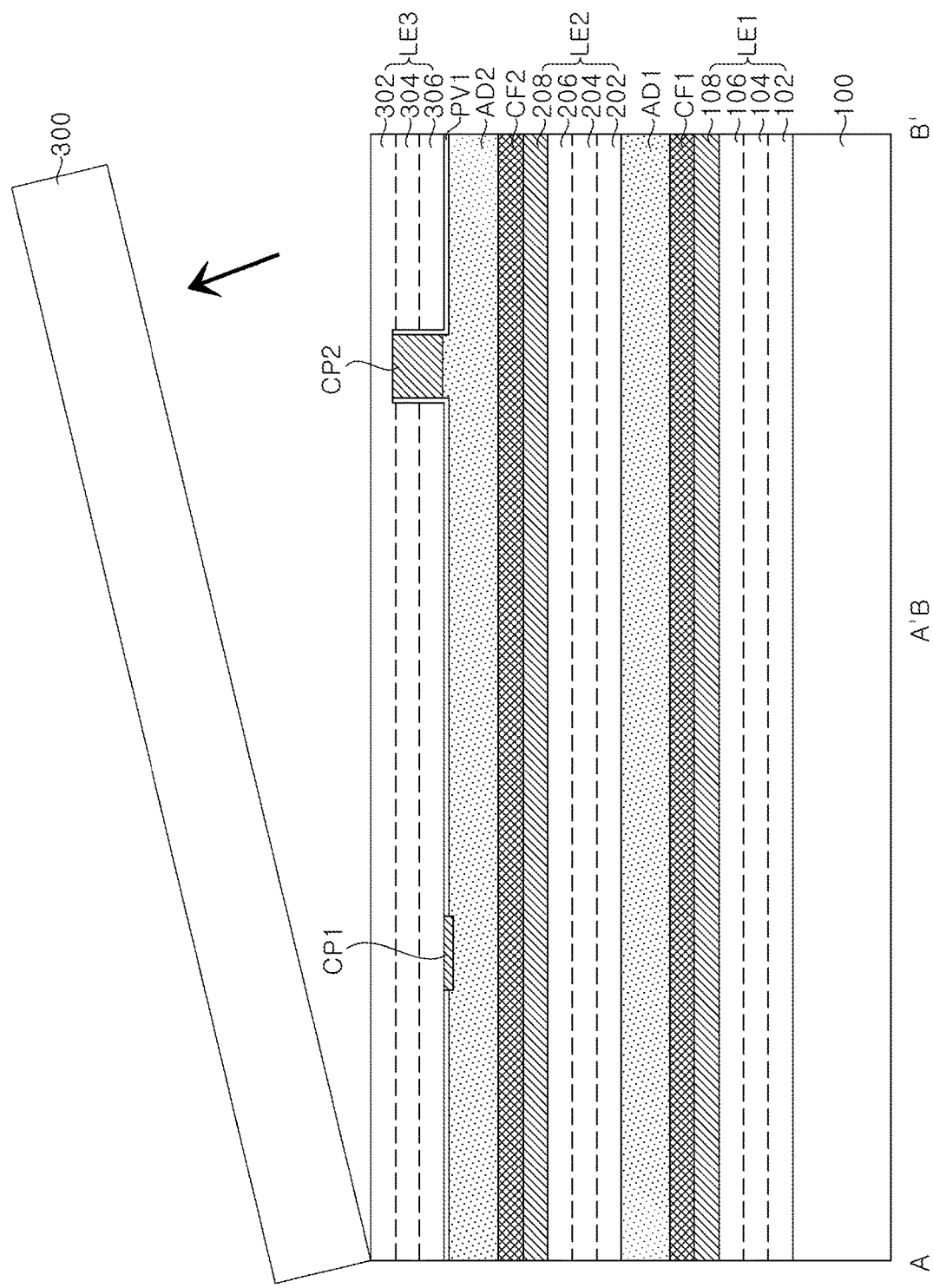

Referring to FIG. 13, the third substrate 300 which is formed with the first conductive pattern CP1, the second conductive pattern CP2, and the third light emitting part LE3 may be turned over, and may be positioned such that the first conductive pattern CP1 and the second conductive pattern CP2 face the second color filter CF2. The second light emitting part LE2 and the third light emitting part LE3 may be bonded to each other by using a second adhesion part AD2.

In this manner, the first n-type semiconductor layer 102, the first active layer 104, the first p-type semiconductor layer 106, the first ohmic layer 108, the first color filter CF1, the first adhesion part AD1, the second n-type semiconductor layer 202, the second active layer 204, the second p-type semiconductor layer 206, the second ohmic layer 208, the second color filter CF2, the second adhesion part AD2, the third p-type semiconductor layer 306, the third active layer 304, and the third n-type semiconductor layer 302 may be sequentially stacked on the first substrate 100. The first conductive pattern CP1 and the second conductive pattern CP2 may be disposed between the second adhesion part AD2 and the third light emitting part LE3.

After bonding the third light emitting part LE3, the third substrate 300 may be removed by a laser lift-off process or the like.

Referring back to FIG. 11, when the first passivation layer PV1 is not formed and the second conductive pattern CP2 is formed to be separated from the inner sidewall of the first hole H1, the second adhesion part AD2 may be formed to fill the space between the first hole H1 and the second conductive pattern CP2.

Figure 14:
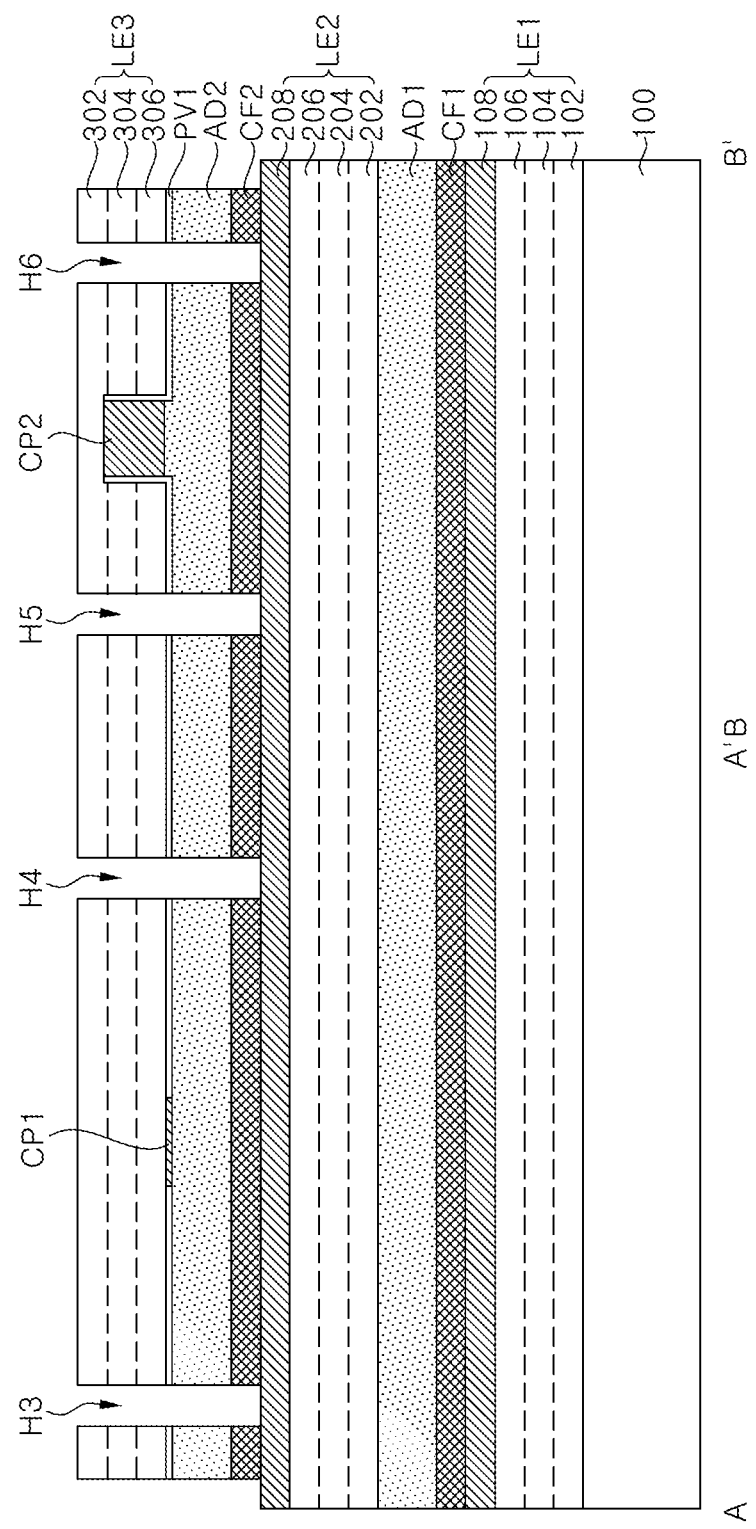

Referring to FIG. 14, by etching the third light emitting part LE3, the second adhesion part AD2, and the second color filter CF2, which are disposed at the second corner CN2, the first corner CN1, and the fourth corner CN4, a third hole H3, a fourth hole H4, a fifth hole H5, and a sixth hole H6 exposing the second ohmic layer 208 may be formed. The third hole H3 may be disposed at the second corner CN2, the fourth hole H4 may be disposed at the first corner CN1, and the fifth hole H5 and the sixth hole H6 may be disposed at the fourth corner CN4.

The third hole H3, the fourth hole H4, the fifth hole H5, and the sixth hole H6 may have substantially the same width.

While forming the third hole H3, the fourth hole H4, the fifth hole H5, and the sixth hole H6, the peripheral portions of the respective third light emitting part LE3, second adhesion part AD2, and second color filter CF2 may be etched to expose portions of the second ohmic layer 208. When viewed from the top, the exposed second ohmic layer 208 may have a structure which surrounds the outer sidewalls of the second color filter CF2.

According to an exemplary embodiment, as the peripheral portions of the respective third light emitting part LE3, second adhesion part AD2, and second color filter CF2 are etched, a stress induced between the first substrate 100 and the first p-type semiconductor layer 106 of the first light emitting part LE1 may be mitigated.

Figure 15:
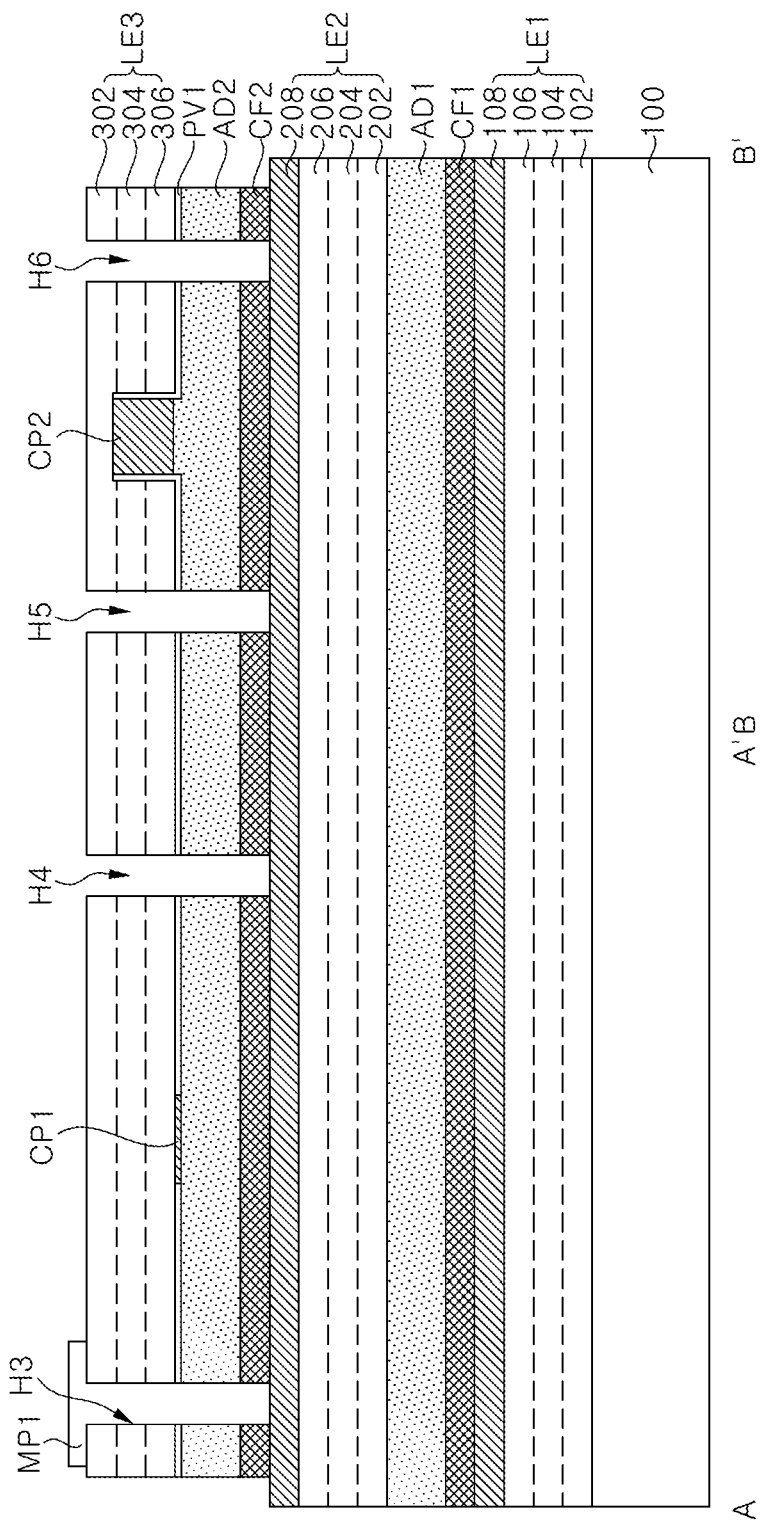

Referring to FIG. 15, a first masking pattern MP1 may be formed in the third hole H3. The first masking pattern MP1 may include a material which has an etching selectivity with respect to an etchant to be used in a subsequent etching process so as not to be substantially etched. For example, the first masking pattern MP1 may include a photoresist.

Figure 16:
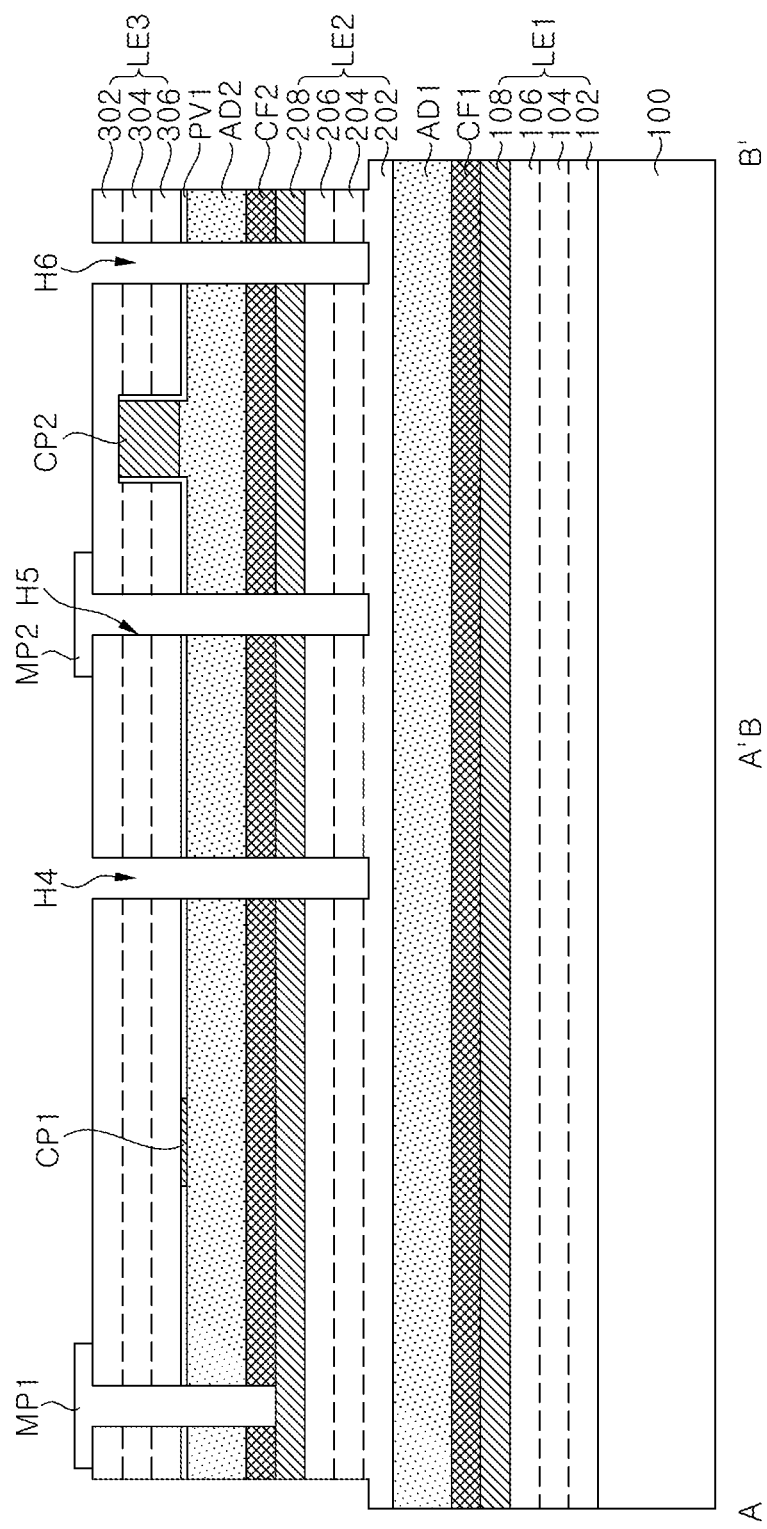

Referring to FIG. 16, by etching the second ohmic layer 208, the second p-type semiconductor layer 206, and the second active layer 204, which are disposed on the bottom surfaces of the fourth hole H4, the fifth hole H5 and the sixth hole H6, the second n-type semiconductor layer 202 may be partially exposed. Through the etching process, each of the fourth hole H4, the fifth hole H5, and the sixth hole H6 may have a structure extending downward.

While downwardly extending the fourth hole H4, the fifth hole H5, and the sixth hole H6, the peripheral portions of the respective second ohmic layer 208, second p-type semiconductor layer 206, and second active layer 204 may be etched to expose portions of the second n-type semiconductor layer 202. When viewed from the top, the exposed second n-type semiconductor layer 202 may have a structure which surrounds the outer sidewalls of the second active layer 204.

According to an exemplary embodiment, as the peripheral portions of the respective second ohmic layer 208, second p-type semiconductor layer 206, and second active layer 204 are etched, a stress induced between the first substrate 100 and the first p-type semiconductor layer 106 of the first light emitting part LE1 may be mitigated.

Then, a second masking pattern MP2 may be formed in the fifth hole H5. The second masking pattern MP2 may include a material which has an etching selectivity with respect to an etchant to be used in a subsequent etching process so as not to be substantially etched, such as a photoresist.

Figure 17:
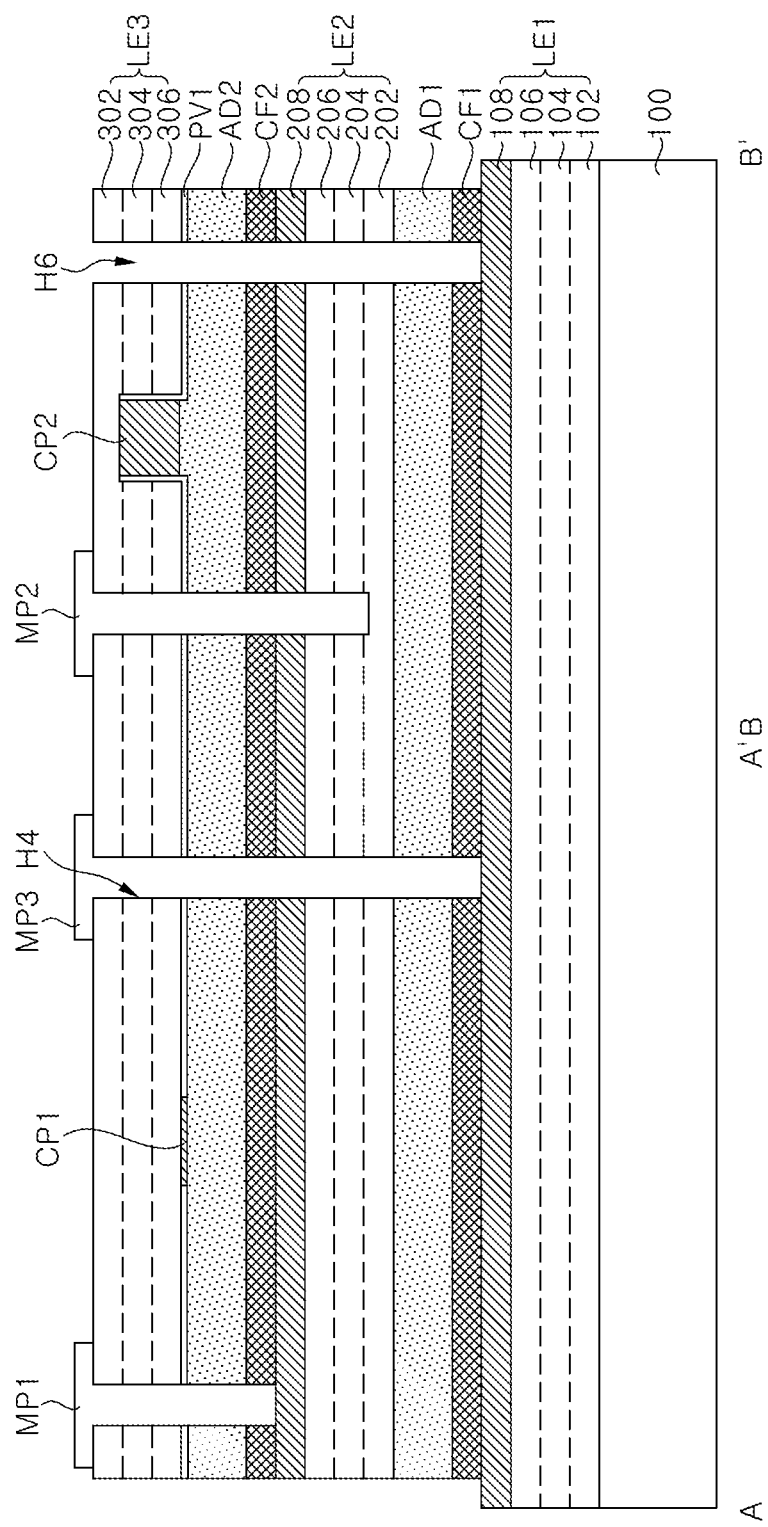

Referring to FIG. 17, by etching the second n-type semiconductor layer 202, the first adhesion part AD1 and the first color filter CF1 disposed on the bottom surfaces of the fourth hole H4 and the sixth hole H6, the first ohmic layer 108 may be partially exposed. Through the etching process, each of the fourth hole H4 and the sixth hole H6 may have a structure extending downward.

While downwardly extending the fourth hole H4 and the sixth hole H6, the peripheral portions of the respective second n-type semiconductor layer 202, first adhesion part AD1, and first color filter CF1 may be etched to expose portions of the first ohmic layer 108. When viewed from the top, the exposed first ohmic layer 108 may have a structure which surrounds the outer sidewalls of the first color filter CF1.

According to an exemplary embodiment, as the peripheral portions of the respective second n-type semiconductor layer 202, first adhesion part AD1, and first color filter CF1 are etched, a stress induced between the first substrate 100 and the first p-type semiconductor layer 106 of the first light emitting part LE1 may be mitigated.

Then, a third masking pattern MP3 may be formed in the fourth hole H4. The third masking pattern MP3 may include a material which has an etching selectivity with respect to an etchant to be used in a subsequent etching process so as not to be not substantially etched, such as a photoresist.

Figure 18:
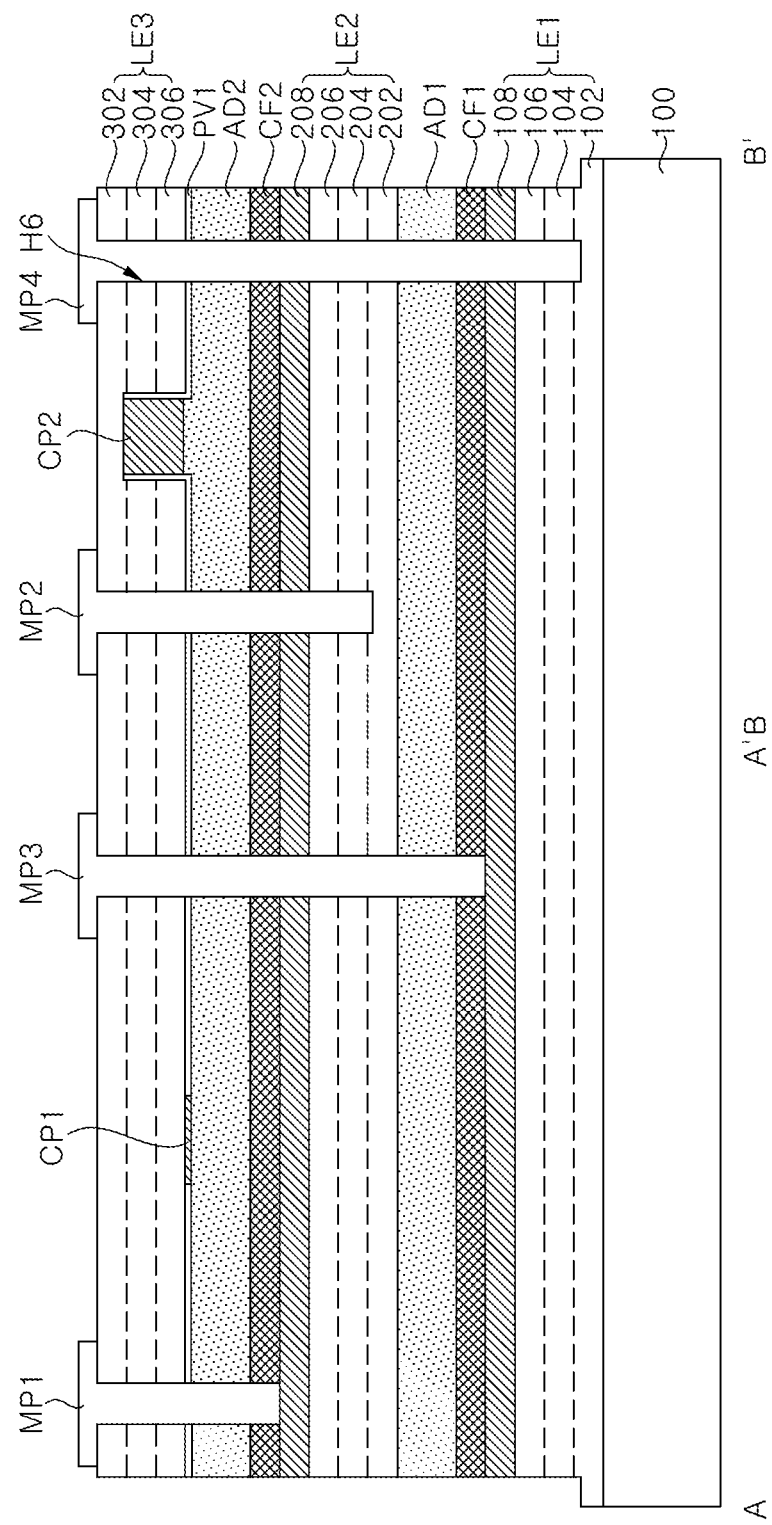

Referring to FIG. 18, by etching the first ohmic layer 108, the first p-type semiconductor layer 106, and the first active layer 104 disposed on the bottom surface of the sixth hole H6, the first n-type semiconductor layer 102 may be partially exposed. Through the etching process, the sixth hole H6 may have a structure extending downward.

While downwardly extending the sixth hole H6, the peripheral portions of the first ohmic layer 108, the first p-type semiconductor layer 106, and the first active layer 104 may be etched to expose portions of the first n-type semiconductor layer 102. When viewed from the top, the exposed first n-type semiconductor layer 102 may have a structure which surrounds the outer sidewalls of the first active layer 104.

According to an exemplary embodiment, as the peripheral portions of the respective first ohmic layer 108, first p-type semiconductor layer 106, and first active layer 104 are etched, a stress induced between the first substrate 100 and the first p-type semiconductor layer 106 of the first light emitting part LE1 may be mitigated.

Then, a fourth masking pattern MP4 may be formed in the sixth hole H6. The fourth masking pattern MP4 may include a material which has an etching selectivity with respect to an etchant to be used in a subsequent etching process so as not to be substantially etched, such as a photoresist.

Figure 19:
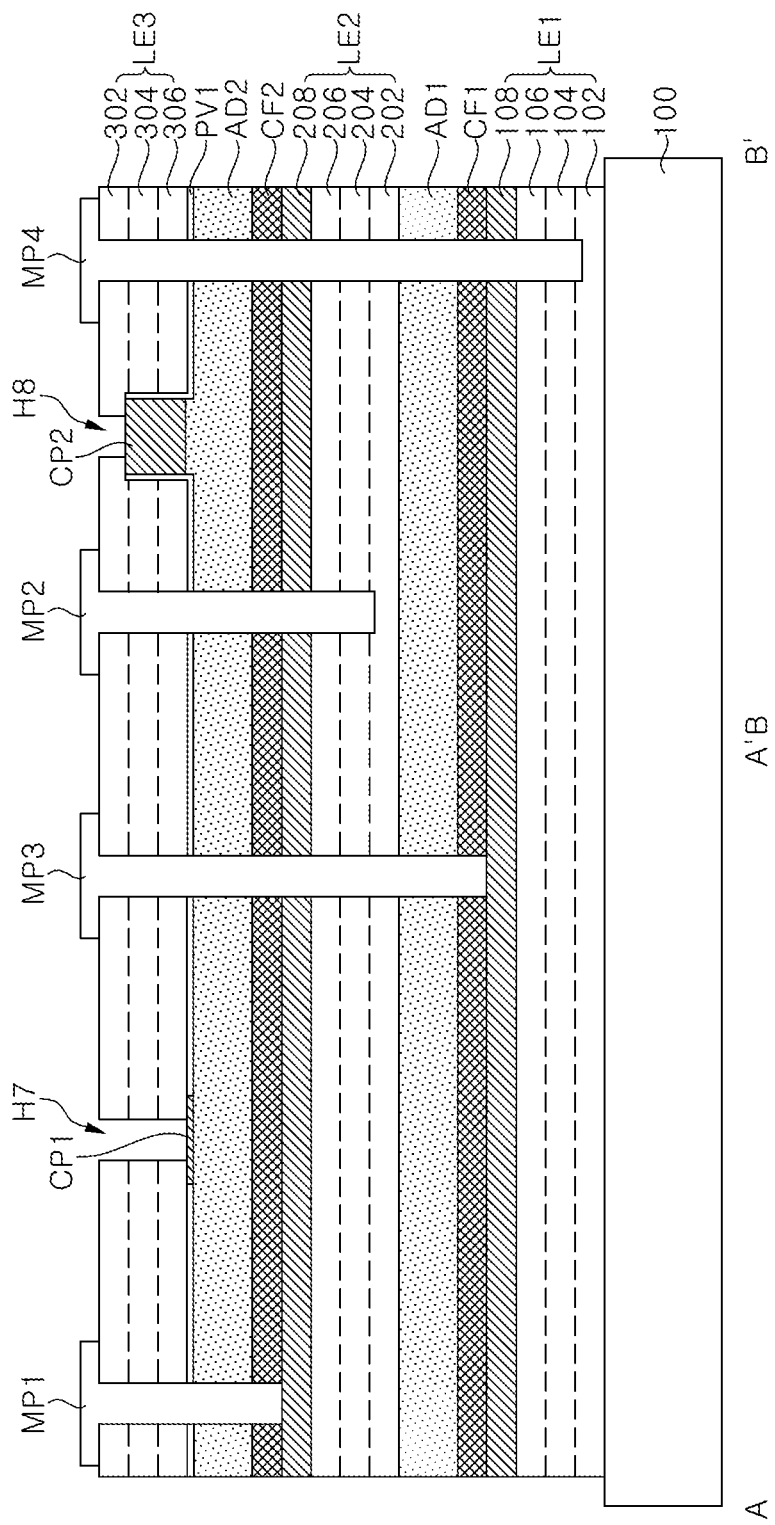

Referring to FIG. 19, a seventh hole H7 and an eighth hole H8 may be formed at the third corner CN3 and the fourth corner CN4, respectively, such that the first conductive pattern CP1 and the second conductive pattern CP2 are exposed. In the seventh hole H7, as the third n-type semiconductor layer 302, the third active layer 304, and the third p-type semiconductor layer 306 are etched, the first conductive pattern CP1 may be exposed. In the eighth hole H8, as the third n-type semiconductor layer 302 is etched, the second conductive pattern CP2 may be exposed.

During or after the etching process for forming the seventh hole H7 and the eight hole H8, a process of etching the first n-type semiconductor layer 102 on the first substrate 100 may be conducted to individualize a plurality of light emitting devices. By individually separating the light emitting devices in the process of FIG. 19, a stress due to a bowing phenomenon between the first substrate 100 and the first light emitting part LE1, in particular, the first p-type semiconductor layer 106, may be mitigated.

After forming the seventh hole H7 and the eighth hole H8, and individually separating the light emitting devices, the first masking pattern MP1, the second masking pattern MP2, the third masking pattern MP3, and the fourth masking pattern MP4 may be removed.

Figure 20:
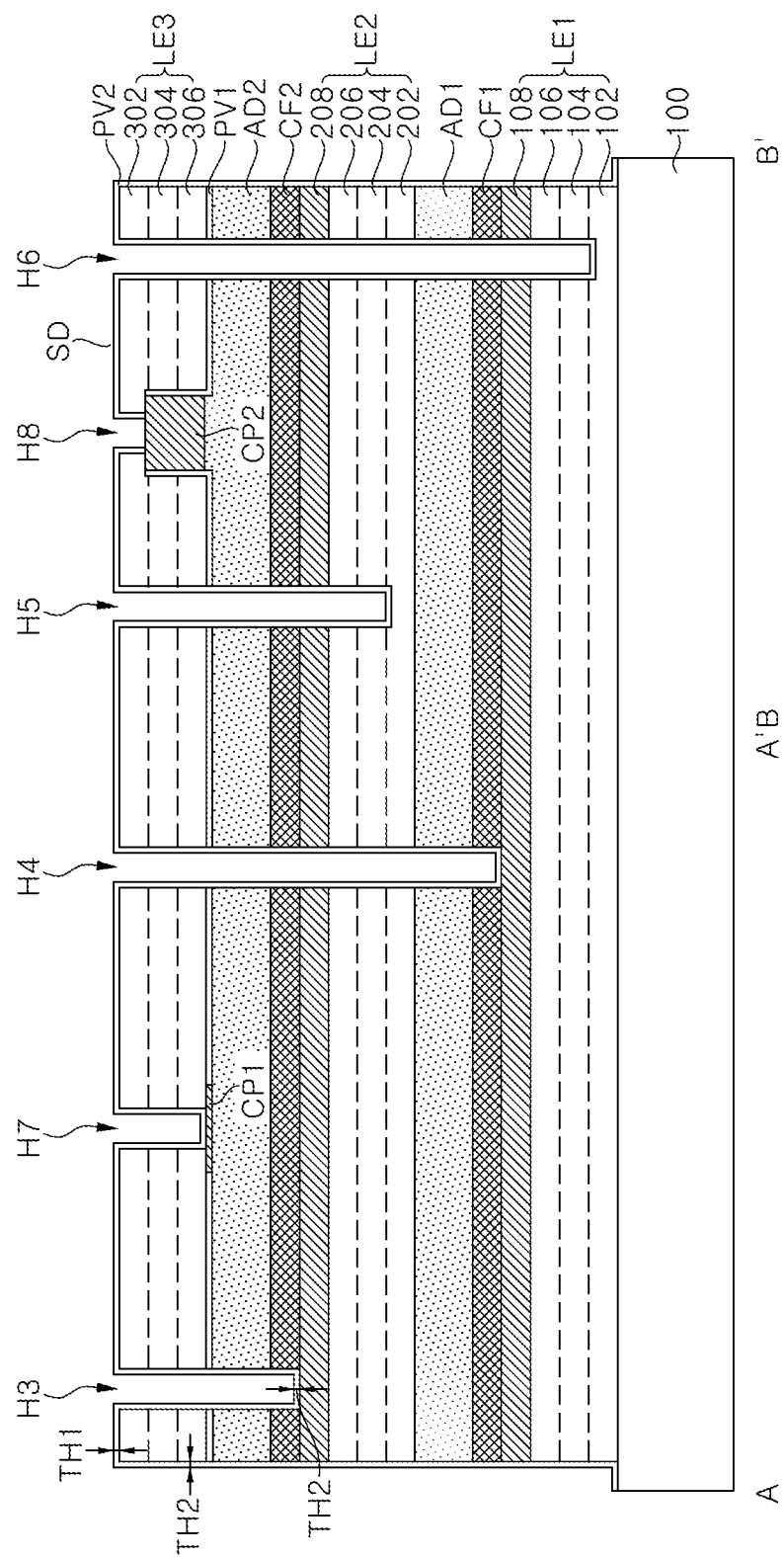

Referring to FIG. 20, a second passivation layer PV2 may be conformally formed on the third n-type semiconductor layer 302, such that the third hole H3, the fourth hole H4, the fifth hole H5, the sixth hole H6, the seventh hole H7, and the eighth hole H8 are not filled. The second passivation layer PV2 may cover the outer sidewalls of the light emitting device, of which peripheral portions are etched.

According to an exemplary embodiment, in the second passivation layer PV2, a thickness TH1 of the second passivation layer PV2 formed on the third n-type semiconductor layer 302 may be greater than a thickness TH2 of the second passivation layer PV2 formed on the bottom surfaces and sidewalls of the respective third hole H3, fourth hole H4, fifth hole H5, sixth hole H6, seventh hole H7, and eighth hole H8. For example, the thickness TH1 of the second passivation layer PV2 formed on the third n-type semiconductor layer 302 may be about two to four times greater than the thickness TH2 of the second passivation layer PV2 formed on the bottom surfaces and sidewalls of the respective third hole H3, fourth hole H4, fifth hole H5, sixth hole H6, seventh hole H7, and eighth hole H8.

According to an exemplary embodiment, the second passivation layer PV2 may include a material, which is excellent in light transmittance and has an insulation property, such as $SiO_2$.

Figure 21:
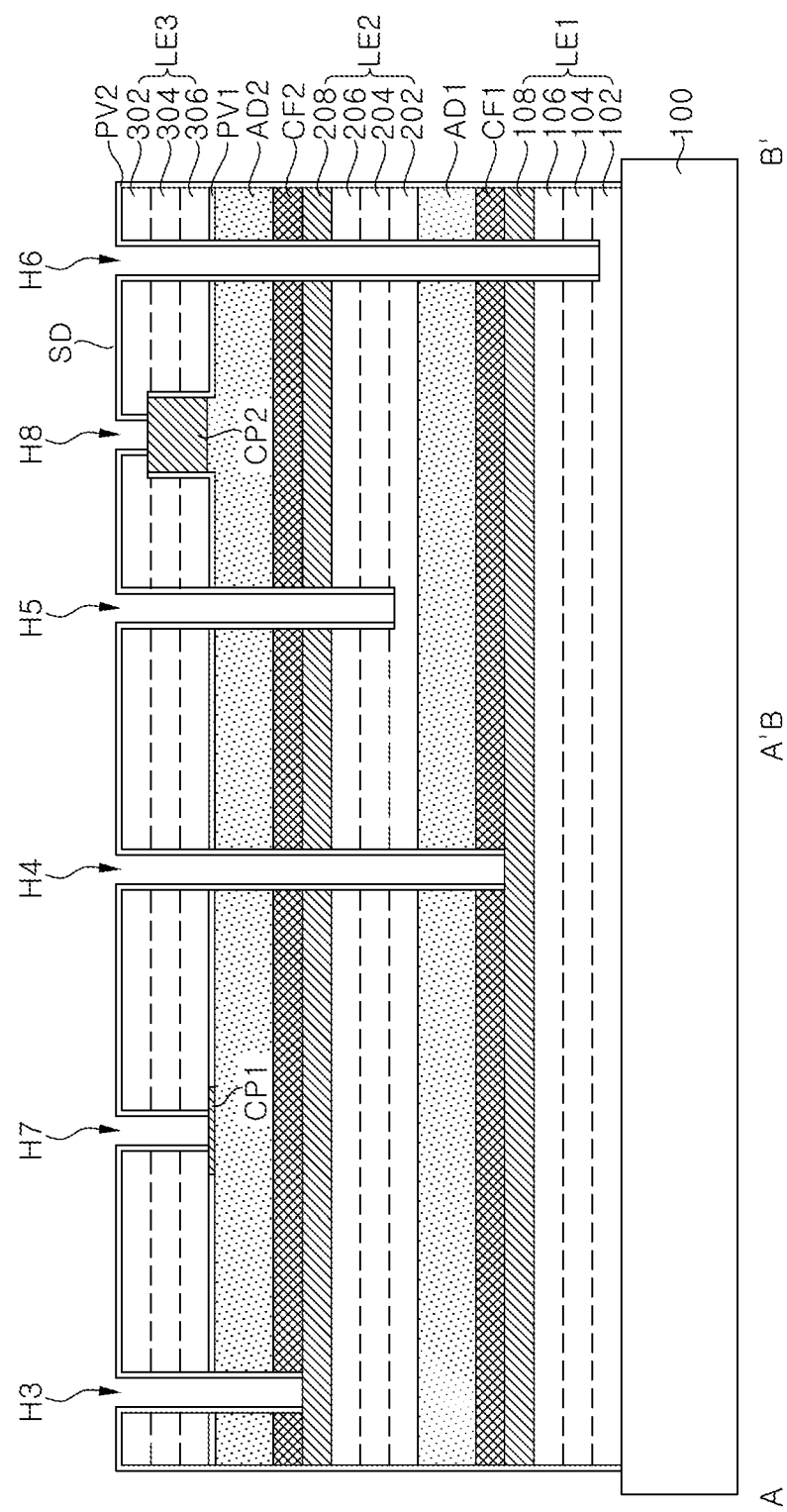

Referring to FIG. 21, by etching the second passivation layer PV2 in a direction perpendicular to the surface of the third n-type semiconductor layer 302, the second passivation layer PV2 formed on the bottom surfaces of the respective third hole H3, fourth hole H4, fifth hole H5, sixth hole H6, seventh hole H7, and eighth hole H8 may be selectively removed.

Because the thickness TH1 of the second passivation layer PV2 formed on the third n-type semiconductor layer 302 is greater than the thickness TH2 of the second passivation layer PV2 formed on the bottom surfaces and sidewalls of the respective third hole H3, fourth hole H4, fifth hole H5, sixth hole H6, seventh hole H7, and eighth hole H8, even if the second passivation layer PV2 formed on the bottom surfaces of the respective third hole H3, fourth hole H4, fifth hole H5, sixth hole H6, seventh hole H7 and eighth hole H8 is etched, the second passivation layer PV2 formed on the third n-type semiconductor layer 302 may be remained. Moreover, by vertically etching the second passivation layer PV2, the second passivation layer PV2 formed on the sidewalls of the respective third hole H3, fourth hole H4, fifth hole H5, sixth hole H6, seventh hole H7 and eighth hole H8 may not be etched and may be remained.

According to an exemplary embodiment, after the etching process, the thickness of the second passivation layer PV2 remaining on the third n-type semiconductor layer 302 may be greater than or equal to the thickness of the second passivation layer PV2 remained in the respective third hole H3, fourth hole H4, fifth hole H5, sixth hole H6, seventh hole H7, and eighth hole H8.

When separating a completed light emitting device from the first substrate 100 in a subsequent process, the first substrate 100 may be bent (or bow). However, because the thickness of the second passivation layer PV2 remaining on the third n-type semiconductor layer 302 is greater than or equal to the thickness of the second passivation layer PV2 remaining in the respective third hole H3, fourth hole H4, fifth hole H5, sixth hole H6, seventh hole H7, and eighth hole H8, the second passivation layer PV2 disposed on the surface of the third n-type semiconductor layer 302 according to an exemplary embodiment may prevent a first pad PD1 (see FIG. 26), a second pad PD2 (see FIG. 26), a third pad PD3 (see FIG. 26), and a common pad CPD (see FIG. 26) from being delaminated from the light emitting device.

According to an exemplary embodiment, the second ohmic layer 208 may be exposed at the bottom surface of the third hole H3, the first ohmic layer 108 may be exposed at the bottom surface of the fourth hole H4, the second n-type semiconductor layer 202 may be exposed at the bottom surface of the fifth hole H5, the first n-type semiconductor layer 102 may be exposed at the bottom surface of the sixth hole H6, the first conductive pattern CP1 may be exposed at the bottom surface of the seventh hole H7, and the second conductive pattern CP2 may be exposed at the bottom surface of the eighth hole H8.

Figure 22:
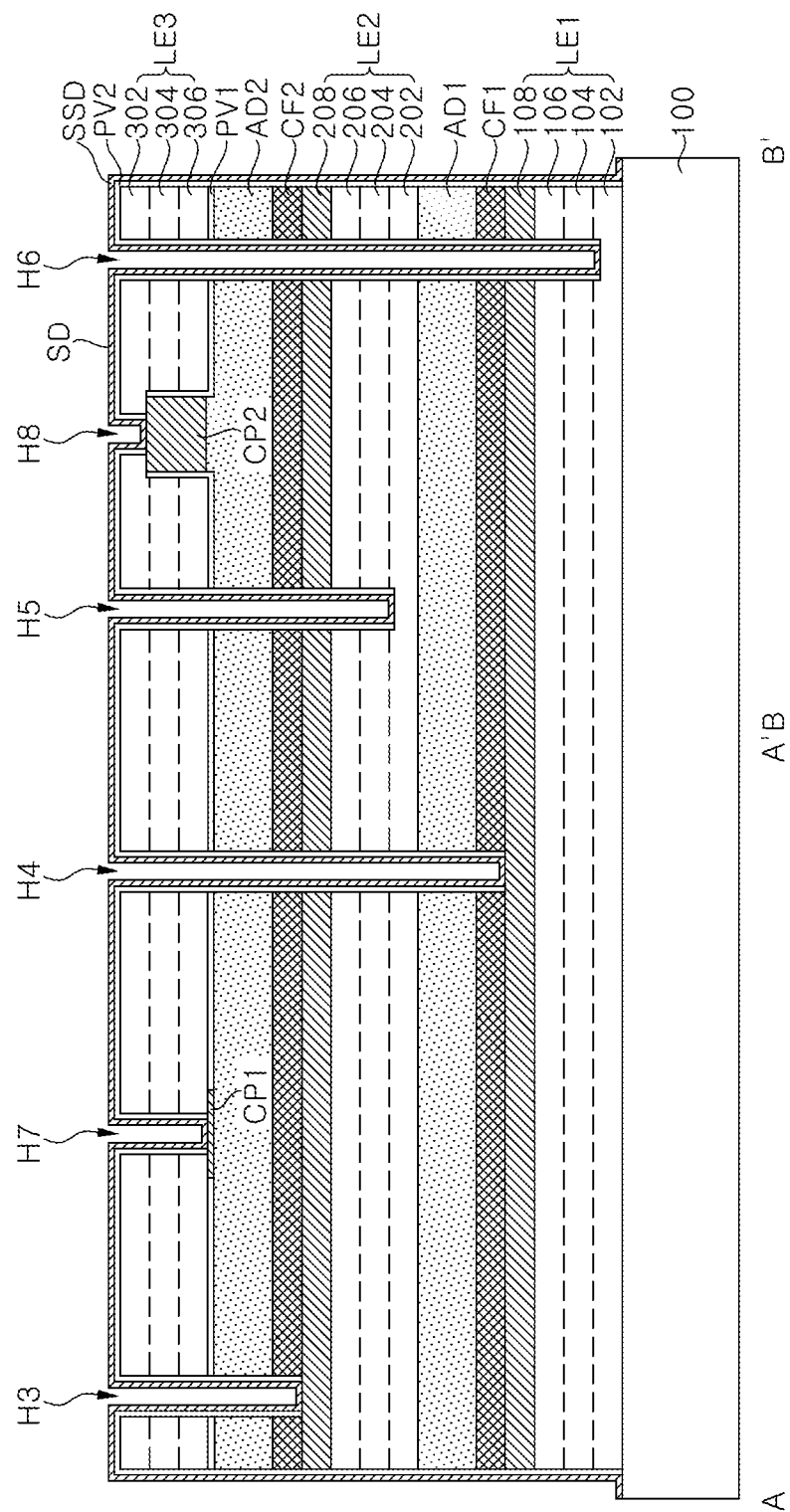

Referring to FIG. 22, a seed layer SD may be conformally formed on the third n-type semiconductor layer 302, which is formed with the third hole H3, the fourth hole H4, the fifth hole H5, the sixth hole H6, the seventh hole H7, and the eighth hole H8, so as not to fill the third hole H3, the fourth hole H4, the fifth hole H5, the sixth hole H6, the seventh hole H7, and the eighth hole H8 formed with the second passivation layer PV2. The seed layer SD may include metal, such as copper. For example, the seed layer SD may be formed to a thickness of about 20 nm to about 30 nm.

The seed layer SD may be formed while surrounding the outer sidewalls of the light emitting device formed with the second passivation layer PV2. Hereinafter, the seed layer SD formed on the outer sidewalls of the light emitting device may be referred to as an outer seed layer SSD.

Figure 23:
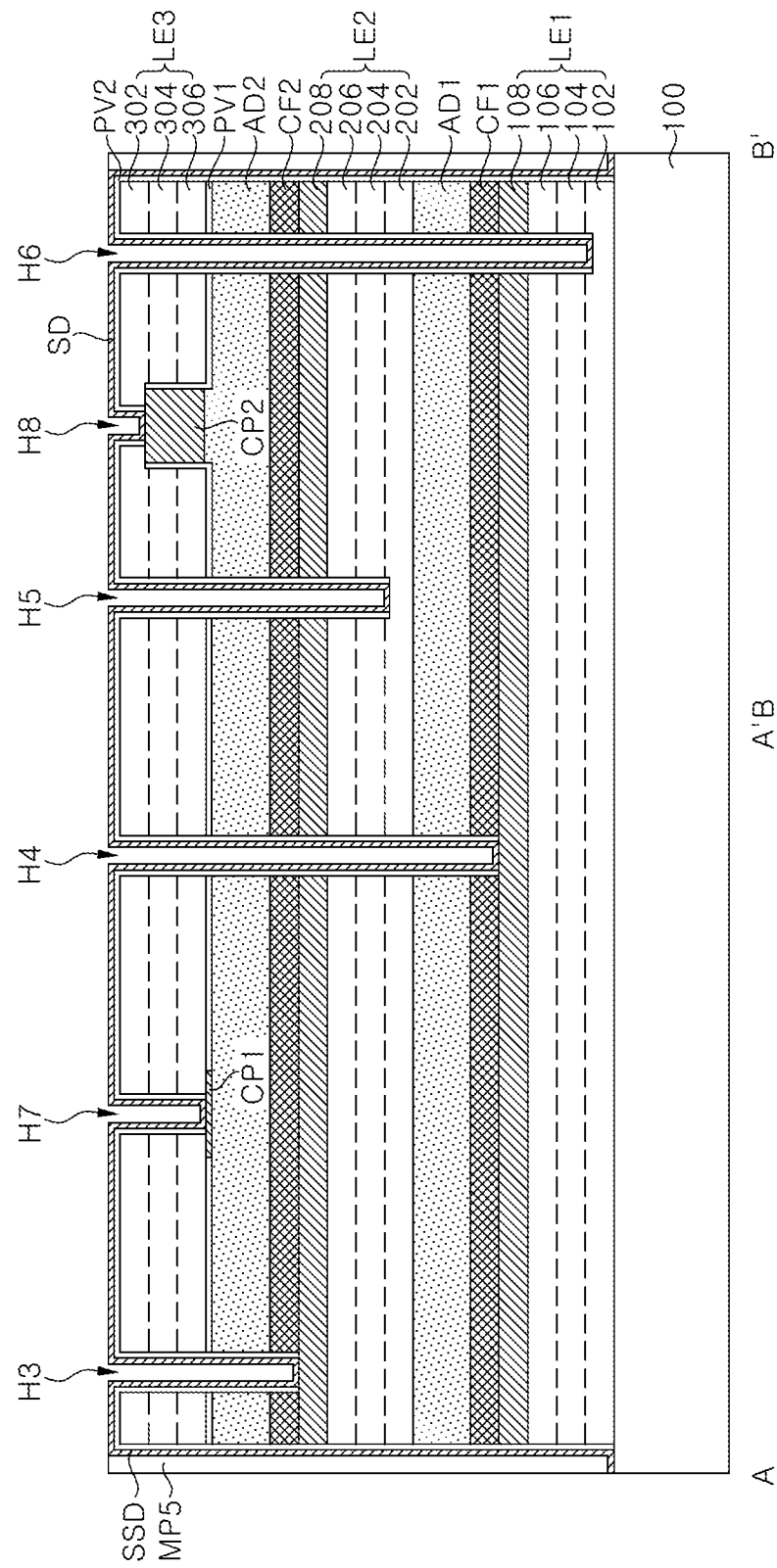

Referring to FIG. 23, a fifth masking pattern MP5 may be formed on the outer sidewalls of the light emitting device formed with the outer seed layer SSD. The fifth masking pattern MP5 may include a photoresist, which is low in light transmittance and has an insulation property.

Figure 24:
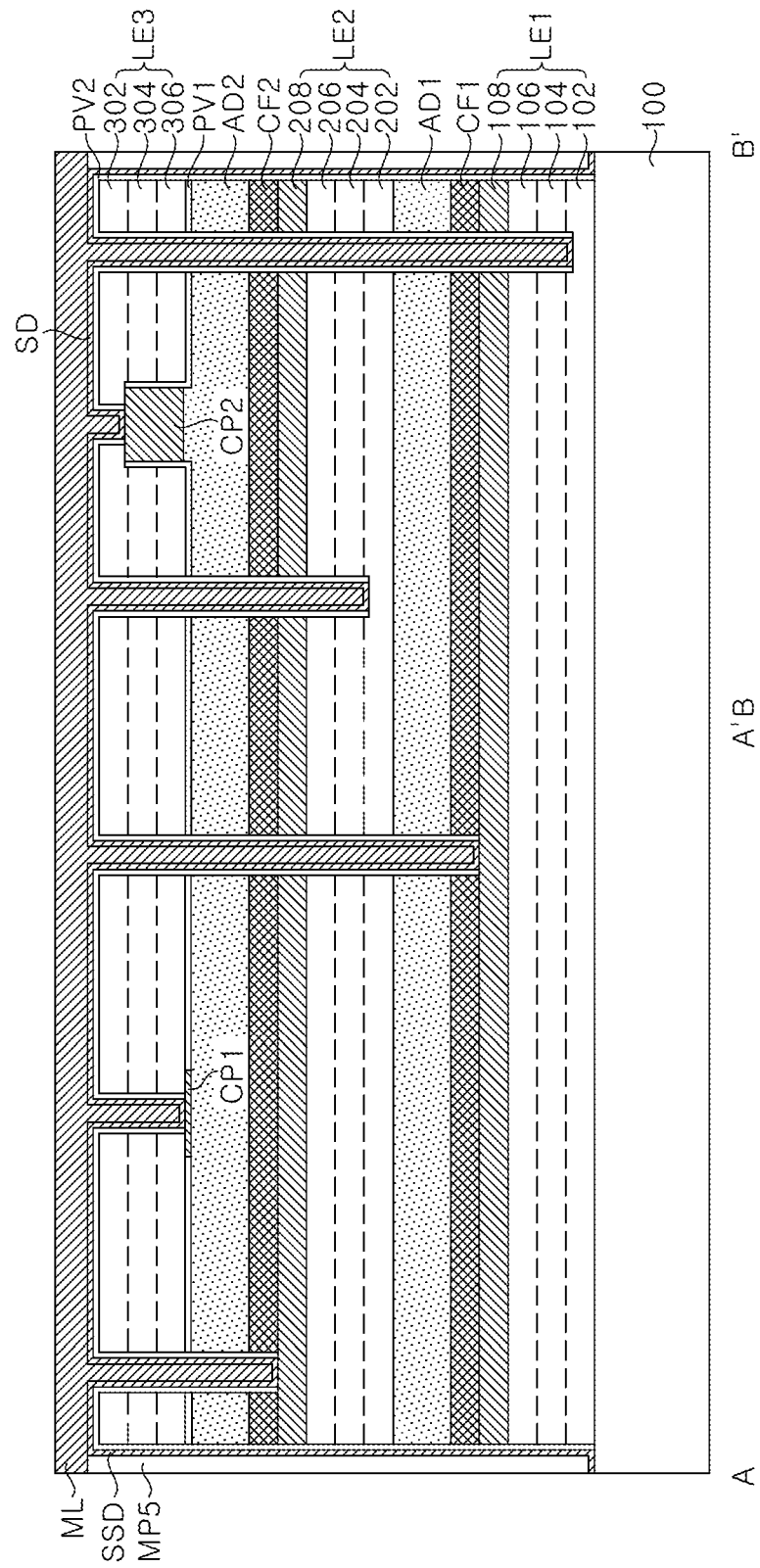

Referring to FIG. 24, by using the seed layer SD, a plating layer ML may be formed to fill the respective third hole H3, fourth hole H4, fifth hole H5, sixth hole H6, seventh hole H7, and eighth hole H8. The plating layer ML may be formed by using electrolytic plating or the like. The plating layer ML may include metal, such as copper.

While the plating layer ML is formed, the plating layer ML may not be formed on the outer sidewalls of the light emitting device due to the presence of the fifth masking pattern MP5 formed on the outer sidewalls of the light emitting device. As such, it is possible to prevent the light emitting device from being electrically coupled with an adjacent light emitting devices or an outside.

According to an exemplary embodiment, while the stress between the first substrate 100 and the light emitting device has been mitigated as the light emitting devices on the first substrate 100 are individually separated from one another, a stress may still be remaining between the light emitting devices on the first substrate 100, which may cause a crack in the light emitting device. As such, the fifth making pattern MP5 according to an exemplary embodiment may mitigate the remaining stress.

Figure 25:
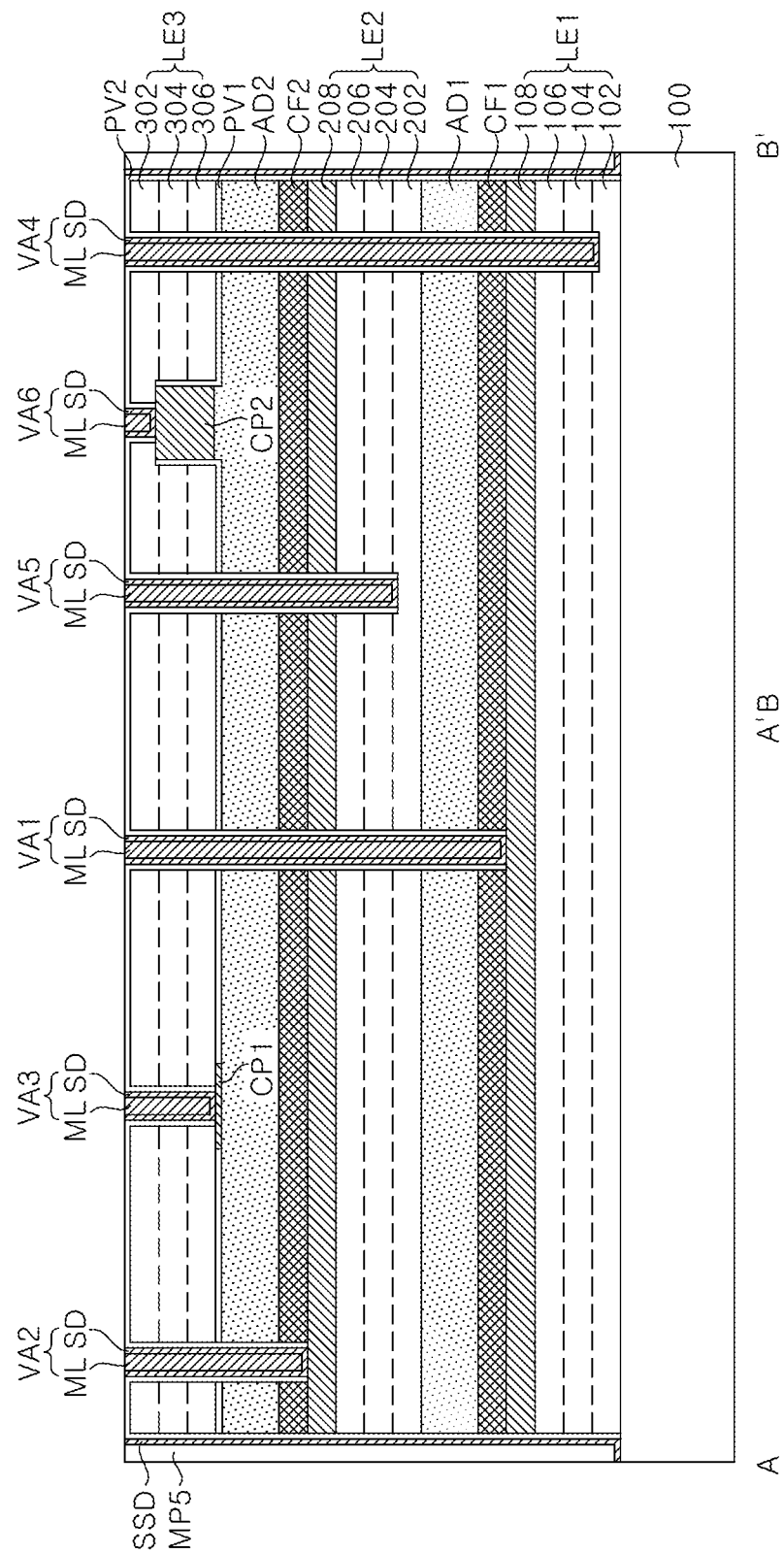

Referring to FIG. 25, the plating layer ML and the seed layer SD may be etched, such that the top surface of the second passivation layer PV2 formed on the third n-type semiconductor layer 302 is exposed. The second passivation layer PV2 may function as an etch stop layer during the process of etching the plating layer ML and the seed layer SD. As the etching process for the plating layer ML and the seed layer SD, a chemical mechanical polishing (CMP) process may be used, without being limited thereto.

In this manner, a first via structure VA1 filling the fourth hole H4, a third via structure VA3 filling the seventh hole H7, a second via structure VA2 filling the third hole H3, a fifth via structure VA5 filling the fifth hole H5, a sixth via structure VA6 filling the eighth hole H8, and a fourth via structure VA4 filling the sixth hole H6 may be respectively formed.

The first via structure VA1 may be formed at the first corner CN1, the second via structure VA2 may be formed at the second corner CN2, and the third via structure VA3 may be formed at the third corner CN3. The fourth via structure VA4, the fifth via structure VA5, and the sixth via structure VA6 may be formed at the fourth corner CN4.

Figure 26:
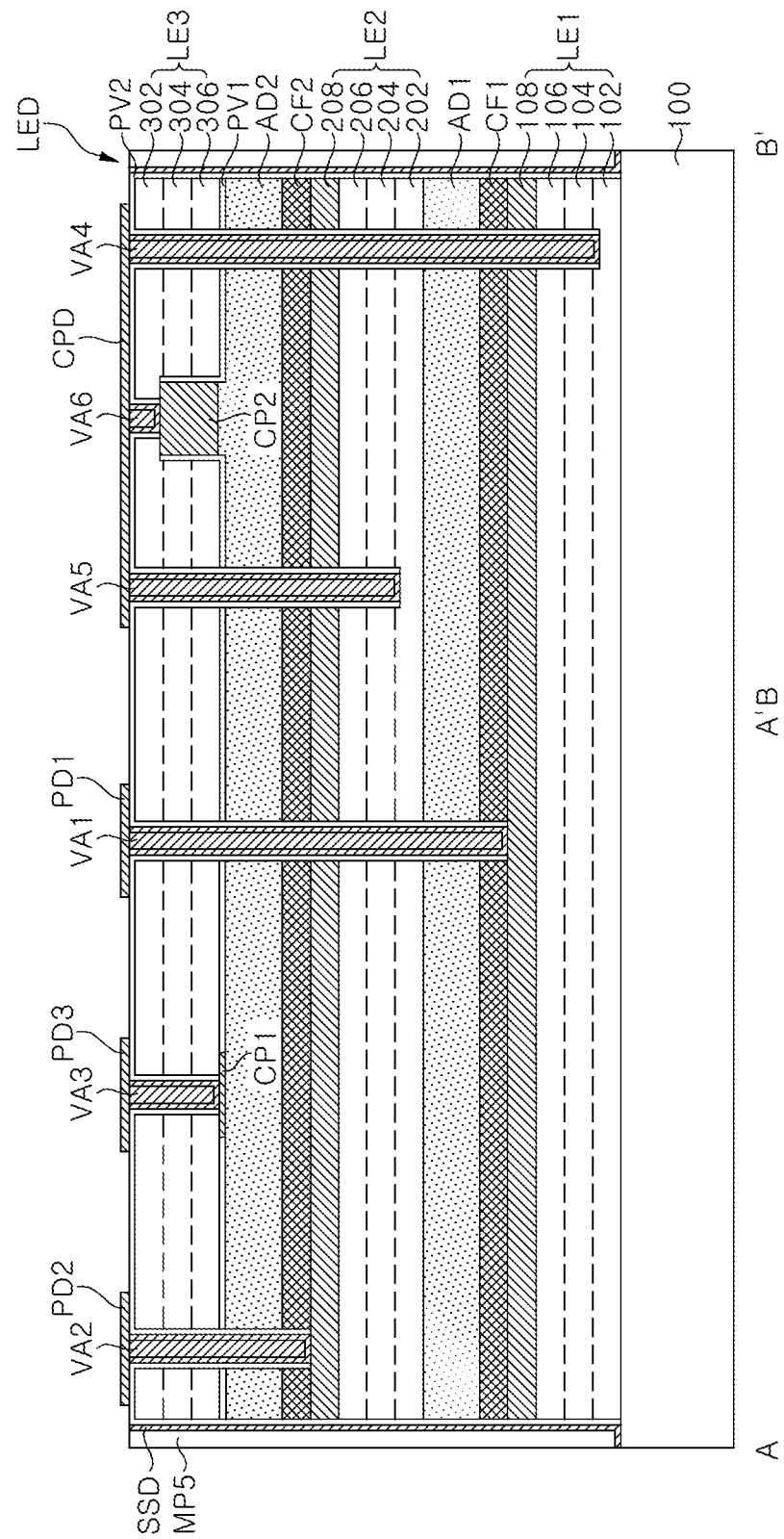

Referring to FIG. 26, on the second passivation layer PV2, the first pad PD1 electrically contacting the first via structure VA1, the second pad PD2 electrically contacting the second via structure VA2, the third pad PD3 electrically contacting the third via structure VA3, and the common pad CPD electrically contacting in common with the fourth via structure VA4, the fifth via structure VA5, and the sixth via structure VA6 may be formed.

A positive voltage may be applied to each of the first pad PD1, the second pad PD2, and the third pad PD3, and a negative voltage may be applied to the common pad CPD.

Figure 27:
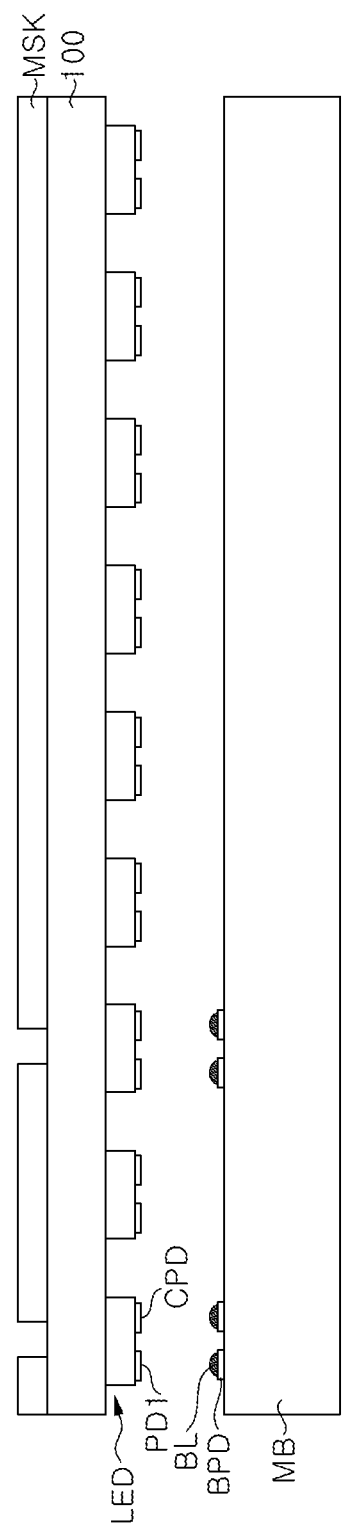

Referring to FIG. 27, a plurality of light emitting devices LED formed through FIGS. 3 to 26 may be mounted to a target mounting board MB.

Bonding pads BPD that are to be electrically bonded with the first pad PD1, the second pad PD2, the third pad PD3, and the common pad CPD, respectively, may be formed on the mounting board MB. Adhesion balls BL may be respectively formed on the bonding pads BPD. Each of the adhesion balls BL may include In, Sn, AuSn, InAu, or others.

The bonding pads BPD and the adhesion balls BL may be formed to correspond to positions where the light emitting devices LED are to be mounted.

The first substrate 100 formed with the plurality of light emitting devices LED may be turned over, and thus, the light emitting devices LED may be positioned to face the mounting board MB formed with the bonding pads BPD.

A mask pattern MSK, which exposes light emitting devices LED to be separated from the first substrate 100, may be formed on the turned-over first substrate 100.

Figure 28:
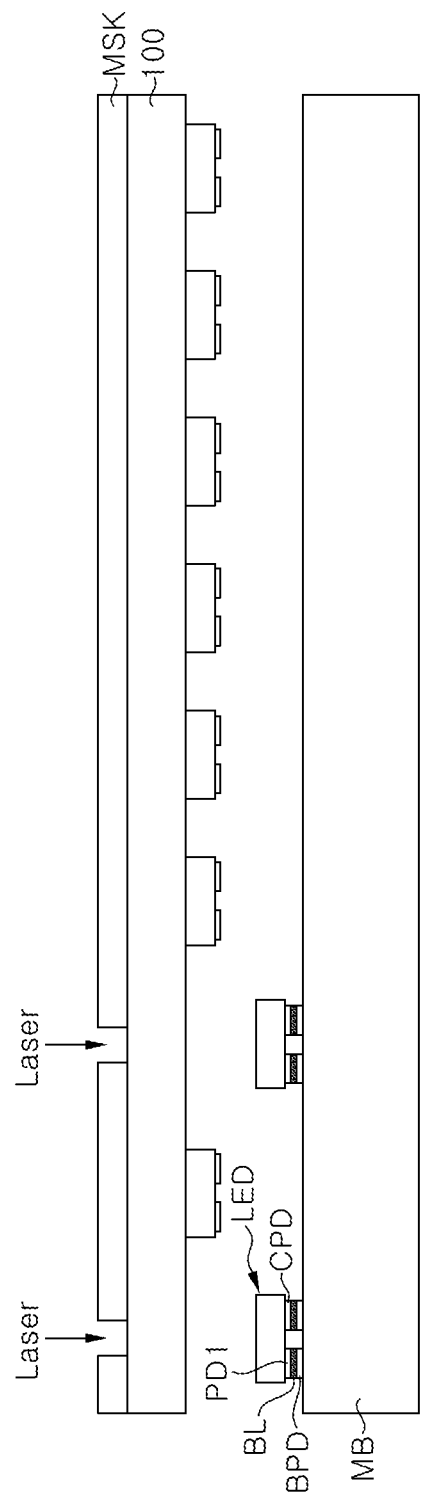

Referring to FIG. 28, by performing a selective laser lift-off (LLO) process for the first substrate 100 through using the mask pattern MSK, the light emitting devices LED disposed to face target mounting positions of the mounting board MB may be separated from the first substrate 100. A separation distance between the separated light emitting devices LED may be changed depending on the mounting board MB.

The first pad PD1, the second pad PD2, the third pad PD3, and the common pad CPD of each of the separated light emitting devices LED may be respectively bonded with the adhesion balls BL formed on the bonding pads BPD. In this manner, the light emitting devices LED may be mounted to the mounting board MB.

When each of the light emitting devices LED are mounted at target positions, the first substrate 100 may be separated from the light emitting devices LED without a separate process of removing the first substrate 100.

Hereafter, a method for manufacturing the light emitting device of FIGS. 2A and 2B will be described.

FIGS. 29 to 46 are cross-sectional views illustrating a method for manufacturing a light emitting device according to another exemplary embodiment.

Figure 29:
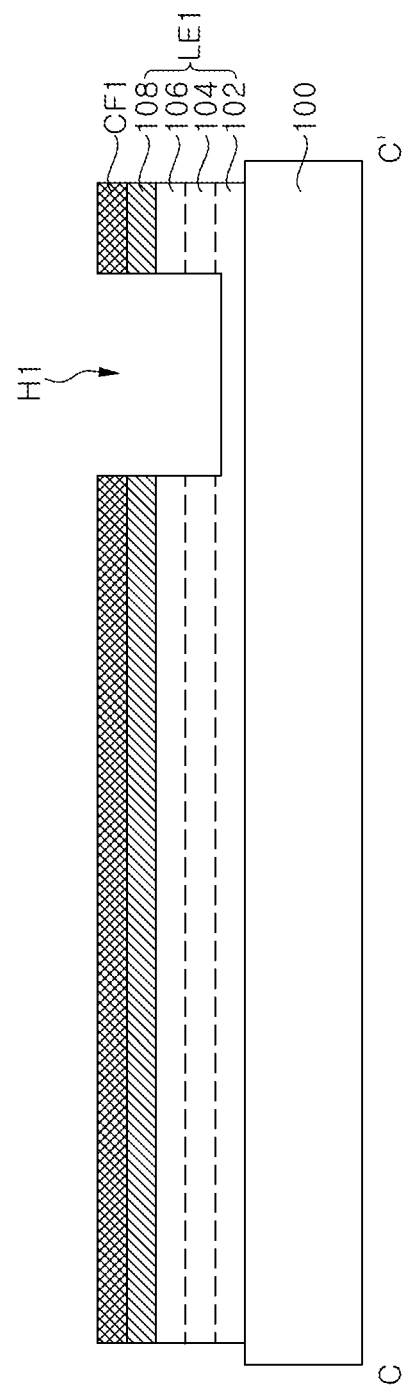
FIGS. 29, 30, 31, 32, 33, 34, 35, 36, 37, 38, 39, 40, 41, 42, 43, 44, 45, and 46 are cross-sectional views illustrating a method for manufacturing a light emitting device according to another exemplary embodiment.

Referring to FIG. 29, a first n-type semiconductor layer 102, a first active layer 104, a first p-type semiconductor layer 106, and a first ohmic layer 108 may be formed on a first substrate 100 to form a first light emitting part LE1. Then, a first color filter CF1 may be formed on the first light emitting part LE1. In some exemplary embodiments, the first color filter CF1 may be selectively omitted.

The first substrate 100 may have a substantially quadrangular structure when viewed from the top, and may include a first corner CN1, a second corner CN2, a third corner CN3, and a fourth corner CN4.

By etching the first color filter CF1, the first ohmic layer 108, the first p-type semiconductor layer 106, and the first active layer 104, a first hole H1 exposing the first n-type semiconductor layer 102 may be formed at the fourth corner CN4.

During the etching process, a plurality of first light emitting parts LE1 may be separated from each other on the first substrate 100. More particular, as the peripheral portions of the first n-type semiconductor layer 102, the first active layer 104, the first p-type semiconductor layer 106, the first ohmic layer 108, and the first color filter CF1 are etched, adjacent first light emitting parts LE1 may be separated from one another.

By separating the first light emitting parts LE1, a stress due to a bowing phenomenon between the first substrate 100 and the first light emitting part LE1 may be mitigated.

Figure 30:
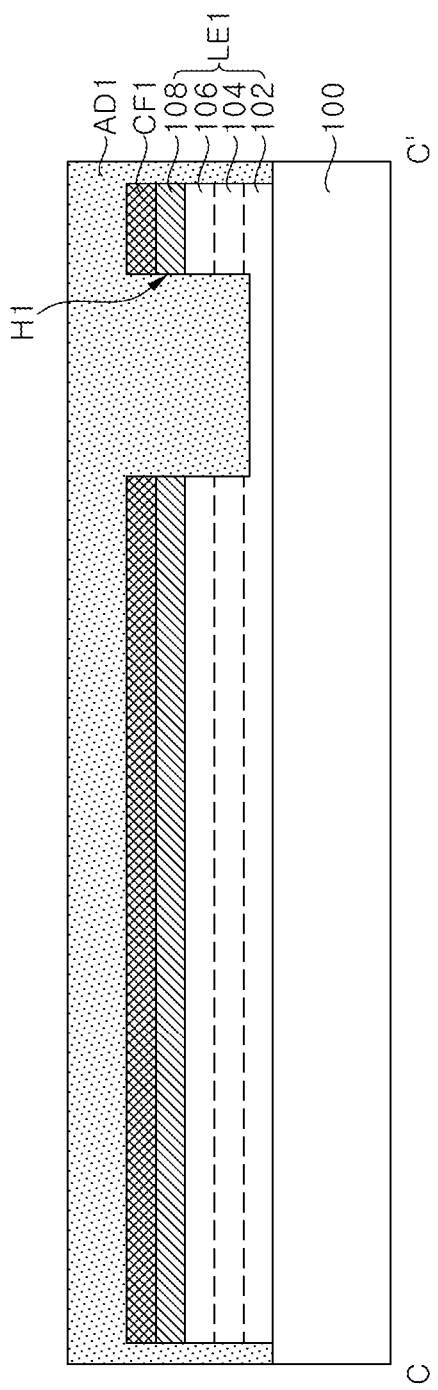

Referring to FIG. 30, a first adhesion part AD1 may be formed on the first color filter CF1 to fill the first hole H1. The first adhesion part AD1 may cover the top surface of the first substrate 100, which is exposed by the separation process, and cover the outer sidewalls of an individualized first light emitting device.

Figure 31:
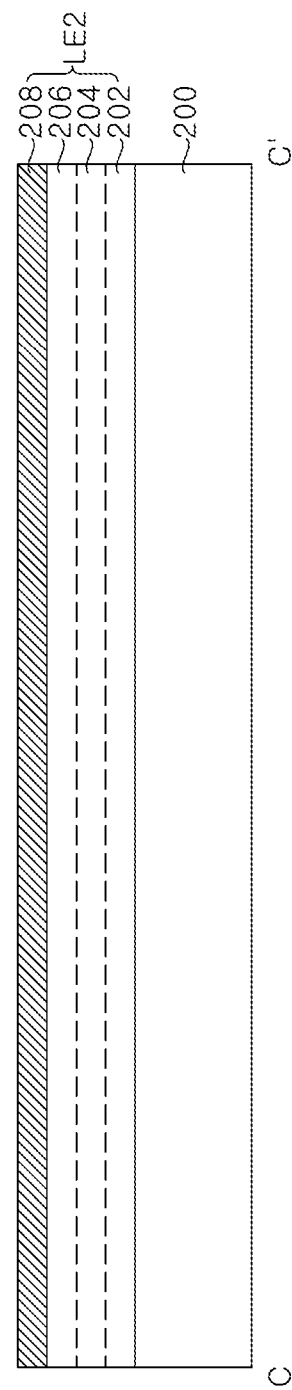

Referring to FIG. 31, a second n-type semiconductor layer 202, a second active layer 204, a second p-type semiconductor layer 206, and a second ohmic layer 208 may be formed on a second substrate 200 to form a second light emitting part LE2.

Figure 32:
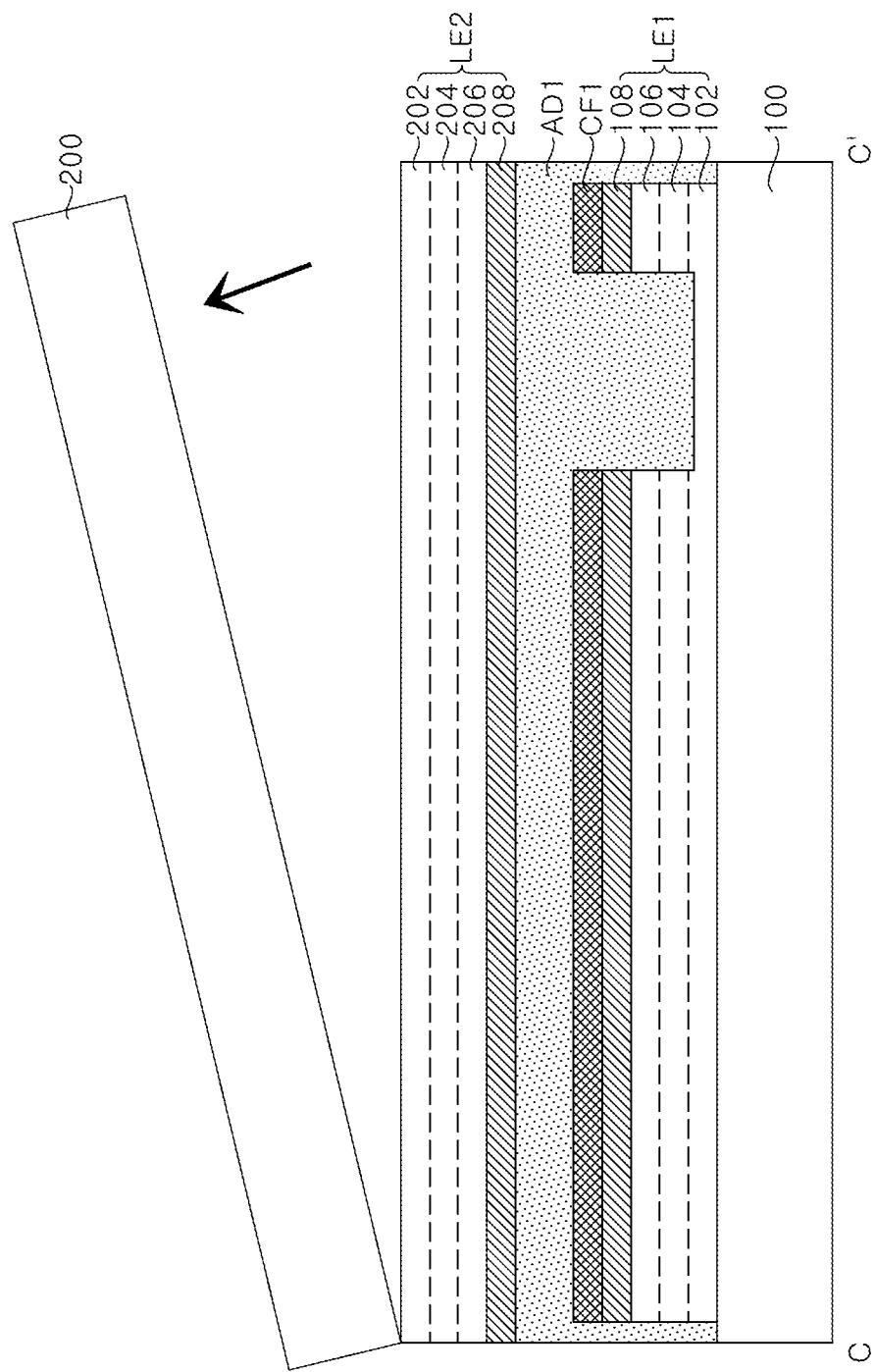

Referring to FIG. 32, the second light emitting part LE2 may be turned over, such that the second ohmic layer 208 faces the first adhesion part AD1. By performing thermal treatment, the first light emitting part LE1 and the second light emitting part LE2 may be bonded to each other by using the first adhesion part AD1. Then, the second substrate 200 may be removed from the second light emitting part LE2 by using a laser lift-off process, or the like.

In this manner, the first n-type semiconductor layer 102, the first active layer 104, the first p-type semiconductor layer 106, the first ohmic layer 108, the first color filter CF1, the first adhesion part AD1, the second ohmic layer 208, the second p-type semiconductor layer 206, the second active layer 204, and the second n-type semiconductor layer 202 may be sequentially stacked on the first substrate 100.

Figure 33:
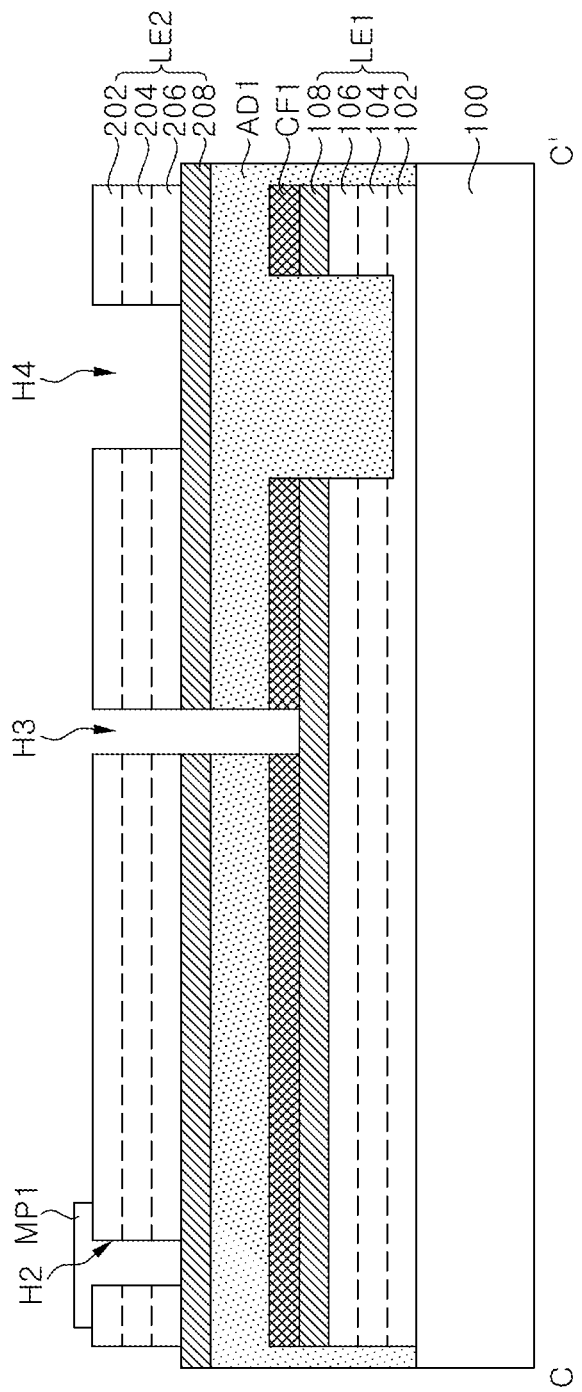

Referring to FIG. 33, by etching the second n-type semiconductor layer 202, the second active layer 204, and the second p-type semiconductor layer 206, a second hole H2 exposing the second ohmic layer 208 at the second corner CN2, a third hole H3 exposing the second ohmic layer 208 at the first corner CN1, and a fourth hole H4 exposing the second ohmic layer 208 at the fourth corner CN4 may be formed. For example, the second hole H2 and the third hole H3 may have the same width, and the fourth hole H4 may have a width greater than the second hole H2 or the third hole H3.

While the second hole H2, the third hole H3, and the fourth hole H4 are formed, the peripheral portions of the respective second n-type semiconductor layer 202, second active layer 204, and second p-type semiconductor layer 206 may be etched to expose the peripheral portions of the second ohmic layer 208. When viewed from the top, the exposed second ohmic layer 208 may have a structure which surrounds the second p-type semiconductor layer 206. As the peripheral portions of the respective second n-type semiconductor layer 202, second active layer 204, and second p-type semiconductor layer 206 are etched, a stress to be applied to the first substrate 100 may be mitigated.

Then, a first masking pattern MP1 may be formed in the second hole H2. The first masking pattern MP1 may include a material which has an etching selectivity with respect to an etchant to be used in a subsequent etching process so as not to be substantially etched. For example, the first masking pattern MP1 may include a photoresist.

Figure 34:
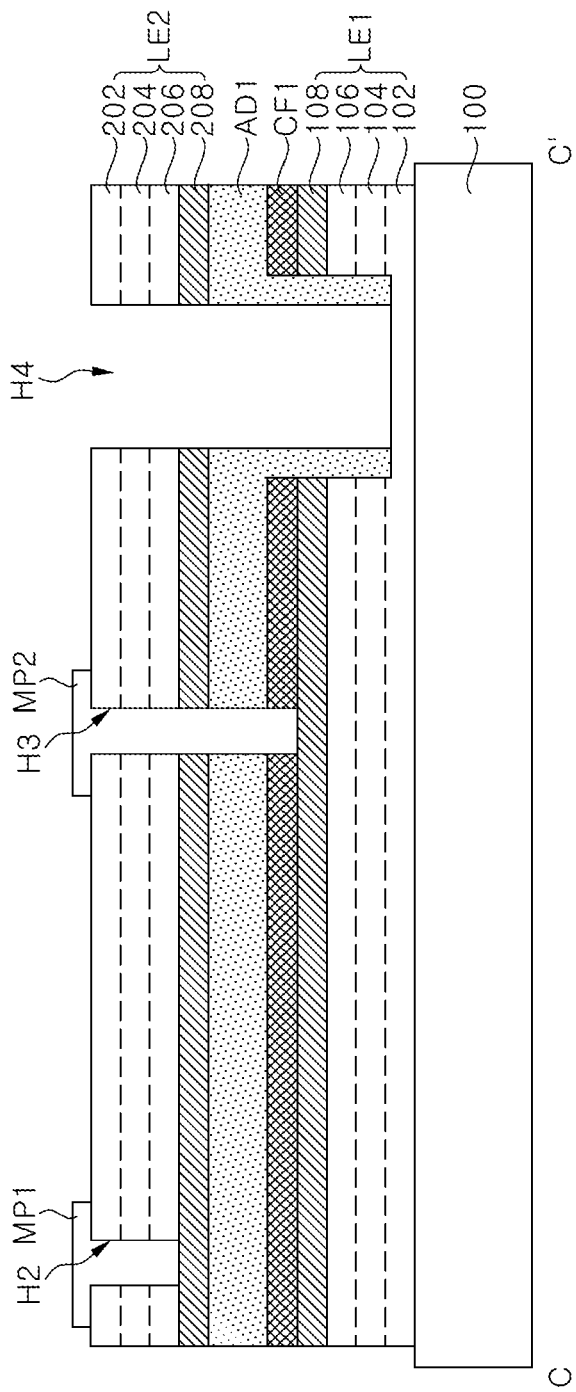

Referring to FIG. 34, by etching the second ohmic layer 208, the first adhesion part AD1, and the first color filter CF1 positioned at the bottom surfaces of the third hole H3 and the fourth hole H4, the first ohmic layer 108 may be exposed.

After filling the inside of the third hole H3 by a second masking pattern MP2, the first p-type semiconductor layer 106 and the first active layer 104 positioned at the bottom surface of the fourth hole H4, and the first n-type semiconductor layer 102 may be exposed by etching the first ohmic layer 108. The first adhesion part AD1 may be remained on the inner sidewall of the lower portion of the fourth hole H4.

Through the etching processes, the third hole H3 and the fourth hole H4 may have structures extending downward. While the third hole H3 and the fourth hole H4 are extended downward, the second ohmic layer 208, the first adhesion part AD1, the first color filter CF1, the first ohmic layer 108, the first p-type semiconductor layer 106, the first active layer 104, and the first n-type semiconductor layer 102 are etched, such that the stacked first light emitting part LE1 and the second light emitting part LE2 may be separated.

As the first light emitting part LE1 and the second light emitting part LE2 are separated, a stress to be applied to the first substrate 100 may be mitigated.

Figure 35:
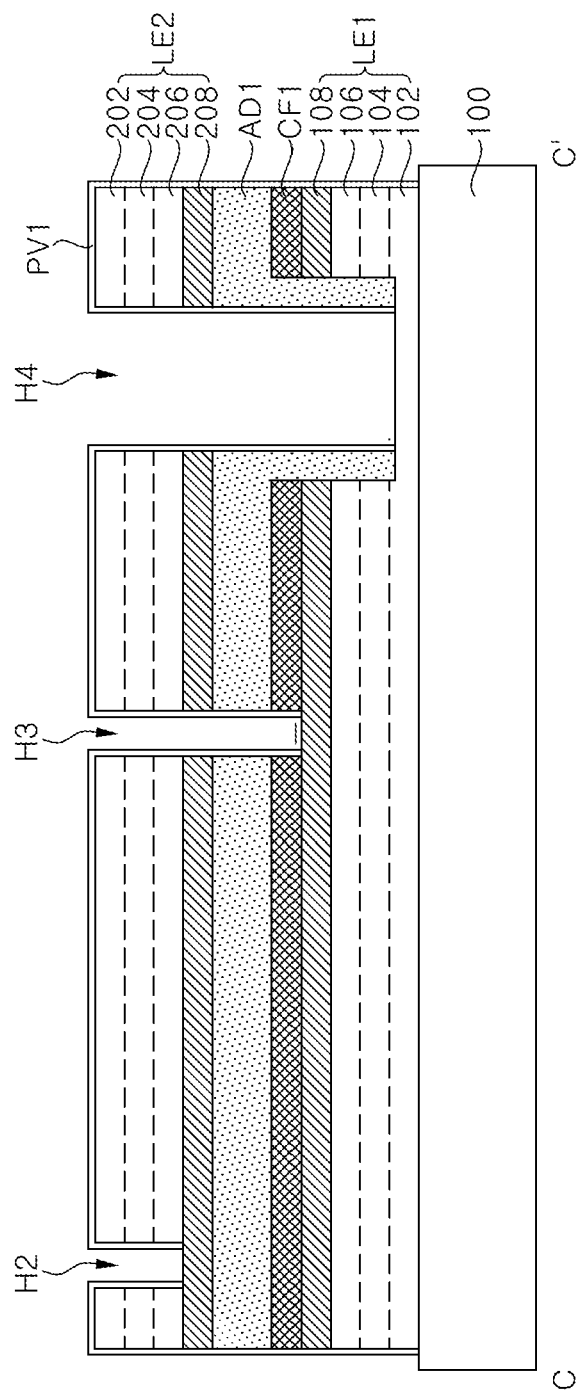

Referring to FIG. 35, after removing the first masking pattern MP1 and the second masking pattern MP2, a first passivation layer PV1 may be conformally formed on the second n-type semiconductor layer 202 through which the second hole H2, the third hole H3, and the fourth hole H4 are formed, so as not to fill the second hole H2, the third hole H3, and the fourth hole H4. The first passivation layer PV1 may cover the outer sidewalls of the respective first light emitting part LE1 and second light emitting part LE2, which are etched. The first passivation layer PV1 may include $SiO_2$, for example.

According to an exemplary embodiment, in the first passivation layer PV1, the thickness of the first passivation layer PV1 which is formed on the top surface of the second n-type semiconductor layer 202 may be larger than the thickness of the first passivation layer PV1 which is formed on the sidewalls and bottom surfaces of the respective second hole H2, third hole H3 and fourth hole H4. For example, the thickness of the first passivation layer PV1 which formed on the top surface of the second n-type semiconductor layer 202 may be two to four times larger than the thickness of the first passivation layer PV1 which is formed on the sidewalls and bottom surfaces of the respective second hole H2, third hole H3 and fourth hole H4.

Then, the first passivation layer PV1 formed on the bottom surfaces of the respective second hole H2, third hole H3, and fourth hole H4 may be removed. The first passivation layer PV1 may be etched in a direction perpendicular to the surface of the second n-type semiconductor layer 202.

Because the thickness of the first passivation layer PV1 formed on the top surface of the second n-type semiconductor layer 202 is greater than the thickness of the first passivation layer PV1 formed on the sidewalls and bottom surfaces of the respective second hole H2, third hole H3, and fourth hole H4, when the first passivation layer PV1 is etched in a direction perpendicular to the surface of the second n-type semiconductor layer 202, the first passivation layer PV1 formed on the second n-type semiconductor layer 202 may be remained while the first passivation layer PV1 formed on the bottom surfaces of the respective second hole H2, third hole H3, and fourth hole H4 is removed. Moreover, because the first passivation layer PV1 is etched in the vertical direction, the first passivation layer PV1 formed on the sidewalls of the respective second hole H2, third hole H3, and fourth hole H4 may not be etched and be remained.

Also, the first passivation layer PV1 may remain on the outer sidewalls of the respective first light emitting part LE1 and second light emitting part LE2.

According to an exemplary embodiment, the thickness of the first passivation layer PV1 formed on the top surface of the second n-type semiconductor layer 202 may be greater than or equal to the thickness of the first passivation layer PV1 remaining on the sidewalls of the respective second hole H2, third hole H3, and fourth hole H4.

Figure 36:
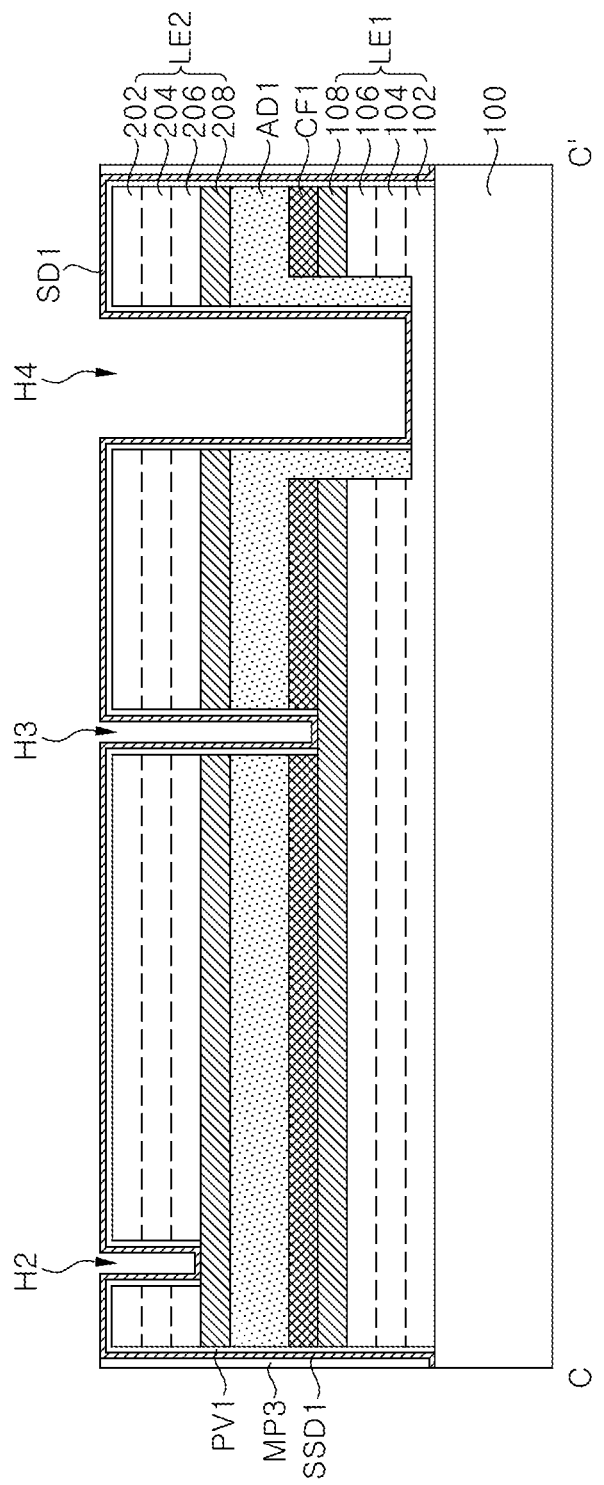

Referring to FIG. 36, a first seed layer SD1 may be conformally formed on the second n-type semiconductor layer 202 formed with the first passivation layer PV1, so as not to fill the respective second hole H2, third hole H3, and fourth hole H4. A first outer seed layer SSD1, which covers the outer sidewalls of the first light emitting part LE1 and the second light emitting part LE2, may be formed together.

Then, a third masking pattern MP3 covering the first outer seed layer SSD1 may be additionally formed. The third masking pattern MP3 may include a photoresist, which is low in light transmittance and has an insulation property.

In this manner, it is possible to prevent the light emitting device from cracking during subsequent process of removing the first substrate 100 by the third masking pattern MP3, which surrounds the outer sidewalls of the light emitting device.

Figure 37:
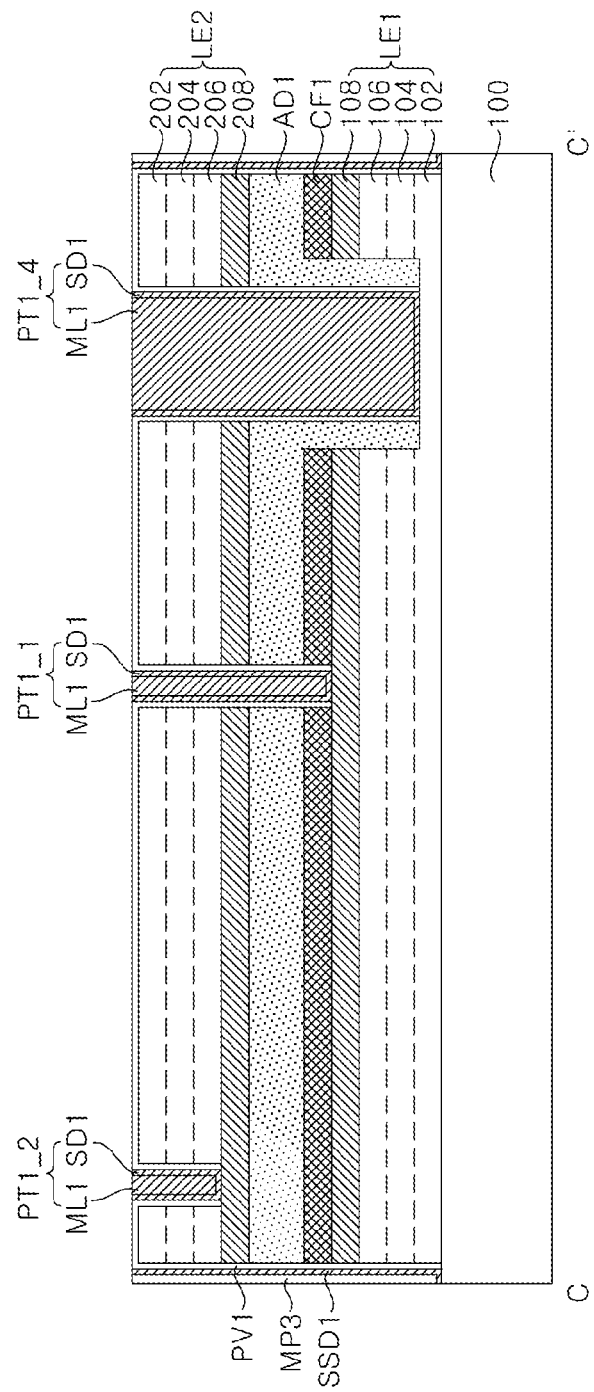

Referring to FIG. 37, a first plating layer ML1 may be formed on the first seed layer SD1 to fill the second hole H2, the third hole H3, and the fourth hole H4, which are formed with the first seed layer SD1. The first plating layer ML1 may not be formed on the first outer seed layer SSD1, due to the presence of the third masking pattern MP3.

Then, the first plating layer ML1 and the first seed layer SD1 may be etched, such that the top surface of the first passivation layer PV1 is exposed. The first passivation layer PV1 may function as an etch stop layer during the process of etching the first plating layer ML1 and the first seed layer SD1. As the process for etching the first plating layer ML1 and the first seed layer SD1, a chemical mechanical polishing process may be used, without being limited thereto.

In this manner, a first pattern PT1_2 of a second via structure VA2 (see FIG. 46) filling the second hole H2, a first pattern PT1_1 of a first via structure VA1 (see FIG. 46) filling the third hole H3, and a first pattern PT1_4 of a fourth via structure VA4 (see FIG. 46) filling the fourth hole H4 may be respectively formed.

Each of the first pattern PT1_1 of the first via structure VA1, the first pattern PT1_2 of the second via structure VA2, and the first pattern PT1_4 of the fourth via structure VA4 may have a structure, in which the first seed layer SD1 surrounds the first plating layer ML1, and may include copper.

For example, the copper crystals of the first seed layer SD1 may be higher in density than the copper crystals of the first plating layer ML1.

Figure 38:
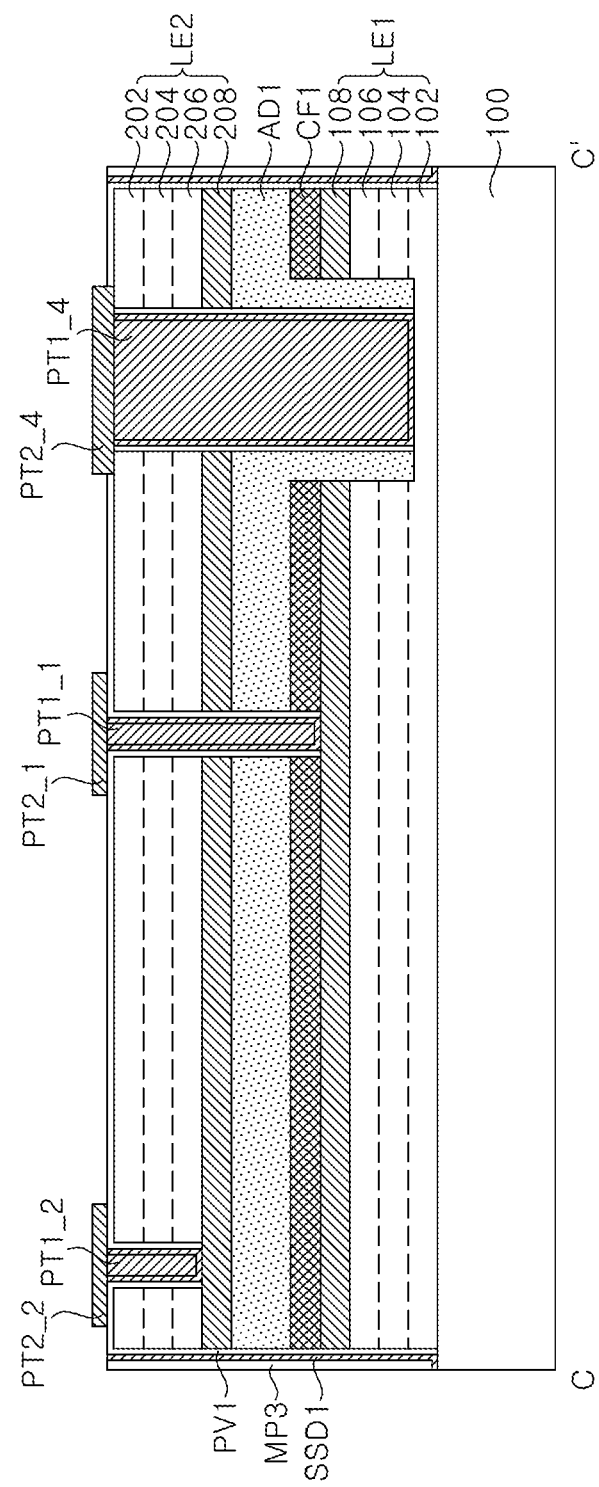

Referring to FIG. 38, a second pattern PT2_1 of the first via structure VA1, a second pattern PT2_2 of the second via structure VA2, and a second pattern PT2_4 of the fourth via structure VA4 may be formed on the first pattern PT1_1 of the first via structure VA1, the first pattern PT1_2 of the second via structure VA2, and the first pattern PT1_4 of the fourth via structure VA4, respectively. Each of the second pattern PT2_1 of the first via structure VA1, the second pattern PT2_2 of the second via structure VA2, and the second pattern PT2_4 of the fourth via structure VA4 may include Au.

In the first via structure VA1, the second pattern PT2_1 may have a width greater than the first pattern PT1_1, one surface of the first pattern PT1_1 may be brought into electrical contact with the first ohmic layer 108, and the other, opposing surface may be brought into electrical contact with one surface of the second pattern PT2_1. The first passivation layer PV1 may surround the outer sidewall of the first pattern PT1_1, and may insulate the second pattern PT2_1 and the second n-type semiconductor layer 202 from each other. At least a portion of the first pattern PT1_1 formed with the first passivation layer PV1 may have a structure, which is surrounded by the first adhesion part AD1. For example, the first adhesion part AD1 may surround the middle portion of the first pattern PT1_1 formed with the first passivation layer PV1.

In the second via structure VA2, the second pattern PT2_2 may have a width greater than the first pattern PT1_2, one surface of the first pattern PT1_2 may be brought into electrical contact with the second ohmic layer 208, and the other, opposing surface may be brought into electrical contact with one surface of the second pattern PT2_2. The first passivation layer PV1 may surround the outer sidewall of the first pattern PT1_2, and may insulate the second pattern PT2_2 and the second n-type semiconductor layer 202 from each other.

In the fourth via structure VA4, the second pattern PT2_4 may have a width greater than the first pattern PT1_4, one surface of the first pattern PT1_4 may be brought into electrical contact with the first n-type semiconductor layer 102, and the other, opposing surface may be brought into electrical contact with one surface of the second pattern PT2_4. According to an exemplary embodiment, the one surface of the second pattern PT2_4 of the fourth via structure VA4 may include a first portion PT1 contacting the first pattern PT1_4 and a second portion PT2 contacting the second n-type semiconductor layer 202, and the second portion PT2 may be about one to about five times larger than the first portion PT1. The first passivation layer PV1 may surround the outer sidewall of the second pattern PT2_4, while being removed between the second pattern PT2_4 and the second n-type semiconductor layer 202, such that the second pattern PT2_4 and the second n-type semiconductor layer 202 may be brought into electrical contact with each other. Further, the first pattern PT1_4 of the fourth via structure VA4 may have a structure which extends into the first adhesion part AD1, and the first adhesion part AD1 may have a structure which surrounds the outer sidewall of the lower portion of the first pattern PT1_4 of the fourth via structure VA4.

Figure 39:
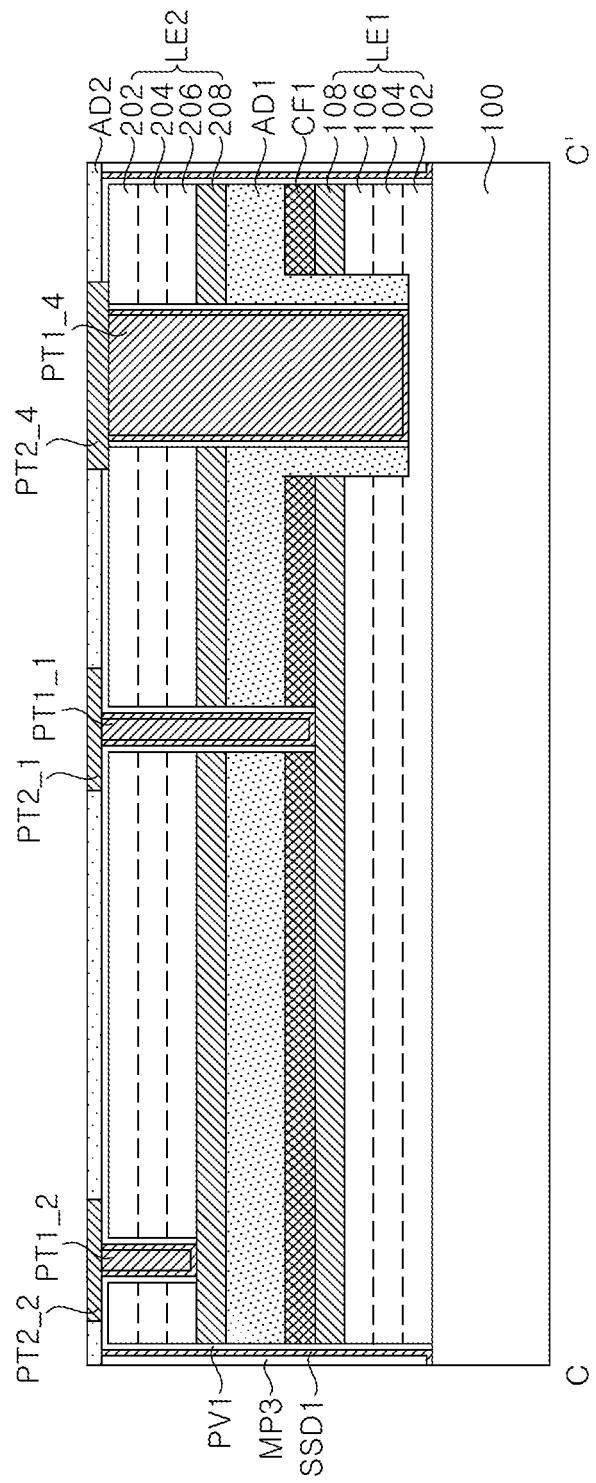

Referring to FIG. 39, a second adhesion part AD2 may be formed on the first passivation layer PV1 on which the second pattern PT2_1 of the first via structure VA1, the second pattern PT2_2 of the second via structure VA2, and the second pattern PT2_4 of the fourth via structure VA4 are formed. The top surface of the second adhesion part AD2 may be coplanar with the respective top surfaces of the second pattern PT2_1 of the first via structure VA1, the second pattern PT2_2 of the second via structure VA2, and the second pattern PT2_4 of the fourth via structure VA4.

For example, each of the second pattern PT2_1 of the first via structure VA1, the second pattern PT2_2 of the second via structure VA2, and the second pattern PT2_4 of the fourth via structure VA4 may include metal, such as Au, and the second passivation layer PV2 may include $SiO_2$.

Figure 40:
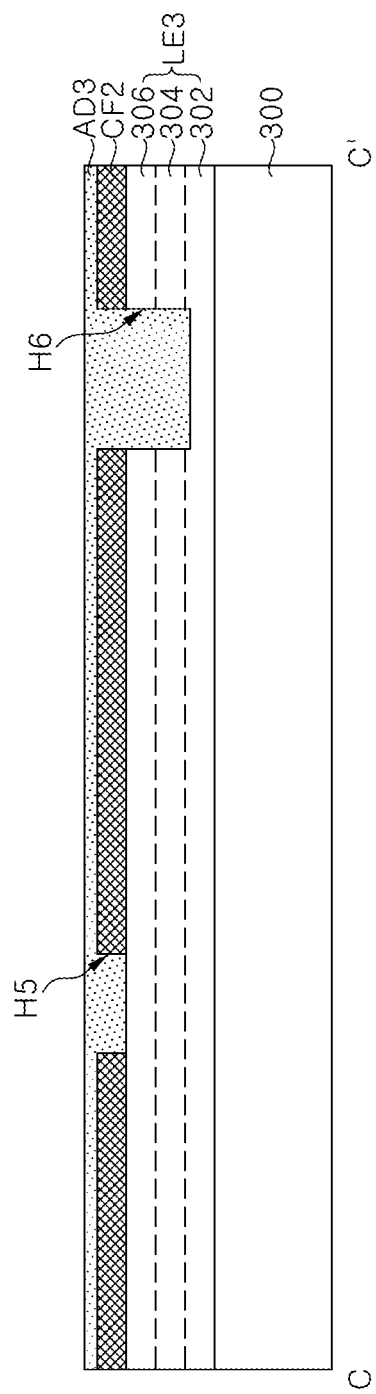

Referring to FIG. 40, a third light emitting part LE3 including a third n-type semiconductor layer 302, a third active layer 304, and a third p-type semiconductor layer 306 may be formed on a third substrate 300. A second color filter CF2 may be formed on the third p-type semiconductor layer 306.

At the third corner CN3, by etching the second color filter CF2, a fifth hole H5 may be formed to expose the third p-type semiconductor layer 306. At the fourth corner CN4, by etching the second color filter CF2, the third p-type semiconductor layer 306, and the third active layer 304, a sixth hole H6 exposing the third n-type semiconductor layer 302 may be formed.

Then, a third adhesion part AD3 that fills the fifth hole H5 and the sixth hole H6 may be formed on the second color filter CF2. The third adhesion part AD3 may cover the top of the second color filter CF2.

Figure 41:
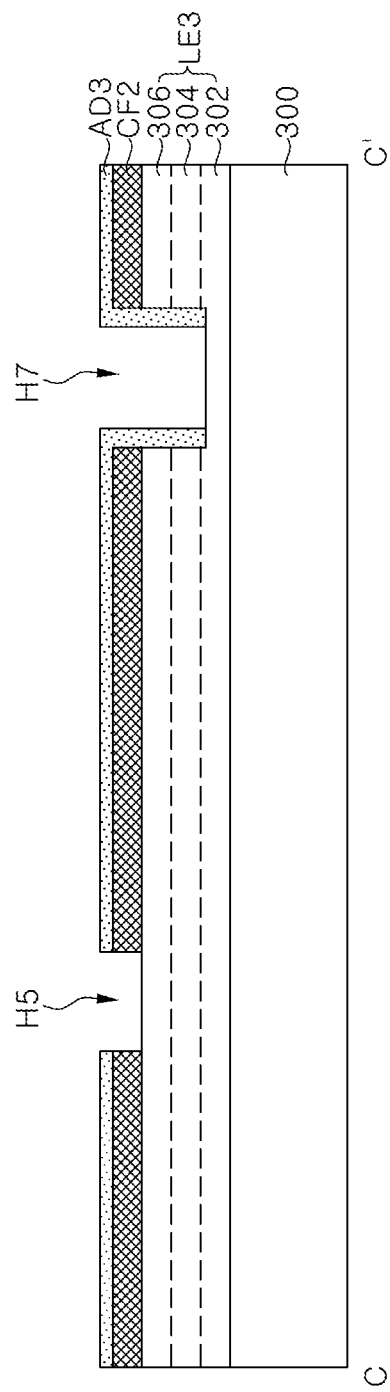

Referring to FIG. 41, by etching the third adhesion part AD3 in the fifth hole H5 and the sixth hole H6, the fifth hole H5 may be opened again to expose the third p-type semiconductor layer 306, and a seventh hole H7 exposing a portion of the third n-type semiconductor layer 302 and having a width smaller than the sixth hole H6 may be formed. The third adhesion part AD3 may be remained on the inner sidewall of the seventh hole H7.

Figure 42:
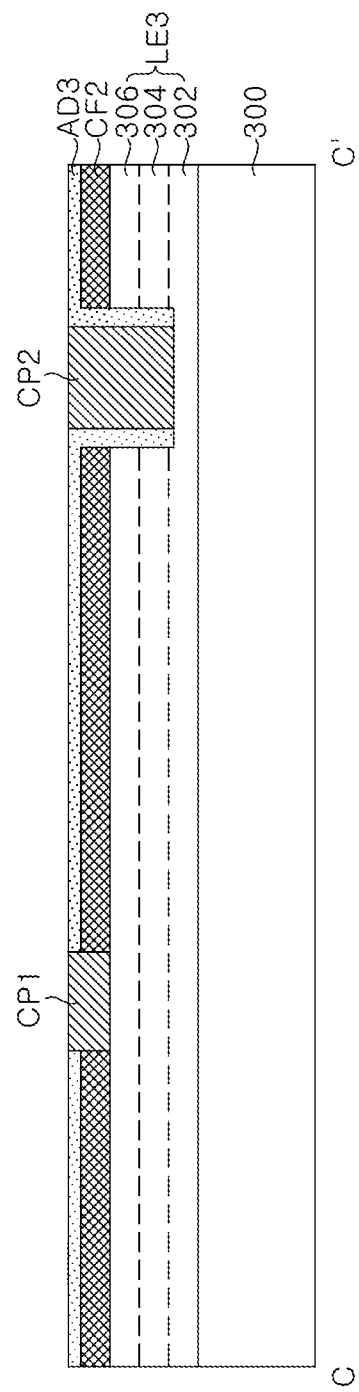

Referring to FIG. 42, a first conductive pattern CP1 filling the fifth hole H5 and a second conductive pattern CP2 filling the seventh hole H7 may be respectively formed. The first conductive pattern CP1 may be brought into electrical contact with the third p-type semiconductor layer 306, may include an Au/Be alloy, and may function as an ohmic layer of the third p-type semiconductor layer 306. The outer sidewall of the first conductive pattern CP1 may have a structure, which is surrounded by the third adhesion part AD3. The second conductive pattern CP2 may be brought into electrical contact with the third n-type semiconductor layer 302, may include an Au/Ge alloy, and may function as an ohmic layer of the third n-type semiconductor layer 302. The outer sidewall of the second conductive pattern CP2 may be insulated from the third p-type semiconductor layer 306 and the third active layer 304 by the third adhesion part AD3 remaining in the seventh hole H7. In this manner, since the first conductive pattern CP1 and the second conductive pattern CP2 that include metal are used as ohmic layers of the third p-type semiconductor layer 306 and third n-type semiconductor layer 302, it is possible to improve the ohmic property of the third light emitting part LE3.

A polishing process may be performed, such that the top surfaces of the first conductive pattern CP1, the second conductive pattern CP2, and the third adhesion part AD3 may be coplanar with one another. In this case, each of the first conductive pattern CP1 and the second conductive pattern CP2 may include metal, and the third adhesion part AD3 may include $SiO_2$.

Figure 43:
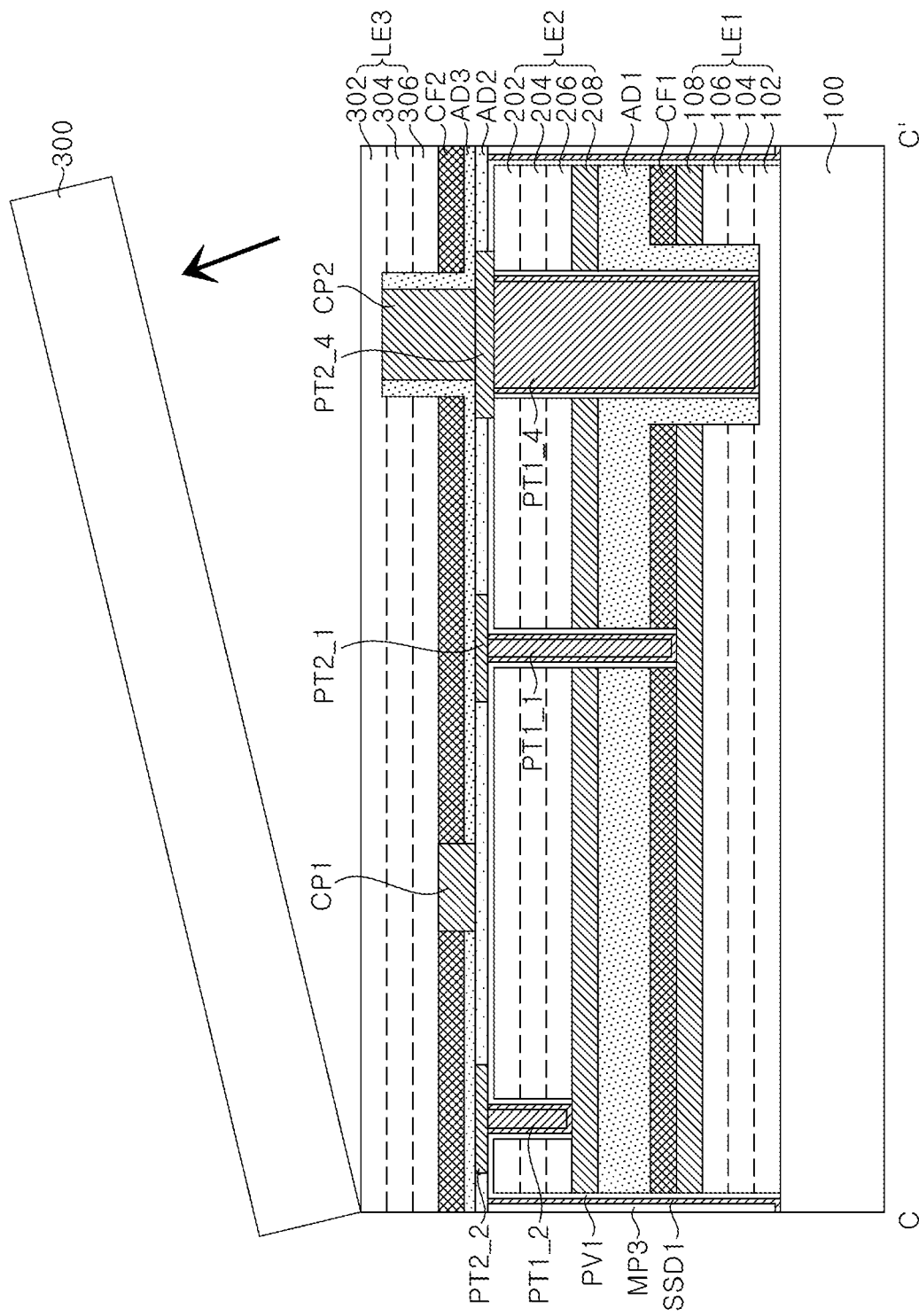

Referring to FIG. 43, the third substrate 300 may be turned over, such that the first conductive pattern CP1 and the second conductive pattern CP2 face the second pattern PT2_1 of the first via structure VA1, the second pattern PT2_2 of the second via structure VA2, and the second pattern PT2_4 of the fourth via structure VA4, which are disposed on the second light emitting part LE2.

According to an exemplary embodiment, the second pattern PT2_1 of the first via structure VA1, the second pattern PT2_2 of the second via structure VA2, the second pattern PT2_4 of the fourth via structure VA4, and the second adhesion part AD2 may face the first conductive pattern CP1, the second conductive pattern CP2, and the third adhesion part AD3, and be bonded through a thermal treatment process. In particular, the second pattern PT2_4 of the fourth via structure VA4 and the second conductive pattern CP2 may be bonded, the second adhesion part AD2 and the third adhesion part AD3 may be bonded, and the second pattern PT2_1 of the first via structure VA1 and the second pattern PT2_2 of the second via structure VA2 may be bonded with the third adhesion part AD3.

The bonding between the second adhesion part AD2 and the third adhesion part AD3, which may be insulators, and the bonding between the second pattern PT2_4 of the fourth via structure VA4 and the second conductive pattern CP2, which may be metals, may be performed simultaneously to simplify the manufacturing process.

Then, the third substrate 300 may be removed from the third light emitting part LE3 by performing a laser lift-off process or the like. By removing the third substrate 300, the third n-type semiconductor layer 302 may be exposed.

Figure 44:
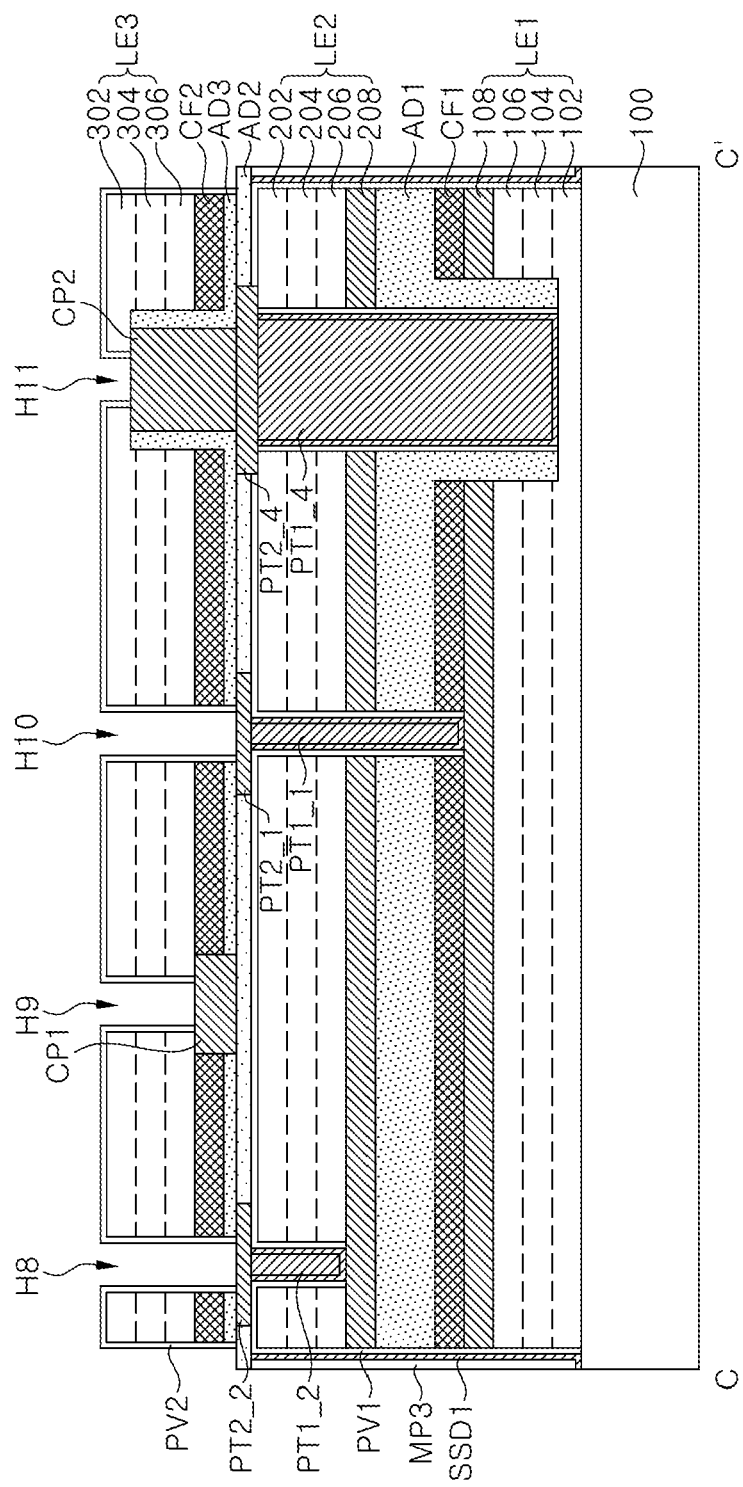

Referring to FIG. 44, an eighth hole H8, which exposes the second pattern PT2_2 of the second via structure VA2, may be formed by etching the third n-type semiconductor layer 302, the third active layer 304, the third p-type semiconductor layer 306, the second color filter CF2, and the third adhesion part AD3. A ninth hole H9, which exposes the first conductive pattern CP1, may be formed by etching the third n-type semiconductor layer 302, the third active layer 304, and the third p-type semiconductor layer 306. A tenth hole H10, which exposes the second pattern PT2_1 of the first via structure VA1, may be formed by etching the third n-type semiconductor layer 302, the third active layer 304, the third p-type semiconductor layer 306, the second color filter CF2, and the third adhesion part AD3. An eleventh hole H11, which exposes the second conductive pattern CP2, may be formed by etching the third n-type semiconductor layer 302.

While the eighth hole H8, the ninth hole H9, the tenth hole H10, and the eleventh hole H11 are formed, the peripheral portions of the third n-type semiconductor layer 302, the third active layer 304, the third p-type semiconductor layer 306, the second color filter CF2, and the third adhesion part AD3 may be etched to expose the peripheral portions of the second adhesion part AD2. The second adhesion part AD2 having peripheral portions exposed may have a structure, which surrounds the outer sidewalls of the third adhesion part AD3 when viewed from the top.

Then, a second passivation layer PV2 may be conformally formed on the third n-type semiconductor layer 302 so as not to fill the eighth hole H8, the ninth hole H9, the tenth hole H10, and the eleventh hole H11. According to an exemplary embodiment, in the second passivation layer PV2, the thickness of the second passivation layer PV2 formed on the top surface of the third n-type semiconductor layer 302 may be greater than the thickness of the second passivation layer PV2 formed on the sidewalls and bottom surfaces of the respective eight hole H8, ninth hole H9, tenth hole H10, and eleventh hole H11. For example, the thickness of the second passivation layer PV2 formed on the top surface of the third n-type semiconductor layer 302 may be about two to about four times greater than the thickness of the second passivation layer PV2 formed on the sidewalls and bottom surfaces of the respective eight hole H8, ninth hole H9, tenth hole H10, and eleventh hole H11.

By etching the second passivation layer PV2 in a direction perpendicular to the surface of the third n-type semiconductor layer 302, the second passivation layer PV2 formed on the bottom surfaces of the respective eighth hole H8, ninth hole H9, tenth hole H10, and eleventh hole H11 may be removed.

In this case, since the thickness of the second passivation layer PV2 formed on the top surface of the third n-type semiconductor layer 302 is greater than the thickness of the second passivation layer PV2 formed on the sidewalls and bottom surfaces of the respective eight hole H8, ninth hole H9, tenth hole H10, and eleventh hole H11, even if the second passivation layer PV2 formed on the bottom surfaces of the respective eighth hole H8, ninth hole H9, tenth hole H10, and eleventh hole H11 is removed, the second passivation layer PV2 formed on the top surface of the third n-type semiconductor layer 302 and on the sidewalls of the respective eighth hole H8, ninth hole H9, tenth hole H10, and eleventh hole H11 may be remained.

When separating a completed light emitting device from the first substrate 100 in a subsequent process, the first substrate 100 may be bent. In this case, since the thickness of the second passivation layer PV2 remaining on the top surface of the third n-type semiconductor layer 302 is greater than or equal to the thickness of the second passivation layer PV2 remaining on the sidewalls of the respective eighth hole H8, ninth hole H9, tenth hole H10, and eleventh hole H11, according to an exemplary embodiment, the second passivation layer PV2 formed on the top surface of the third n-type semiconductor layer 302 may prevent a first pad PD1 (see FIG. 2B), a second pad PD2 (see FIG. 2B), a third pad PD3 (see FIG. 2B), and a common pad CPD (see FIG. 2B) from being delaminated from the light emitting device.

The second passivation layer PV2 formed on the outer sidewalls of the third adhesion part AD3, the second color filter CF2, the third p-type semiconductor layer 306, the third active layer 304, and the third n-type semiconductor layer 302 exposing the peripheral portions of the second adhesion part AD2 may be retained.

According to an exemplary embodiment, the thickness of the second passivation layer PV2 remaining on the top surface of the third n-type semiconductor layer 302 may be greater than or equal to the thickness of the second passivation layer PV2 remaining on the sidewalls of the respective eight hole H8, ninth hole H9, tenth hole H10, and eleventh hole H11.

Figure 45:
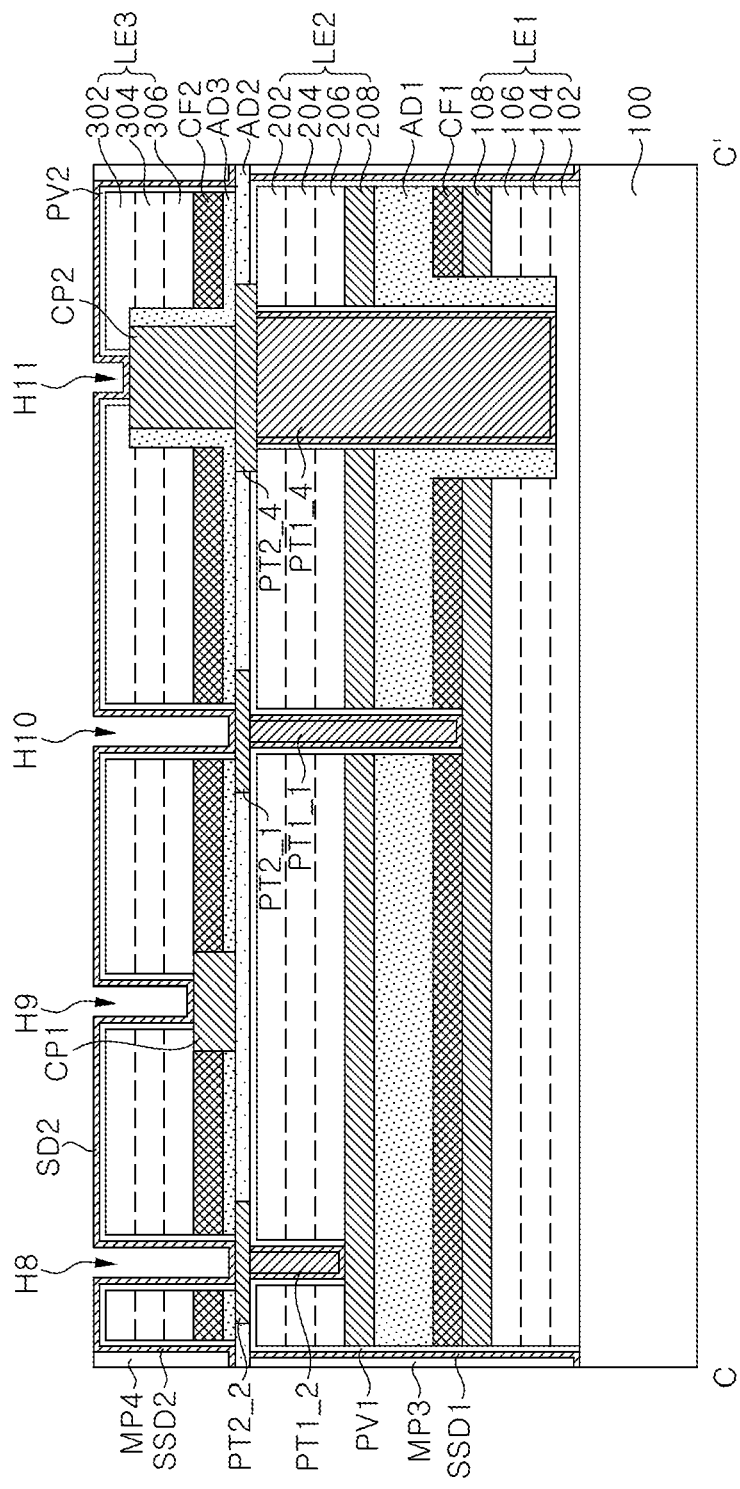

Referring to FIG. 45, a second seed layer SD2 may be conformally formed on the third n-type semiconductor layer 302 so as not to fill the eighth hole H8, the ninth hole H9, the tenth hole H10, and the eleventh hole H11, which are formed with the second passivation layer PV2.

A second outer seed layer SSD2 may be extended to the outer sidewalls of the third adhesion part AD3, the second color filter CF2, the third p-type semiconductor layer 306, the third active layer 304, and the third n-type semiconductor layer 302, which expose the peripheral portions of the second adhesion part AD2 and on which the second passivation layer PV2 is formed.

Then, a fourth masking pattern MP4 covering the second outer seed layer SSD2 may be formed. The fourth masking pattern MP4 may include a photoresist, which is low in light transmittance and has an insulation property.

According to an exemplary embodiment, due to the presence of the fourth masking pattern MP4 surrounding the outer sidewalls of the light emitting device, a crack in the light emitting device that may otherwise would likely to occur during a subsequent process may be prevented.

Figure 46:
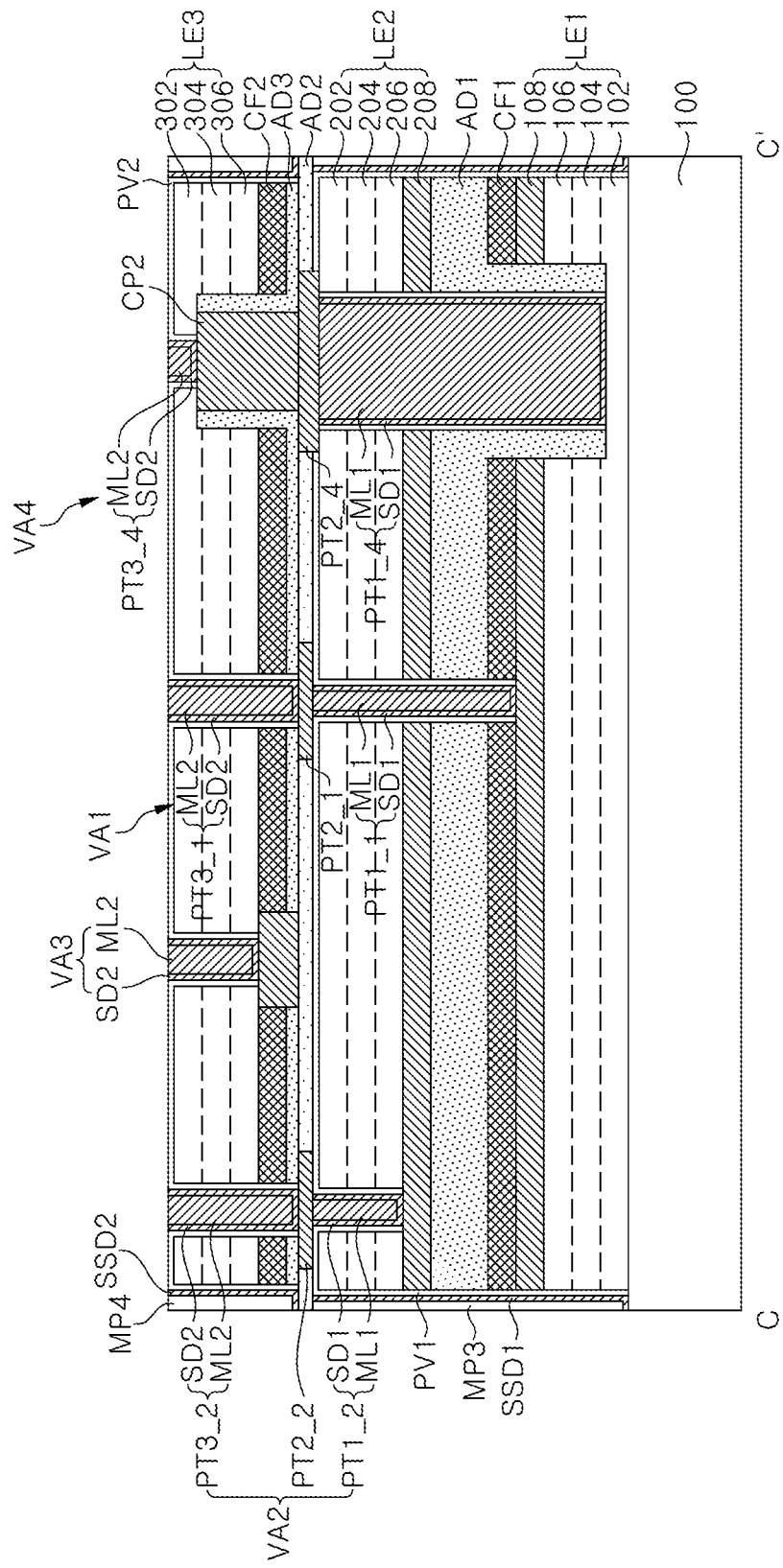

Referring to FIG. 46, by using the second seed layer SD2, a second plating layer ML2 may be formed on the second seed layer SD2 to fill the respective eighth hole H8, ninth hole H9, tenth hole H10, and eleventh hole H11.

Then, by etching the second seed layer SD2 and the second plating layer ML2 to expose the top surface of the second passivation layer PV2, a third pattern PT3_2 of the second via structure VA2 filling the eighth hole H8, a third via structure VA3 filling the ninth hole H9, a third pattern PT3_1 of the first via structure VA1 filling the tenth hole H10, and a third pattern PT3_4 of the fourth via structure VA4 filling the eleventh hole H11 may be respectively formed.

The respective top surfaces of the third pattern PT3_1 of the first via structure VA1, the third pattern PT3_2 of the second via structure VA2, the third via structure VA3, and the third pattern PT3_4 of the fourth via structure VA4 may be substantially coplanar with the top surface of the second passivation layer PV2.

As the fourth masking pattern MP4 is disposed on the second outer seed layer SSD2, the second plating layer ML2 may not be formed on the second outer seed layer SSD2.

According to an exemplary embodiment, the second outer seed layer SSD2 and the second plating layer ML2 may include copper. For example, the copper crystals of the second outer seed layer SSD2 may have a density higher than the copper crystals of the second plating layer ML2.

Referring back to FIG. 2B, on the second passivation layer PV2, the first pad PD1 electrically contacting the third pattern PT3_1 of the first via structure VA1, the second pad PD2 electrically contacting the third pattern PT3_2 of the second via structure VA2, the third pad PD3 electrically contacting the third via structure VA3, and the common pad CPD electrically contacting the third pattern PT3_4 of the fourth via structure VA4 may be formed.

According to the exemplary embodiments, a light emitting device includes metal patterns are formed on an n-type semiconductor layer and a p-type semiconductor layer at a light emitting red color light to improve an ohmic property.

In addition, as a first-type semiconductor layer of each light emitting part is electrically coupled in common to a common pad, it is possible to stably supply current to the light emitting device, as compared to coupling a second-type semiconductor layer of each light emitting part in common.

Moreover, because a seed layer is formed on outer sidewalls of the light emitting device, light generated from the light emitting device may be reflected, thereby improving the light efficiency of the light emitting device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
   a first light emitting part including a first-type semiconductor layer, a first active layer, a second-type semiconductor layer, and a first ohmic layer;
   a second light emitting part disposed on the first light emitting part, and including a first-type semiconductor layer, a second active layer, a second-type semiconductor layer, and a second ohmic layer;
   a third light emitting part disposed on the second light emitting part, and including a first-type semiconductor layer, a third active layer, a second-type semiconductor layer, a first metal pattern having a first surface electrically contacting the second-type semiconductor layer of the third light emitting part and a second metal pattern having a first surface electrically contacting the first-type semiconductor layer of the third light emitting part;
   a first pad electrically coupled with the first ohmic layer;
   a second pad electrically coupled with the second ohmic layer;
   a third pad electrically coupled with the first metal pattern;
   a common pad electrically coupled with the first-type semiconductor layer of the first and second light emitting parts and the second metal pattern; and
   a first via structure electrically coupling the second metal pattern and the common pad between the second metal pattern and the common pad,
   wherein the first surface of the second metal pattern has a first portion contacting the first via structure and a second portion contacting the first-type semiconductor layer of the third light emitting part.

2. The light emitting device according to claim 1, wherein an area of the second portion of the second metal pattern is about one to about five times of an area of the first portion.

3. The light emitting device according to claim 2, wherein the second portion of the second metal pattern surrounds the first portion.

4. The light emitting device according to claim 1, wherein an electrical conductivity of each of the first and second metal patterns is greater than an electrical conductivity of each of the first and second ohmic layers.

5. The light emitting device according to claim 1, wherein:
   the first metal pattern contacts the second-type semiconductor layer of the third light emitting part, and has a first thickness; and
   the second metal pattern passes through the second-type semiconductor layer of the third light emitting part and the third active layer, and has a second thickness greater than the first thickness.

6. The light emitting device according to claim 5, wherein:
   each of the first metal pattern and the second metal pattern has a second surface opposing the first surface; and
   the second surface of the first metal pattern is disposed on a level that is at least the same or higher than the second surface of the second metal pattern.

7. The light emitting device according to claim 1, wherein:
   the second metal pattern has a second surface opposing the first surface;
   a width of the first surface is greater than a width of the second surface; and
   the width of the second surface is greater than a width of the first via structure.

8. The light emitting device according to claim 1, wherein a portion of an outer sidewall of the second metal pattern adjacent to the first via structure protrudes outwardly.

9. The light emitting device according to claim 1, further comprising a second via structure electrically coupling the first metal pattern and the third pad between the first metal pattern and the third pad,
wherein the second surface of the first metal pattern has a first portion contacting the second via structure and a second portion contacting the second-type semiconductor layer of the third light emitting part.

10. The light emitting device according to claim 9, wherein an area of the second portion of the first metal pattern is about one to about five times an area of the first portion.

11. The light emitting device according to claim 10, wherein the second portion of the first metal pattern surrounds the first portion.

12. The light emitting device according to claim 9, wherein the first metal pattern has a width greater than the second via structure.

13. The light emitting device according to claim 1, further comprising:
a second via structure electrically coupling the first ohmic layer and the first pad;
a third via structure electrically coupling the second ohmic layer and the second pad;
a fourth via structure electrically coupling the first metal pattern and the third pad; and
a first passivation layer electrically insulating the first, second, third, and fourth via structures from the first, second, and third light emitting parts,
wherein the first passivation layer has a first portion surrounding outer sidewalls of the respective first, second, third, and fourth via structures, and a second portion disposed between the first-type semiconductor layer of the third light emitting part and the first, second, third pads and the common pad, and
wherein the second portion of the first passivation layer has a thickness equal to or greater than the first portion.

14. The light emitting device according to claim 13, further comprising:
a fifth via structure electrically coupling the common pad and the first-type semiconductor layer of the first light emitting part; and
a sixth via structure electrically coupling the common pad and the first-type semiconductor layer of the second light emitting part,
wherein the first portion of the first passivation layer surrounds outer sidewalls of the fifth and sixth via structures.

15. The light emitting device according to claim 14, wherein each of the first, second, third, fourth, fifth, and sixth via structures includes a plating layer and a seed layer surrounding an outer sidewall of the plating layer.

16. The light emitting device according to claim 13, wherein:

the second metal pattern has a first surface contacting the first via structure, and
wherein the light emitting device further comprises a fifth via structure including a first pattern electrically contacting with a second surface of the second metal pattern opposing the first surface and the first-type semiconductor layer of the second light emitting part, and a second pattern electrically coupling the first pattern and the first-type semiconductor layer of the first light emitting part.

17. The light emitting device according to claim 16, wherein each of the first, second, third, fourth, and fifth via structures includes a plating layer and a seed layer surrounding an outer sidewall of the plating layer.

18. The light emitting device according to claim 1, further comprising:
a passivation layer surrounding outer sidewalls of the respective first, second, and third light emitting parts; and
an outer seed layer surrounding outer sidewalls of the passivation layer.

19. The light emitting device according to claim 1, further comprising:
a first outer seed layer surrounding outer sidewalls of at least one of the first, second, and third light emitting parts;
a first passivation layer disposed between at least one of the first, second, and third light emitting parts and the first outer seed layer;
a second outer seed layer surrounding outer sidewalls of another one of the first, second, and third light emitting parts; and
a second passivation layer disposed between the another one of the first, second, and third light emitting parts and the second outer seed layer.

20. The light emitting device according to claim 1, wherein at least one surface of the first-type semiconductor layer of the light emitting parts has a plurality of protrusions.

21. The light emitting device according to claim 1, wherein:
the first-type semiconductor layer of each of the first, second, and third light emitting parts comprises an n-type semiconductor; and
the second-type semiconductor layer of each of the first, second, and third light emitting parts comprises a p-type semiconductor.

22. The light emitting device according to claim 1, wherein:
the first-type semiconductor layer of each of the first, second, and third light emitting parts comprises a p-type semiconductor; and
the second-type semiconductor layer of each of the first, second, and third light emitting parts comprises an n-type semiconductor.

* * * * *